(12) United States Patent
Yamaguchi

(10) Patent No.: US 10,101,656 B2
(45) Date of Patent: Oct. 16, 2018

(54) ACTIVE LIGHT SENSITIVE OR RADIATION SENSITIVE RESIN COMPOSITION, ACTIVE LIGHT SENSITIVE OR RADIATION SENSITIVE FILM, MASK BLANK PROVIDED WITH ACTIVE LIGHT SENSITIVE OR RADIATION SENSITIVE FILM, PATTERN FORMING METHOD, METHOD FOR MANUFACTURING ELECTRONIC DEVICE, AND ELECTRONIC DEVICE

(71) Applicant: FUJIFILM Corporation, Tokyo (JP)

(72) Inventor: Shuhei Yamaguchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/444,481

(22) Filed: Feb. 28, 2017

(65) Prior Publication Data

US 2017/0168395 A1    Jun. 15, 2017

Related U.S. Application Data

(63) Continuation of application No. PCT/JP2015/075456, filed on Sep. 8, 2015.

(30) Foreign Application Priority Data

Sep. 30, 2014    (JP) .................. 2014-202539

(51) Int. Cl.
G03F 7/004    (2006.01)
G03F 7/038    (2006.01)
(Continued)

(52) U.S. Cl.
CPC ............ *G03F 7/038* (2013.01); *C08F 220/26* (2013.01); *C08F 220/30* (2013.01); *G03F 1/50* (2013.01);
(Continued)

(58) Field of Classification Search
CPC ... G03F 1/00; G03F 1/50; G03F 7/004; G03F 7/0045; G03F 7/038; G03F 7/38;
(Continued)

(56) References Cited

U.S. PATENT DOCUMENTS 6,887,645 B2    5/2005  Uenishi
2013/0052587 A1    2/2013  Hatakeyama et al.
(Continued)

FOREIGN PATENT DOCUMENTS

JP    04-165359 A    6/1992
JP    2001-249455 A    9/2001
(Continued)

OTHER PUBLICATIONS

Communication dated Jul. 11, 2017, from the Japanese Patent Office in counterpart Japanese application No. 2016-551683.
(Continued)

*Primary Examiner* — Amanda C. Walke
(74) *Attorney, Agent, or Firm* — Sughrue Mion, PLLC

(57) ABSTRACT

An actinic ray-sensitive or radiation-sensitive resin composition includes an alkali-soluble resin (A) and a compound (B) exemplified below, the compound (B) has a specific structure within a molecule.

(B-1)

(B-2)

(Continued)

-continued
(B-3) 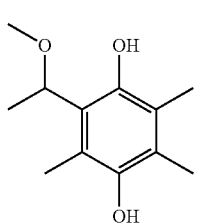
(B-4) 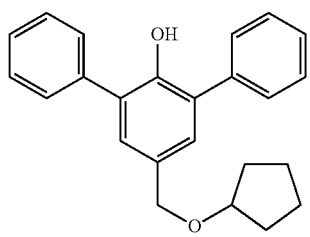
(B-5) 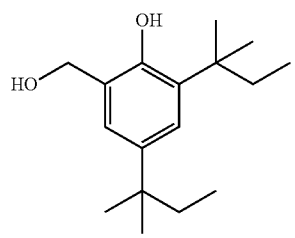
(B-6) 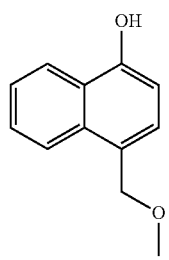
(B-7)
(B-8) 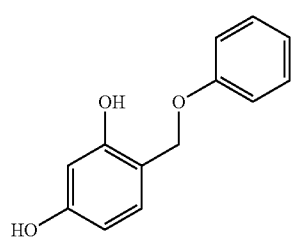
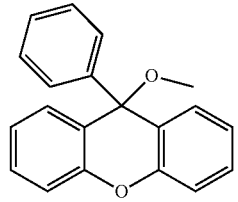
-continued
(B-9) 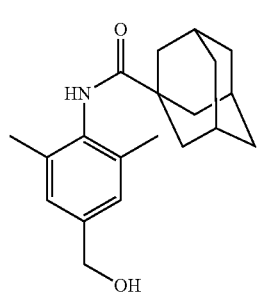
(B-10) 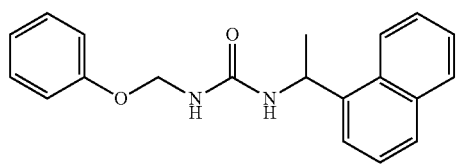
(B-11) 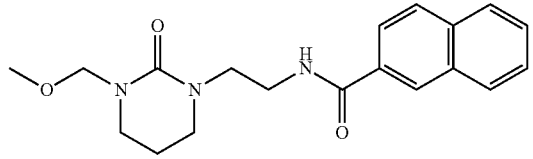
(B-12) 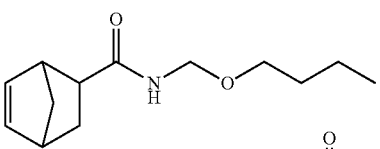
(B-13) 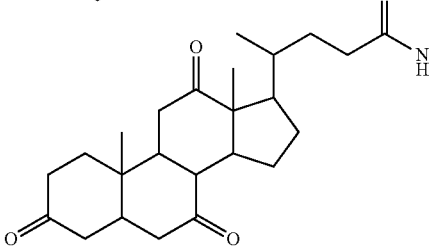
12 Claims, 1 Drawing Sheet
(51) Int. Cl.
*H01L 21/027* (2006.01)
*C08F 220/26* (2006.01)
*C08F 220/30* (2006.01)
*G03F 1/50* (2012.01)
*G03F 7/16* (2006.01)
*G03F 7/20* (2006.01)
*G03F 7/32* (2006.01)
*G03F 7/38* (2006.01)
(52) U.S. Cl.
CPC .......... *G03F 7/0045* (2013.01); *G03F 7/0046* (2013.01); *G03F 7/0382* (2013.01); *G03F 7/162* (2013.01); *G03F 7/168* (2013.01); *G03F 7/2037* (2013.01); *G03F 7/322* (2013.01); *G03F 7/38* (2013.01); *H01L 21/0274* (2013.01); *H05K 999/99* (2013.01)

(58) Field of Classification Search
CPC ...... G03F 7/40; H01L 21/0274; C08F 220/26; C08F 220/30
USPC .............. 430/270.1, 5, 322, 329, 325, 913; 526/326
See application file for complete search history.

(56) References Cited

U.S. PATENT DOCUMENTS

| | | | |
|---|---|---|---|
| 2014/0248556 | A1 | 9/2014 | Kato et al. |
| 2015/0086911 | A1 | 3/2015 | Tsuruta et al. |
| 2015/0118623 | A1 | 4/2015 | Tsuruta |
| 2015/0309408 | A1* | 10/2015 | Tsuchimura .......... G03F 7/0045 430/5 |

FOREIGN PATENT DOCUMENTS

| | | |
|---|---|---|
| JP | 2001-249456 A | 9/2001 |
| JP | 2002-148806 A | 5/2002 |
| JP | 2013-064988 A | 4/2013 |
| JP | 2013-137524 A | 7/2013 |
| JP | 2014-016478 A | 1/2014 |
| JP | 2014-024999 A | 2/2014 |
| JP | 2014-134686 A | 7/2014 |

OTHER PUBLICATIONS

International Preliminary Report on Patentability and Written Opinion, dated Apr. 4, 2017, in corresponding International Application No. PCT/JP2015/075456, 11 pages in English and Japanese.
International Search Report for PCT/JP2015/075456 dated Nov. 2, 2015 [PCT/ISA/210].
Written Opinion for PCT/JP2015/075456 dated Nov. 2, 2015 [PCT/ISA/237].
Communication dated Jan. 29, 2018, issued by the Korean Intellectual Property Office in corresponding Korean Application No. 10-2017-7006162.
Communication dated Feb. 27 2018, from the Japanese Patent Office in counterpart application No. 2016-551683.
Office Action dated Jul. 23,2018, issued by the Korean Intellectual Property Office in corresponding Korean Application No. 10-2017-7006162.

* cited by examiner

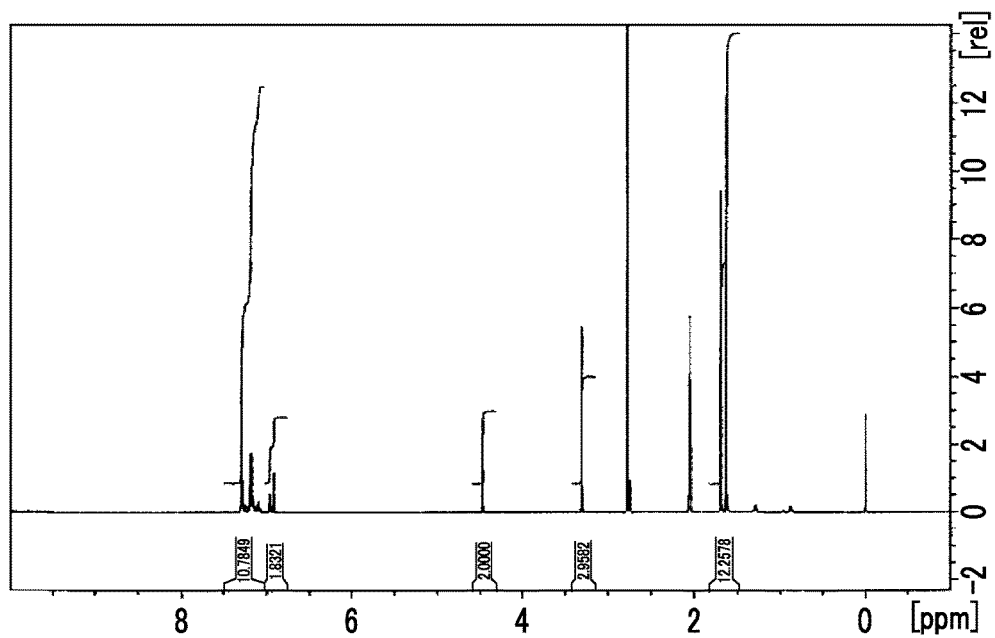

ACTIVE LIGHT SENSITIVE OR RADIATION SENSITIVE RESIN COMPOSITION, ACTIVE LIGHT SENSITIVE OR RADIATION SENSITIVE FILM, MASK BLANK PROVIDED WITH ACTIVE LIGHT SENSITIVE OR RADIATION SENSITIVE FILM, PATTERN FORMING METHOD, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2015/075456 filed on Sep. 8, 2015, which claims priority under 35 U.S.C. § 119(a) to Japanese Patent Application No. 2014-202539 filed on Sep. 30, 2014. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition which is suitably used in an ultramicrolithographic process which is applicable to a process for manufacturing an ultra-LSI and high-capacity microchip, a process for manufacturing a mold for nanoimprints, a process for manufacturing a high-density information recording medium, and the like, and to other photofabrication processes, as well as an actinic ray-sensitive or radiation-sensitive film, a mask blank including the actinic ray-sensitive or radiation-sensitive film, a pattern forming method, a method for manufacturing an electronic device, and an electronic device. More specifically, the present invention relates to an actinic ray-sensitive or radiation-sensitive resin composition which can be suitably used for microfabrication of a semiconductor device using electron beams, X-rays, or EUV light, as well as an actinic ray-sensitive or radiation-sensitive film, a mask blank including the actinic ray-sensitive or radiation-sensitive film, a pattern forming method, a method for manufacturing an electronic device, and an electronic device.

2. Description of the Related Art

In microfabrication using a resist composition, formation of an ultrafine pattern has been required due to an increased integration degree of an integrated circuit. Accordingly, there is a tendency that the exposure wavelength becomes shorter, such as from a g line to an i line, or further to KrF laser light or ArF laser light. More recently, lithography using electron beams, X-rays, or EUV light instead of excimer laser light has been under development.

However, from the viewpoint of overall performance of a resist composition, it remains very difficult to find a suitable combination of a resin, a photoacid generator, a basic compound, an additive, a solvent, and the like to be used. In particular, upon considering a recent demand for formation of an ultrafine pattern (for example, one having a line width of 50 nm or less) with high performance, it cannot be said that currently available lithography is sufficient in terms of its performance.

In formation of a negative tone resist pattern, typically, even in a case of providing an unexposed area intended to be removed by a developer and an exposed area not intended to be removed by a developer on a resist film when performing exposure, a region within the unexposed area being adjacent to the exposed area is subjected to exposure even in a low exposure dose (hereinafter, this region is referred to as a weakly exposed area). Therefore, even a weakly exposed area becomes insoluble or poorly-soluble in a developer, which leads to generation of bridges between patterns formed by the development.

In the field of electron beams (EB) lithography, it has been found that the influence of electron scattering, that is, forward scattering in a resist film is reduced by increasing the acceleration voltage of an EB. Accordingly, there has been recently a tendency to increase the acceleration voltage of an EB. However, if the acceleration voltage of an EB is increased, the influence of forward scattering is reduced, whereas the influence of scattering of electrons reflected in a resist substrate, that is, backward scattering is increased. In addition, in a case of forming an isolated space pattern having a large exposure area, the influence of backward scattering is particularly significant. Thus, for example, an increase in the acceleration voltage of an EB may possibly result in generation of bridges between isolated space patterns.

Particularly, in a case of patterning on a photomask blank for use in semiconductor exposure, since a light-shielding film containing heavy atoms such as chromium, molybdenum, and tantalum is present as a layer below a resist film, the influence of backward scattering due to reflection from a layer below a resist film is more significant, as compared with a case of applying a resist onto a silicon wafer. As a result, in a case of forming an isolated space pattern on a photomask blank, the pattern is particularly susceptible to the influence of backward scattering, and the resolution thereof is highly likely to decrease. On the other hand, in extreme ultraviolet (EUV) lithography, there is a possibility of generating bridges between patterns due to the flare light generated by the surface topology and a phase difference of a reflection mirror constituting an optical system of an exposure apparatus, and the unintended light of different wavelengths (Out of Band light: OoB light) from that of EUV light, which is generated due to the reflection mirror also exhibiting a certain degree of reflection characteristics with respect to wavelengths different from an exposure wavelength of EUV light (typically 13.5 nm).

Moreover, microfabrication using a resist composition is not only used directly in the manufacture of integrated circuits but has also been recently applied to the fabrication of a so-called imprint mold structure, or the like (see, for example, JP2002-148806A). Thus, in particular, even in a case of forming an ultrafine pattern (for example, one having a line width of 50 nm or less) using X-rays, soft X-rays, or electron beams as an exposure light source, it has become an important task to simultaneously provide a performance capable of inhibiting generation of bridges, in addition to resist performance such as having a high resolution and good roughness characteristics, and there is a demand for solving these requirements.

As the resist composition, various polarity conversion negative type resist compositions have been proposed. As an example of a negative type resist composition that reduces alkali solubility of a resist film of an exposed area by polarity conversion, a composition for forming a pattern by a dehydration reaction of an alicyclic alcohol, followed by a reaction thereof with an alkali-soluble group (JP2001-249455A and JP2001-249456A); a composition for forming a negative tone pattern by polarity conversion through a dehydration reaction of a tertiary alcohol (JP1992-165359A (JP-H04-165359A)); and the like have been proposed.

SUMMARY OF THE INVENTION

However, the polarity conversion type resist compositions shown in JP2001-249455A, JP2001-249456A, and JP1992-165359A (JP-H04-165359A) have a problem in roughness performance such as line edge roughness (LER), in views of low reactivity and no acquisition of sufficient contrast between an exposed area and an unexposed area. Further, there was a problem in that the dehydration reaction of a tertiary alcohol proceeds at a relatively low temperature by the action of an acid generated by exposure, and thus the pattern dimension varies over time ranging from exposure to post heating (PEB), that is, a problem in stability of post exposure delay (PED).

It is an object of the present invention to provide an actinic ray-sensitive or radiation-sensitive resin composition capable of forming a pattern which has excellent sensitivity, resolution, PED stability, and LER performance, and has suppressed generation of bridges even in formation of an ultrafine pattern (for example, one having a line width of 50 nm or less) as well as an actinic ray-sensitive or radiation-sensitive film, a mask blank having the actinic ray-sensitive or radiation-sensitive film, a pattern forming method, a method for manufacturing an electronic device, including the pattern forming method, and an electronic device, each using the composition.

The present invention is configured as follows, whereby the objects of the present invention will be accomplished.

[1] An actinic ray-sensitive or radiation-sensitive resin composition, comprising an alkali-soluble resin (A) and a compound (B) having a structure represented by the following General Formula (1) or (2) within a molecule thereof:

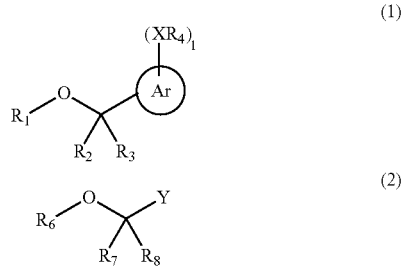

in General Formula (1),

Ar represents an aromatic ring group, $R_2$ and $R_3$ each independently represent a hydrogen atom, an alkyl group, a cycloalkyl group, an aryl group, or an aralkyl group, and may be bonded to each other to form a ring, and further, $R_2$ and $R_3$ may be each bonded to Ar to form a ring, in a case where $R_2$ and $R_3$ both represent a hydrogen atom, $R_1$ represents a hydrogen atom, an alkyl group, a cycloalkyl group, an aryl group, an aralkyl group, or an acyl group, in a case where at least one of $R_2$ or $R_3$ represents a group other than a hydrogen atom, $R_1$ represents an alkyl group, a cycloalkyl group, an aryl group, an aralkyl group, or an acyl group, $R_4$ represents a hydrogen atom, an alkyl group, an aryl group, an aralkyl group, or an acyl group, X represents an oxygen atom or $NR_5$, and $R_5$ represents a hydrogen atom, an alkyl group, an aryl group, an aralkyl group, or an acyl group, and l represents an integer of 0 to 4; and in General Formula (2), Y represents an oxygen atom or a nitrogen atom, $R_6$ represents a hydrogen atom, an alkyl group, a cycloalkyl group, an aryl group, an aralkyl group, or an acyl group, and $R_7$ and $R_8$ each independently represent a hydrogen atom, an alkyl group, an aryl group, or an aralkyl group, and may be bonded to each other to form a ring, and further, $R_7$ and $R_8$ may be each bonded to Y to form a ring, in General Formula (1), the number of group represented by $R_1OC(R_2)(R_3)$— bonded to Ar is one, and in General Formula (2), the number of group represented by $R_6OC(R_7)(R_8)$— bonded to Y is one.

[2] The actinic ray-sensitive or radiation-sensitive resin composition as described in [1], in which the compound (B) is a compound represented by the following General Formula (1-1) or (2-1):

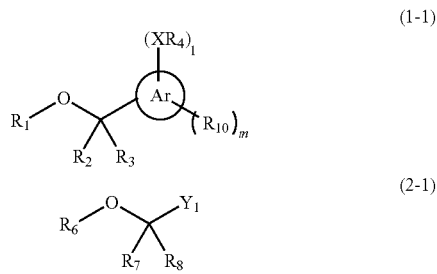

in General Formula (1-1),

Ar represents an aromatic ring group, $R_2$ and $R_3$ each independently represent a hydrogen atom, an alkyl group, a cycloalkyl group, an aryl group, or an aralkyl group, and may be bonded to each other to form a ring, and further, $R_2$ and $R_3$ may be each bonded to Ar to form a ring, in a case where $R_2$ and $R_3$ both represent a hydrogen atom, $R_1$ represents a hydrogen atom, an alkyl group, a cycloalkyl group, an aryl group, an aralkyl group, or an acyl group, in a case where at least one of $R_2$ or $R_3$ represents a group other than a hydrogen atom, $R_1$ represents an alkyl group, a cycloalkyl group, an aryl group, an aralkyl group, or an acyl group, $R_4$ represents a hydrogen atom, an alkyl group, an aryl group, an aralkyl group, or an acyl group, X represents an oxygen atom or $NR_5$, and $R_5$ represents a hydrogen atom, an alkyl group, an aryl group, an aralkyl group, or an acyl group, l represents an integer of 0 to 4, and $R_{10}$ represents a substituent, and m represents an integer of 0 to 4; and in General Formula (2-1), $Y_1$ represents $OR_{11}$ or $NR_{12}R_{13}$, and $R_{11}$, $R_{12}$, and $R_{13}$ each independently represent a hydrogen atom, an alkyl group, an aryl group, an aralkyl group, an acyl group, an acyloxy group, or an amido group, $R_6$ represents a hydrogen atom, an alkyl group, a cycloalkyl group, an aryl group, an aralkyl group, or an acyl group, and $R_7$ and $R_8$ each independently represent a hydrogen atom, an alkyl group, an aryl group, or an aralkyl group, and may be bonded to each other to form a ring, and further, $R_7$ and $R_8$ may be each bonded to $Y_1$ to form a ring.

[3] The actinic ray-sensitive or radiation-sensitive resin composition as described in [1] or [2], further comprising a compound (C) that generates an acid upon irradiation with actinic ray or radiation.

[4] The actinic ray-sensitive or radiation-sensitive resin composition as described in [3], in which the compound (C) that generates an acid upon irradiation with actinic ray or radiation is a sulfonium salt.

[5] The actinic ray-sensitive or radiation-sensitive resin composition as described in any one of [1] to [4], in which the alkali-soluble resin (A) includes a repeating unit represented by the following General Formula (II):

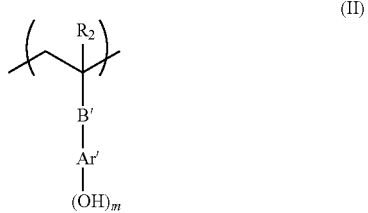

in the formula, $R_2$ represents a hydrogen atom, a methyl group which may have a substituent, or a halogen atom, B' represents a single bond or a divalent organic group, Ar' represents an aromatic ring group, and m represents an integer of 1 or more.

[6] The actinic ray-sensitive or radiation-sensitive resin composition as described in any one of [1] to [5], in which the molecular weight of the compound (B) is 250 or more.

[7] The actinic ray-sensitive or radiation-sensitive resin composition as described in any one of [1] to [6], further comprising a basic compound or ammonium salt compound whose basicity decreases upon irradiation with actinic ray or radiation.

[8] An actinic ray-sensitive or radiation-sensitive film formed of the actinic ray-sensitive or radiation-sensitive resin composition as described in any one of [1] to [7].

[9] A mask blank comprising the actinic ray-sensitive or radiation-sensitive film as described in [8].

[10] A pattern forming method comprising:

coating the actinic ray-sensitive or radiation-sensitive resin composition as described in any one of [1] to [7] on a substrate to form a film;

exposing the film; and developing the exposed film to form a negative tone pattern.

[11] A method for manufacturing an electronic device, comprising the pattern forming method as described in [10].

[12] An electronic device manufactured by the method for manufacturing an electronic device as described in [11].

According to the present invention, it is possible to provide an actinic ray-sensitive or radiation-sensitive resin composition capable of forming a pattern which has excellent sensitivity, resolution, PED stability, and LER performance, and has suppressed generation of bridges, in particular, in formation of an ultrafine pattern (for example, having a line width of 50 nm or less), as well as an actinic ray-sensitive or radiation-sensitive film, a mask blank having the actinic ray-sensitive or radiation-sensitive film, a pattern forming method, a method for manufacturing an electronic device, including the pattern forming method, and an electronic device, each using the composition.

BRIEF DESCRIPTION OF THE DRAWINGS

FIG. 1 is a view showing a $^1$H-NMR chart of a compound (B-1).

DESCRIPTION OF THE PREFERRED EMBODIMENTS

In citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group).

Moreover, "actinic ray" or "radiation" as used herein means, for example, a bright line spectrum of a mercury lamp, far ultraviolet rays represented by an excimer laser, extreme ultraviolet rays (EUV light), X-rays, electron beams (EB), or the like. In addition, in the present invention, light means actinic ray or radiation.

In addition, unless otherwise specified, "exposure" as used herein includes not only exposure by a mercury lamp, far ultraviolet rays represented by an excimer laser, extreme ultraviolet rays, X-rays, EUV light, or the like, but also writing by particle rays such as electron beams and ion beams.

In the present specification, the weight-average molecular weight of a polymer compound is a value in terms of polystyrene, measured by a GPC method. GPC can be carried out in accordance with a method using TSK gel Multipore HXL-M (manufactured by Tosoh Corporation, 7.8 mmID×30.0 cm) as a column and tetrahydrofuran (THF) as an eluant, using HLC-8120 (manufactured by Tosoh Corporation).

The radiation-sensitive or actinic ray-sensitive resin composition of the present invention is typically a resist composition, and preferably a negative type resist composition. Further, the radiation-sensitive or actinic ray-sensitive resin composition of the present invention is typically a chemical amplification type resist composition. The radiation-sensitive or actinic ray-sensitive resin composition of the present invention is preferably a chemical amplification type and negative type resist composition.

The radiation-sensitive or actinic ray-sensitive resin composition of the present invention is preferably for exposure with electron beams or extreme ultraviolet rays.

Hereinafter, embodiments of the present invention will be described in detail.

The actinic ray-sensitive or radiation-sensitive resin composition of the present invention (also referred to as "the composition of the present invention") is an actinic ray-sensitive or radiation-sensitive resin composition including an alkali-soluble resin (A) and a compound (B) having a structure represented by the following General Formula (1) or (2) within a molecule thereof.

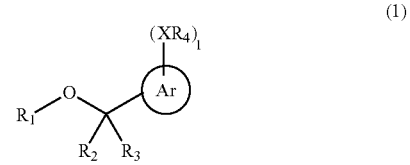

In General Formula (1),

Ar represents an aromatic ring group.

$R_2$ and $R_3$ each independently represent a hydrogen atom, an alkyl group, a cycloalkyl group, an aryl group, or an aralkyl group, and may be bonded to each other to form a ring, and further, $R_2$ and $R_3$ may be each bonded to Ar to form a ring.

In a case where $R_2$ and $R_3$ both represent a hydrogen atom, $R_1$ represents a hydrogen atom, an alkyl group, a cycloalkyl group, an aryl group, an aralkyl group, or an acyl group.

In a case where at least one of $R_2$ or $R_3$ represents a group other than a hydrogen atom, $R_1$ represents an alkyl group, a cycloalkyl group, an aryl group, an aralkyl group, or an acyl group.

$R_4$ represents a hydrogen atom, an alkyl group, an aryl group, an aralkyl group, or an acyl group.

X represents an oxygen atom or $NR_5$, and $R_5$ represents a hydrogen atom, an alkyl group, an aryl group, an aralkyl group, or an acyl group.

l represents an integer of 0 to 4.

In General Formula (2),

Y represents an oxygen atom or a nitrogen atom.

$R_6$ represents a hydrogen atom, an alkyl group, a cycloalkyl group, an aryl group, an aralkyl group, or an acyl group.

$R_7$ and $R_8$ each independently represent a hydrogen atom, an alkyl group, an aryl group, or an aralkyl group, and may be bonded to each other to form a ring, and further, $R_7$ and $R_8$ may be each bonded to Y to form a ring.

However, in General Formula (1), the number of group represented by $R_1OC(R_2)(R_3)$— bonded to Ar is one, and in General Formula (2), the number of group represented by $R_6OC(R_7)(R_8)$— bonded to Y is one.

<Alkali-Soluble Resin (A)>

The actinic ray-sensitive or radiation-sensitive resin composition in the present invention includes an alkali-soluble resin (A) (also referred to as a "resin (A)").

The resin (A) is not particularly limited as long as it is alkali-soluble, but is preferably a resin containing a phenolic hydroxyl group.

The phenolic hydroxyl group in the present invention refers to a group formed by substituting a hydrogen atom of an aromatic ring group with a hydroxy group. The aromatic ring of an aromatic ring group is a monocyclic or polycyclic aromatic ring, and examples thereof include a benzene ring and a naphthalene ring.

In a case where the resin (A) contains a phenolic hydroxyl group, it is preferably a resin having a repeating unit represented by the following General Formula (II).

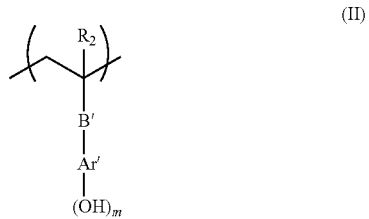

(II)

In the formula, $R_2$ represents a hydrogen atom, a methyl group which may have a substituent, or a halogen atom, B' represents a single bond or a divalent organic group.

Ar' represents an aromatic ring group.

m represents an integer of 1 or more.

The methyl group in $R_2$ may have a substituent, and examples of the methyl group having a substituent include a trifluoromethyl group and a hydroxymethyl group.

$R_2$ is preferably a hydrogen atom or methyl group, and the hydrogen atom is preferable in view of developability.

As the divalent organic group of B', a carbonyl group, an alkylene group (preferably having 1 to 10 carbon atoms, and more preferably 1 to 5 carbon atoms), a sulfonyl group (—S(=O)$_2$—), —O—, —NH—, or a divalent organic group formed by combination of these groups is preferable.

B' preferably represents a single bond, a carbonyloxy group (—C(=O)—O—), or —C(=O)—NH—, and more preferably represents a single bond or a carbonyloxy group (—C(=O)—O—), and the single bond is particularly preferable from the viewpoint of improvement of dry etching resistance.

The aromatic ring in the aromatic ring group of Ar' is a monocyclic or polycyclic aromatic ring, and examples thereof include hetero rings including an aromatic hydrocarbon ring having 6 to 18 carbon atoms, which may have a substituent, such as a benzene ring, a naphthalene ring, an anthracene ring, a fluorene ring, and a phenanthrene ring, and an aromatic hetero ring such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, and a thiazole ring. Among those, a benzene ring and a naphthalene ring are preferable from the viewpoint of resolution, and a benzene ring is the most preferable from the viewpoint of sensitivity.

m is preferably an integer of 1 to 5, and most preferably 1. When m is 1 and Ar' is a benzene ring, in a case where the substitution position of —OH is a para position, a meta position, or an ortho position, in terms of the binding position to B' of a benzene ring (in a case where B' is a single bond, a polymer main chain), but from the viewpoint of crosslinking reactivity, the para position and the meta position are preferable, and the para position is more preferable.

The aromatic ring group of Ar' may have a substituent other than the group represented by —OH, and examples of the substituent include an alkyl group, a cycloalkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

The repeating unit having a phenolic hydroxyl group is more preferably a repeating unit represented by the following General Formula (2A) in views of crosslinking reactivity, developability, and dry etching resistance.

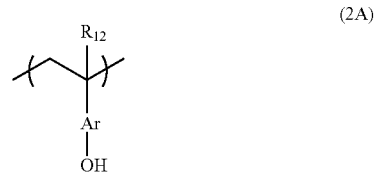

(2A)

In General Formula (2A), $R_{12}$ represents a hydrogen atom or a methyl group.

Ar represents an aromatic ring group.

$R_{12}$ represents a hydrogen atom or a methyl group, and is preferably a hydrogen atom in view of developability.

Ar in General Formula (2A) has the same definition as Ar' in General Formula (II), and a preferred range thereof is also the same. The repeating unit represented by General Formula (2A) is preferably a repeating unit derived from hydroxystyrene (that is, a repeating unit in which $R_{12}$ is a hydrogen atom, and Ar is a phenylene group in General Formula (2A)) from the viewpoint of sensitivity.

The resin (A) may be constituted only with the repeating unit having a phenolic hydroxyl group as described above. The resin (A) may also have the repeating unit as described later, in addition to the repeating unit having a phenolic hydroxyl group as described above. In this case, the content of the repeating unit having a phenolic hydroxyl group is preferably 10% to 98% by mole, more preferably 30% to 97% by mole, and still more preferably 40% to 95% by mole, with respect to all the repeating units of the resin (A). With these contents, particularly, in a case where the resist film is a thin film (for example, a case where the thickness of the resist film is 10 to 150 nm), the dissolution speed of an exposed area of a resist film formed using the composition of the present invention in an alkali developer can be reliably reduced (that is, the dissolution speed of the resist film using the composition of the present invention can be more reliably controlled to an optimal value). As a result, the sensitivity can be more reliably improved.

Hereinafter, examples of the repeating unit having a phenolic hydroxyl group are described below, but are not limited thereto.

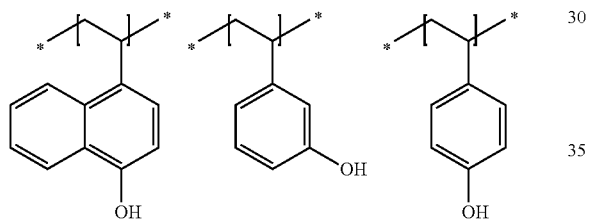

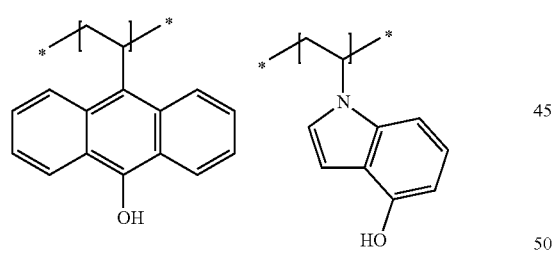

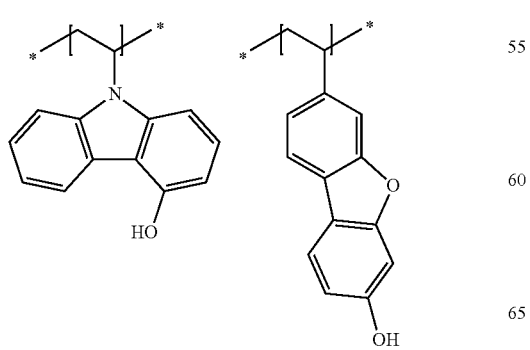

-continued

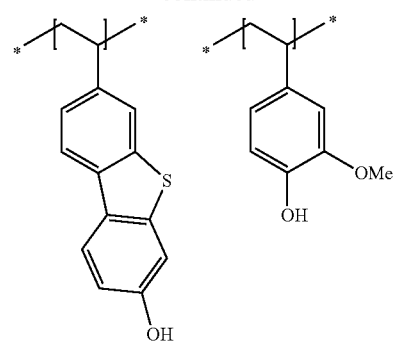

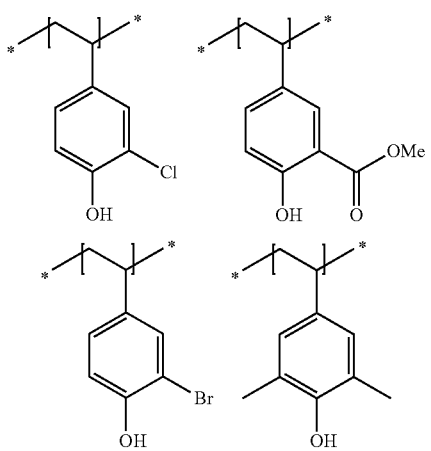

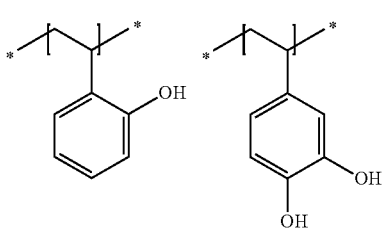

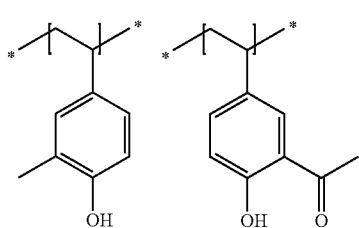

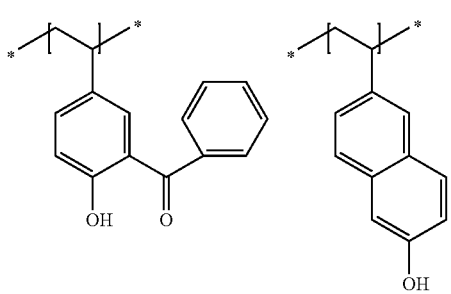

-continued
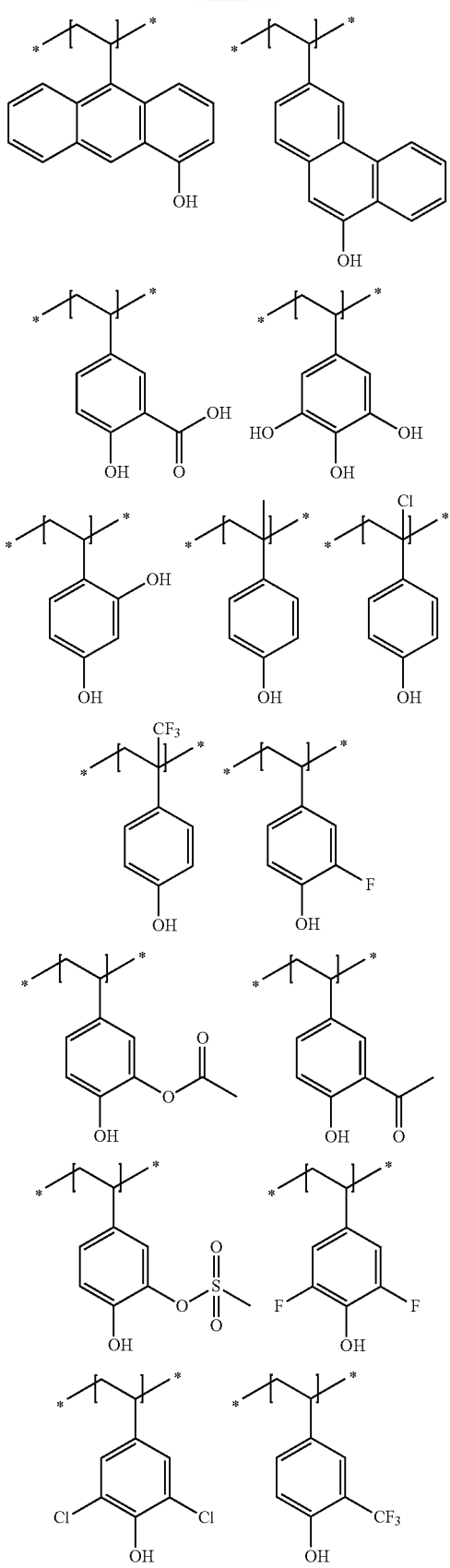
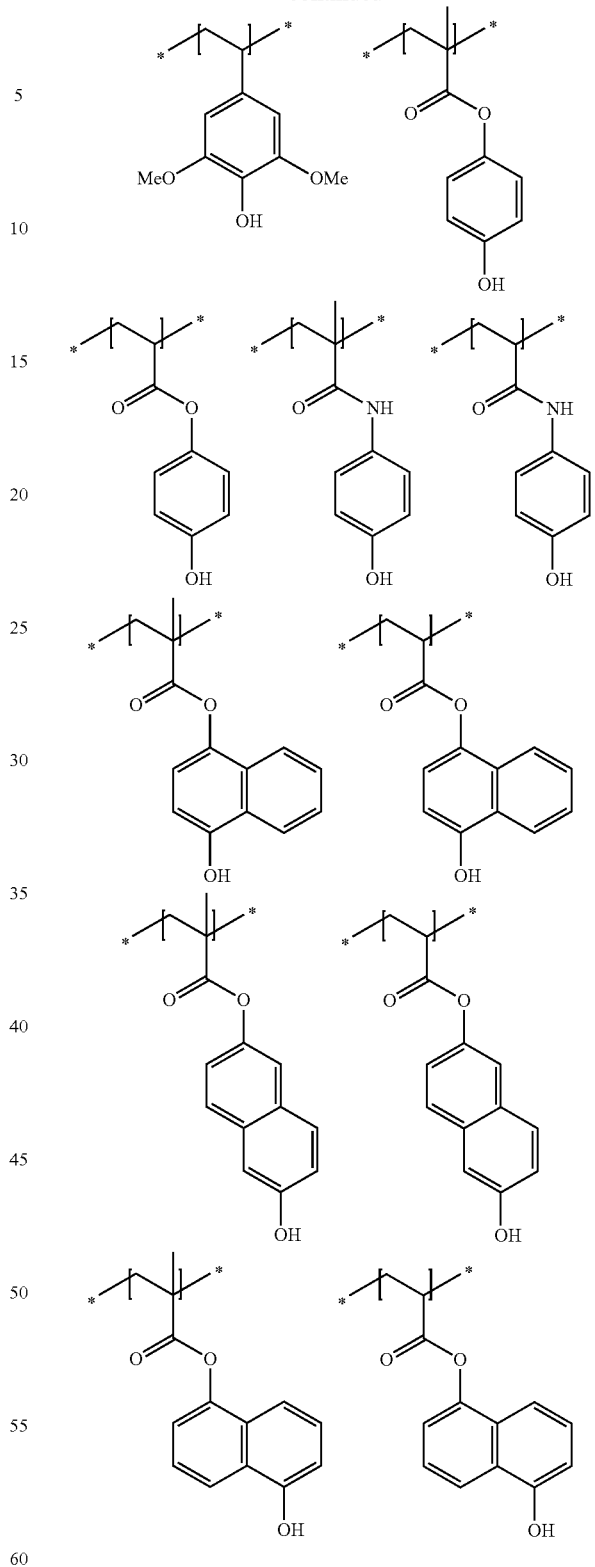
The resin (A) preferably has a structure in which a hydrogen atom of the phenolic hydroxyl group is substituted with a group having non-acid-decomposable polycyclic alicyclic hydrocarbon structure, in view that a high glass transition temperature (Tg) is obtained and dry etching resistance is improved.

When the resin (A) has the above-mentioned specific structure, the glass transition temperature (Tg) of the resin (A) becomes higher, and thus, a highly hard resist film can be formed, and diffusiveness or dry etching resistance of an acid can be controlled. Accordingly, since the diffusiveness of an acid is highly suppressed in an exposed area with actinic ray or radiation such as electron beams and extreme ultraviolet rays, the resolving power, the pattern shape, and the LER performance of fine patterns are more excellent. Further, it is thought that the resin (A) which has a non-acid-decomposable polycyclic alicyclic hydrocarbon structure contributes to further improvement of dry etching resistance. In addition, further details are not clear, but the polycyclic alicyclic hydrocarbon structure has high donating properties of a hydrogen radical and becomes a hydrogen source upon decomposition of a photoacid generator, and therefore, it is presumed that the decomposition efficiency of the photoacid generator is further improved, and the acid generating efficiency further increases, which is thought to contribute to more excellent sensitivity.

According to the present invention, in the above-mentioned specific structure which the resin (A) may have, an aromatic ring such as a benzene ring and a group having a non-acid-decomposable polycyclic alicyclic hydrocarbon structure are linked to each other through an oxygen atom derived from a phenolic hydroxyl group. As described above, the structure can not only contribute to high dry etching resistance, but also enhance the glass transition temperature (Tg) of the resin (A), and it is presumed that a combination thereof provides a higher resolving power.

In the present invention, the non-acid-decomposability means a property that a decomposition reaction does not occur by an acid generated by a photoacid generator.

More specifically, a group having a non-acid-decomposable polycyclic alicyclic hydrocarbon structure is preferably a group which is stable against an acid and an alkali. The group which is stable against an acid and an alkali means a group which does not exhibit acid decomposability and alkali decomposability. Here, acid-decomposability means a property that a photoacid generator causes a decomposition reaction by the action of the generated acid.

Furthermore, the alkali decomposability means a property of causing a decomposition reaction by the action of an alkali developer, and examples of a group exhibiting alkali decomposability include a group (for example, a group having a lactone structure) which is dissolved by the action of an alkali developer known in the related art, included in a resin suitably used in a positive tone and chemical amplification type resist composition, and thus, its dissolution speed in an alkali developer increases.

The group having an polycyclic alicyclic hydrocarbon structure is not particularly limited as long as it is a monovalent group having an polycyclic alicyclic hydrocarbon structure, but preferably has a total number of carbon atoms of 5 to 40, and more preferably has a total number of carbon atoms of 7 to 30. The polycyclic alicyclic hydrocarbon structure may have an unsaturated bond within a ring.

The polycyclic alicyclic hydrocarbon structure in the group having an polycyclic alicyclic hydrocarbon structure means a structure having a plurality of alicyclic hydrocarbon groups which are of monocyclic types, or an alicyclic hydrocarbon structure which is of a polycyclic type, and may be crosslinked. As the alicyclic hydrocarbon group which is of a monocyclic type, a cycloalkyl group having 3 to 8 carbon atoms is preferable, and examples thereof include a cyclopropyl group, a cyclopentyl group, a cyclohexyl group, a cyclobutyl group, and a cyclooctyl group.

The structure having a plurality of alicyclic hydrocarbon groups which are of monocyclic types have a plurality of the above groups. The structure having a plurality of alicyclic hydrocarbon groups which are of monocyclic types preferably has 2 to 4 alicyclic hydrocarbon groups which are of monocyclic types, and particularly preferably two alicyclic hydrocarbon groups which are of monocyclic types.

Examples of the alicyclic hydrocarbon structure which is of a polycyclic type include bicyclo, tricyclo, or tetracyclo structure having 5 or more carbon atoms, and the structure is preferably a polycyclic cyclo structure having 6 to 30 carbon atoms, and examples thereof include an adamantane structure, a decalin structure, a norbornane structure, a norbornene structure, a cedrol structure, an isobornane structure, a bornane structure, a dicyclopentane structure, an α-pinene structure, a tricyclodecane structure, a tetracyclododecane structure, and an androstane structure. In addition, some of carbon atoms in the monocyclic or polycyclic cycloalkyl group may also be substituted with heteroatoms such as an oxygen atom.

Preferred examples of the polycyclic alicyclic hydrocarbon structure include an adamantane structure, a decalin structure, a norbornane structure, a norbornene structure, a cedrol structure, a structure having a plurality of cyclohexyl groups, a structure having a plurality of cycloheptyl groups, a structure having a plurality of cyclooctyl groups, a structure having a plurality of cyclodecanyl groups, a structure having a plurality of cyclododecanyl groups, and a tricyclodecane structure, and the adamantane structure is the most preferable from the viewpoint of dry etching resistance (that is, the non-acid-decomposable group having an polycyclic alicyclic hydrocarbon structure is most preferably a group having a non-acid-decomposable adamantane structure).

The chemical formulae of these alicyclic hydrocarbon structures which are polycyclic (for the structures having a plurality of alicyclic hydrocarbon groups which are of monocyclic types, alicyclic hydrocarbon structures which are of monocyclic types, corresponding to the alicyclic hydrocarbon groups which are of monocyclic types (specifically, structures of the following Formulae (47) to (50))) are shown below.

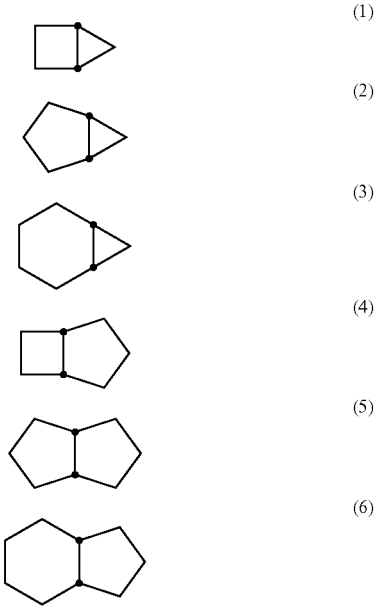

-continued
(7)
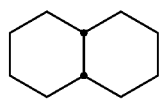
(8)
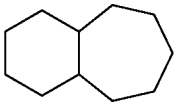
(9)
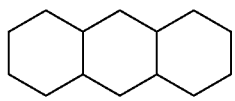
(10)
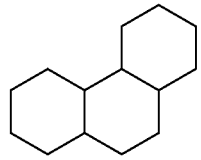
(11)
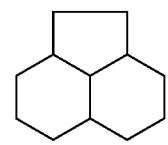
(12)
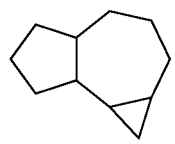
(13)
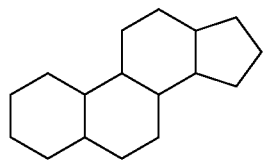
(14)
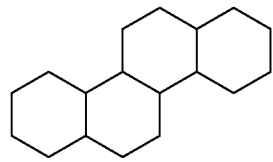
(15)
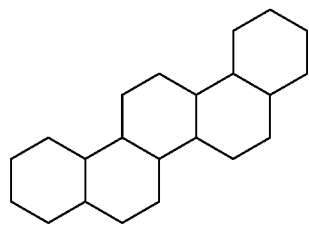
(16)
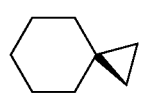
(17)
-continued
(18)
(19)
(20)
(21)
(22)
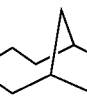
(23)
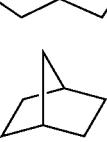
(24)
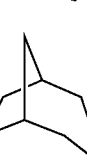
(25)
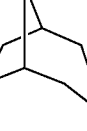
(26)
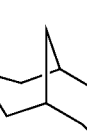
(27)
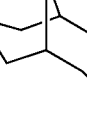
(28)
(29)
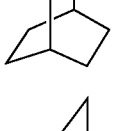
(30)

(31) 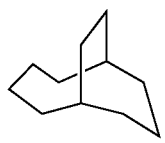

(32) 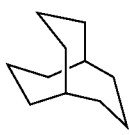

(33) 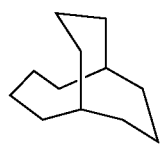

(34) 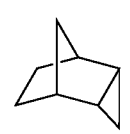

(35) 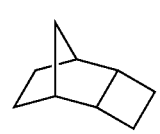

(36) 

(37) 

(38) 

(39) 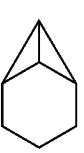

(40) 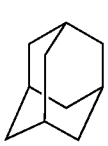

(41) 

(42) 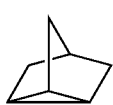

(43) 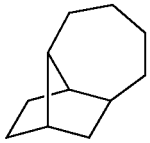

(44) 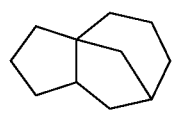

(45) 

(46) 

(47) 

(48) 

(49) 

(50) 

(51) 

The polycyclic alicyclic hydrocarbon structure may further have a substituent, and examples of the substituent include an alkyl group (preferably having 1 to 6 carbon atoms), cycloalkyl group (preferably having 3 to 10 carbon atoms), aryl group (preferably having 6 to 15 carbon atoms), halogen atom, a hydroxyl group, an alkoxy group (preferably having carbon atoms 1 to 6), a carboxyl group, a carbonyl group, a thiocarbonyl group, an alkoxycarbonyl group (preferably having 2 to 7 carbon atoms), and a group formed by combination of these groups (preferably having a total number of carbon atoms of 1 to 30, and more preferably having a total number of carbon atoms of 1 to 15).

As the polycyclic alicyclic hydrocarbon structure, the structure represented by any one of Formulae (7), (23), (40), (41), and (51), or a structure having two monovalent groups having any one hydrogen atom in the structure of Formula (48) as a bonding arm are preferable, a structure represented by any one of Formulae (23), (40), and (51), or a structure having two monovalent groups having any one hydrogen atom in the structure of Formula (48) as a bonding arm are more preferable, and the structure represented by Formula (40) is the most preferable.

As the group having an polycyclic alicyclic hydrocarbon structure, a monovalent group having any one hydrogen atom in the polycyclic alicyclic hydrocarbon structure as a bonding arm are preferable.

The structure in which a hydrogen atom of a phenolic hydroxyl group is substituted with a group having the non-acid-decomposable polycyclic alicyclic hydrocarbon structure as described above is preferably included as a repeating unit having a structure in which a hydrogen atom of a phenolic hydroxyl group is substituted with a group having the non-acid-decomposable polycyclic alicyclic hydrocarbon structure as described above in the resin (A), and a repeating unit represented by the following General Formula (3A) is more preferably included in the resin (A).

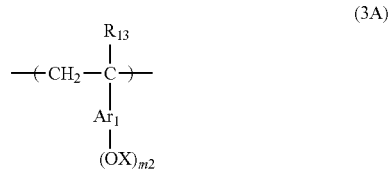

(3A)

In General Formula (3A), $R_{13}$ represents a hydrogen atom or a methyl group.

X represents a group having a non-acid-decomposable polycyclic alicyclic hydrocarbon structure.

$Ar_1$ represents an aromatic ring.

m2 represents an integer of 1 or more.

$R_{13}$ in General Formula (3A) represents a hydrogen atom or a methyl group, and is particularly preferably a hydrogen atom.

Examples of the aromatic ring of $Ar_1$ in General Formula (3A) include an aromatic hydrocarbon ring having 6 to 18 carbon atoms, which may have a substituent, such as a benzene ring, a naphthalene ring, an anthracene ring, a fluorene ring, and a phenanthrene ring, and an aromatic hetero ring containing a hetero ring such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, and a thiazole ring. Among those, a benzene ring and a naphthalene ring are preferable from the viewpoint of resolution, and a benzene ring is the most preferable.

The aromatic ring of $Ar_1$ may have a substituent other than the group represented by —OX, and examples of the substituent include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, and an alkoxycarbonyl group (preferably having 2 to 7 carbon atoms), with the alkyl group, the alkoxy group, and the alkoxycarbonyl group being preferable, and the alkoxy group being more preferable.

X represents a group having a non-acid-decomposable polycyclic alicyclic hydrocarbon structure. Specific examples of the non-acid-decomposable group having an polycyclic alicyclic hydrocarbon structure represented by X and a preferred range thereof are the same as those described above. X is more preferably a group represented by —Y—$X_2$ in General Formula (4) which will be described later.

m2 is preferably an integer of 1 to 5, and most preferably 1. When m2 is 1 and $Ar_1$ is a benzene ring, the substitution position of —OX may be a para position, a meta position, or an ortho position with respect to the binding position to the polymer main chain of the benzene ring, but is preferably a para position or a meta position, and more preferably a para position.

In the present invention, the repeating unit represented by General Formula (3A) is preferably a repeating unit represented by the following General Formula (4A).

If the resin (A) having the repeating unit represented by General Formula (4A) is used, the Tg of the resin (A) increases, and thus, a highly hard resist film is formed. As a result, the diffusiveness or the dry etching resistance of an acid can be more reliably controlled.

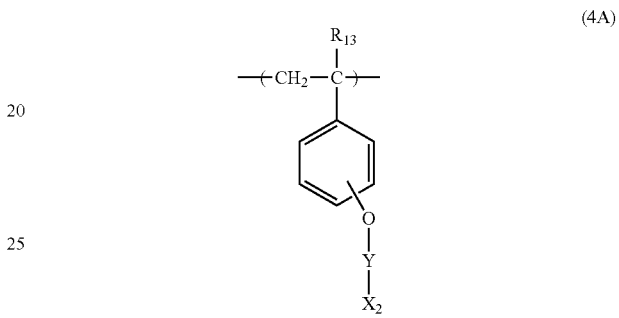

(4A)

In General Formula (4A), $R_{13}$ represents a hydrogen atom or a methyl group.

Y represents a single bond or a divalent linking group.

$X_2$ represents a non-acid-decomposable alicyclic hydrocarbon group which is polycyclic.

Preferred examples of the repeating unit represented by General Formula (4A), which is used in the present invention, are described, will be described below.

$R_{13}$ in General Formula (4A) represents a hydrogen atom or a methyl group, and is particularly preferably a hydrogen atom.

In General Formula (4A), Y is preferably a divalent linking group. The divalent linking group of Y is preferably a carbonyl group, a thiocarbonyl group, an alkylene group (preferably having 1 to 10 carbon atoms, and more preferably having 1 to 5 carbon atoms), a sulfonyl group, —COCH$_2$—, —NH—, or a divalent linking group (preferably having a total number of carbon atoms of 1 to 20, and more preferably a total number of carbon atoms of 1 to 10) formed by combination of these, more preferably a carbonyl group, —COCH$_2$—, a sulfonyl group, —CONH—, or —CSNH—, still more preferably a carbonyl group or —COCH$_2$—, and particularly preferably a carbonyl group.

$X_2$ represents an alicyclic hydrocarbon group which is polycyclic, and is non-acid-decomposable. The alicyclic hydrocarbon group which is polycyclic preferably has a total number of carbon atoms of 5 to 40, and more preferably has a total number of carbon atoms of 7 to 30. The alicyclic hydrocarbon group which is polycyclic may have an unsaturated bond within a ring.

Such an alicyclic hydrocarbon group which is polycyclic may be a group having a plurality of alicyclic hydrocarbon groups which are of monocyclic types, or an alicyclic hydrocarbon group which is of a polycyclic type, and may be crosslinked. As the alicyclic hydrocarbon group which is of a monocyclic type, a cycloalkyl group having 3 to 8 carbon atoms is preferable, and examples thereof include a cyclopropyl group, a cyclopentyl group, a cyclohexyl group, a cyclobutyl group, and a cyclooctyl group. The alicyclic hydrocarbon group which is monocyclic has a plurality of these groups. The group having a plurality of alicyclic hydrocarbon groups which are of monocyclic types preferably has 2 to 4 alicyclic hydrocarbon groups which are of monocyclic types, and particularly preferably has two alicyclic hydrocarbon groups which are of monocyclic types.

Examples of the alicyclic hydrocarbon group which is of a polycyclic type include groups having bicyclo, tricyclo, or tetracyclo structures having 5 or more carbon atoms. A group having a polycyclic cyclo structure having 6 to 30 carbon atoms is preferable, and examples thereof include an adamantyl group, a norbornyl group, a norbornenyl group, an isobornyl group, a camphanyl group, a dicyclopentyl group, an α-pinel group, a tricyclodecanyl group, a tetracyclododecyl group, and an androstanyl group. Further, some of carbon atoms in the monocyclic or polycyclic cycloalkyl group may be substituted with heteroatoms such as an oxygen atom.

As the alicyclic hydrocarbon group which is polycyclic of $X_2$, an adamantyl group, a decalin group, a norbornyl group, a norbornenyl group, a cedrol group, a group having a plurality of cyclohexyl groups, a group having a plurality of cycloheptyl groups, a group having a plurality of cyclooctyl groups, a group having a plurality of cyclodecanyl groups, a group having a plurality of cyclododecanyl groups, or a tricyclodecanyl group is preferable, and an adamantyl group is the most preferable from the viewpoint of dry etching resistance. Examples of the chemical formula of the polycyclic alicyclic hydrocarbon structure in the alicyclic hydrocarbon group which is polycyclic of $X_2$ include the same chemical formulae as those of the polycyclic alicyclic hydrocarbon structure in the above-mentioned group having an polycyclic alicyclic hydrocarbon structure, and a preferred range thereof is also the same. Examples of the alicyclic hydrocarbon group which is polycyclic of $X_2$ include monovalent groups having any one hydrogen atom in the above-mentioned polycyclic alicyclic hydrocarbon structure as a bonding arm.

The alicyclic hydrocarbon group may further have a substituent, and examples of the substituent include the same ones described as the substituent which the polycyclic alicyclic hydrocarbon structure may have.

The substitution position of —O—Y—$X_2$ in General Formula (4A) with respect to the binding position to the polymer main chain of the benzene ring may be a para position, a meta position, or an ortho position, and the para position is preferable.

In the present invention, the repeating unit represented by General Formula (3A) is most preferably a repeating unit represented by the following General Formula (4').

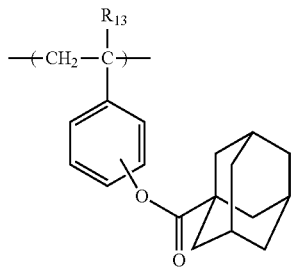

(4')

In General Formula (4'), $R_{13}$ represents a hydrogen atom or a methyl group.

$R_{13}$ in General Formula (4') represents a hydrogen atom or a methyl group, and is particularly preferably a hydrogen atom.

The substitution position of the adamantyl ester group in General Formula (4') with respect to the binding position to the polymer main chain of the benzene ring may be a para position, a meta position, or an ortho position, and is preferably a para position.

Specific examples of the repeating unit represented by General Formula (3A) include the following ones.

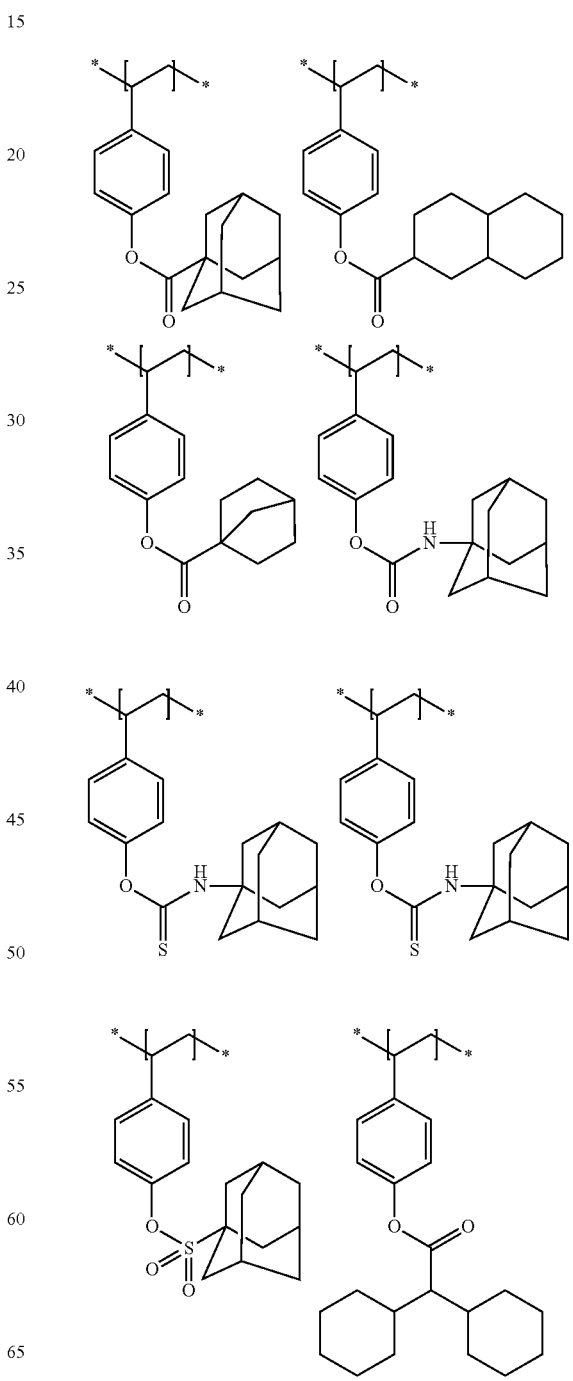

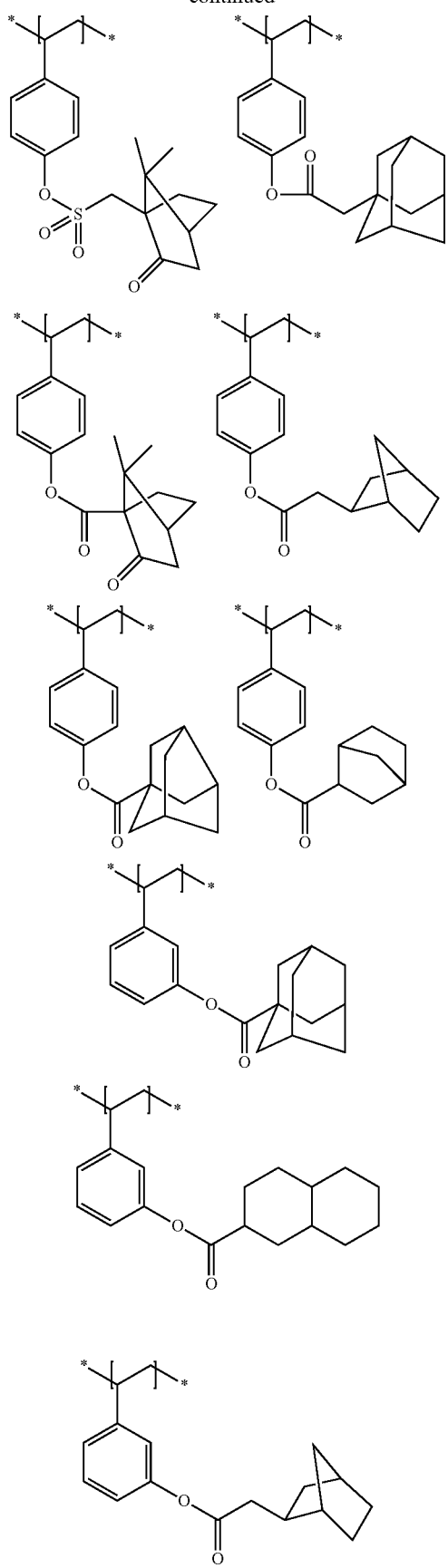
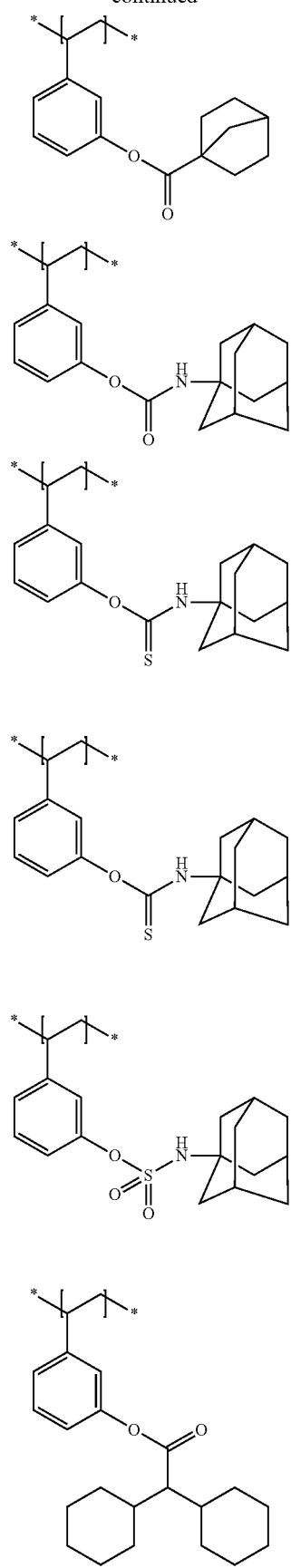

-continued

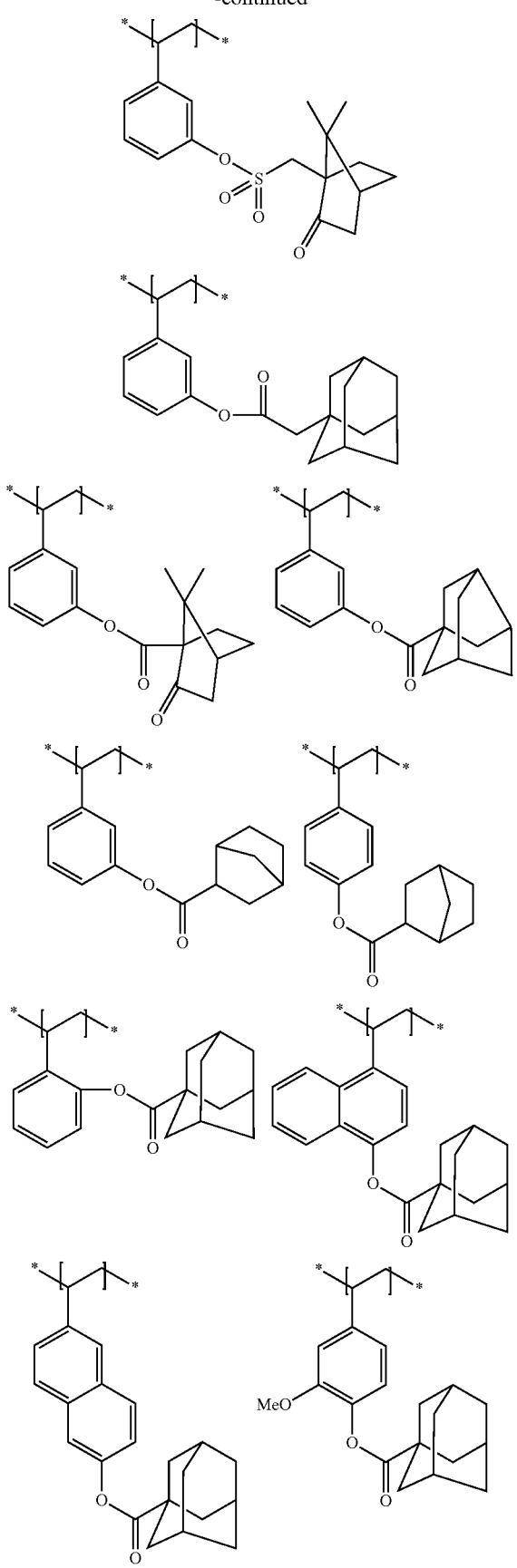

-continued

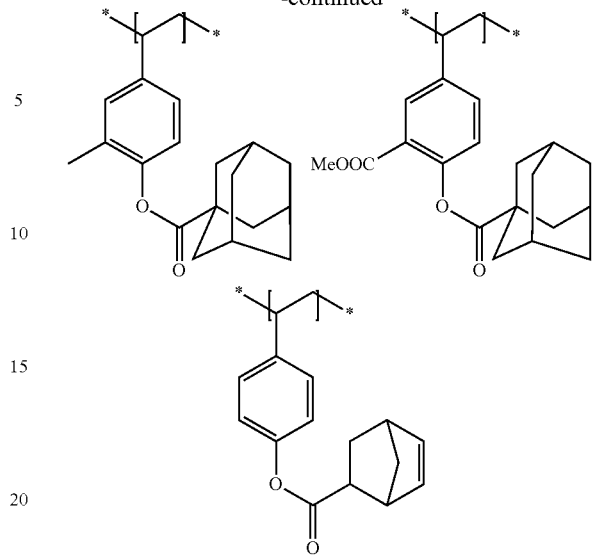

In a case where the resin (A) contains a repeating unit having a structure in which a hydrogen atom of a phenolic hydroxyl group is substituted with the group having a non-acid-decomposable polycyclic alicyclic hydrocarbon structure as described above, the content of the repeating unit is preferably 1% to 40% by mole, and more preferably 2% to 30% by mole, with respect to all the repeating units of the resin (A).

The resin (A) may further include a repeating unit having a structural moiety that decomposes upon irradiation with actinic ray or radiation to generate an acid in the side chain.

It is also preferable that the resin (A) used in the present invention further has the repeating unit as described below (hereinafter also referred to as "other repeating units") as the repeating units other than the repeating unit.

Examples of the polymerizable monomer for forming these other repeating units include styrene, alkyl-substituted styrene, alkoxy-substituted styrene, halogen-substituted styrene, O-alkylated styrene, O-acylated styrene, hydrogenated hydroxystyrene, maleic anhydride, an acrylic acid derivative (acrylic acid, acrylic acid ester, and the like), a methacrylic acid derivative (methacrylic acid, methacrylic acid ester, and the like), N-substituted maleimide, acrylonitrile, methacrylonitrile, vinylnaphthalene, vinylanthracene, and indene which may have a substituent.

The resin (A) may or may not contain these other repeating units, and in a case where the resin (A) contains these other repeating units, the content of these other repeating units in the resin (A) is generally 1% to 30% by mole, preferably 1% to 20% by mole, and more preferably 2% to 10% by mole, with respect to all the repeating units constituting the resin (A).

The resin (A) can be synthesized in accordance with a known radical polymerization method, an anion polymerization method, or a living radical polymerization method (an iniferter method or the like). For example, in the anion polymerization method, vinyl monomers can be dissolved in an appropriate organic solvent and reacted using a metal compound (butyllithium or the like) as an initiator, unusually under cooling conditions, thereby obtaining a polymer.

As the resin (A), a polyphenol compound (for example, JP2008-145539A) produced by a condensation reaction of an aromatic ketone or an aromatic aldehyde with a compound containing 1 to 3 phenolic hydroxyl groups, a calixarene derivative (for example, JP2004-18421A), a Noria derivative (for example, JP2009-222920A), or a polyphenol derivative (for example, JP2008-94782A) can be applied, and may also be synthesized through modification by a polymer reaction.

Furthermore, the resin (A) is preferably synthesized through modification of a polymer synthesized by a radical polymerization method or an anion polymerization method by use of a polymer reaction.

The weight-average molecular weight of the resin (A) is preferably 1,000 to 200,000, more preferably 2,000 to 50,000, and still more preferably 2,000 to 15,000.

The dispersity (molecular weight distribution, Mw/Mn) of the resin (A) is preferably 2.0 or less. From the viewpoint of improvement of sensitivity and resolution, the dispersity is preferably 1.0 to 1.80, more preferably 1.0 to 1.60, and most preferably 1.0 to 1.20. The use of living polymerization such as living anion polymerization preferably uniformizes the dispersity (molecular weight distribution) of the obtained polymeric compound. The weight-average molecular weight and the dispersity of the compound (D) as the polymeric compound are defined as values in terms of polystyrene by means of GPC measurement.

For the composition of the present invention, the content of the resin (A) with respect to the total solid content of the composition is preferably 30% to 95% by mass, more preferably 40% to 90% by mass, and most preferably 50% to 85% by mass.

Specific examples of the resin (A) are shown below, but the present invention is not limited thereto.

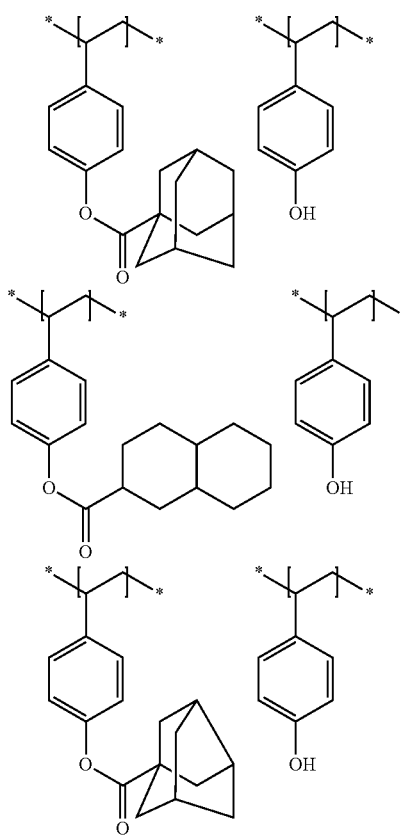

-continued

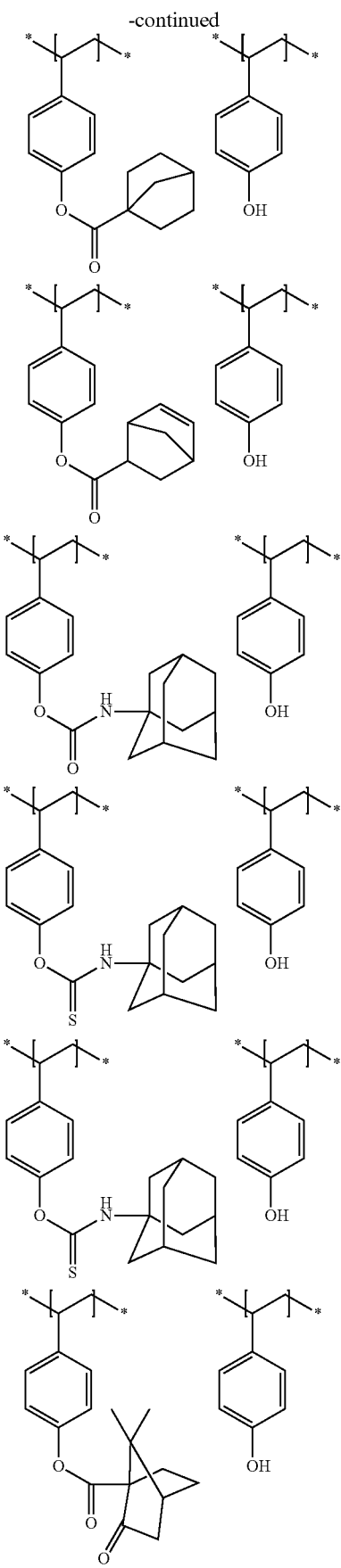

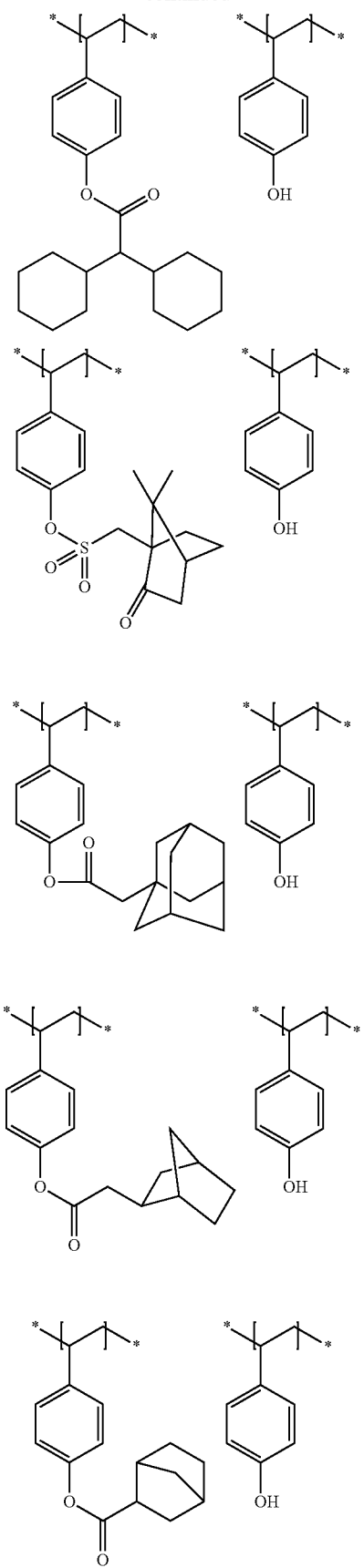
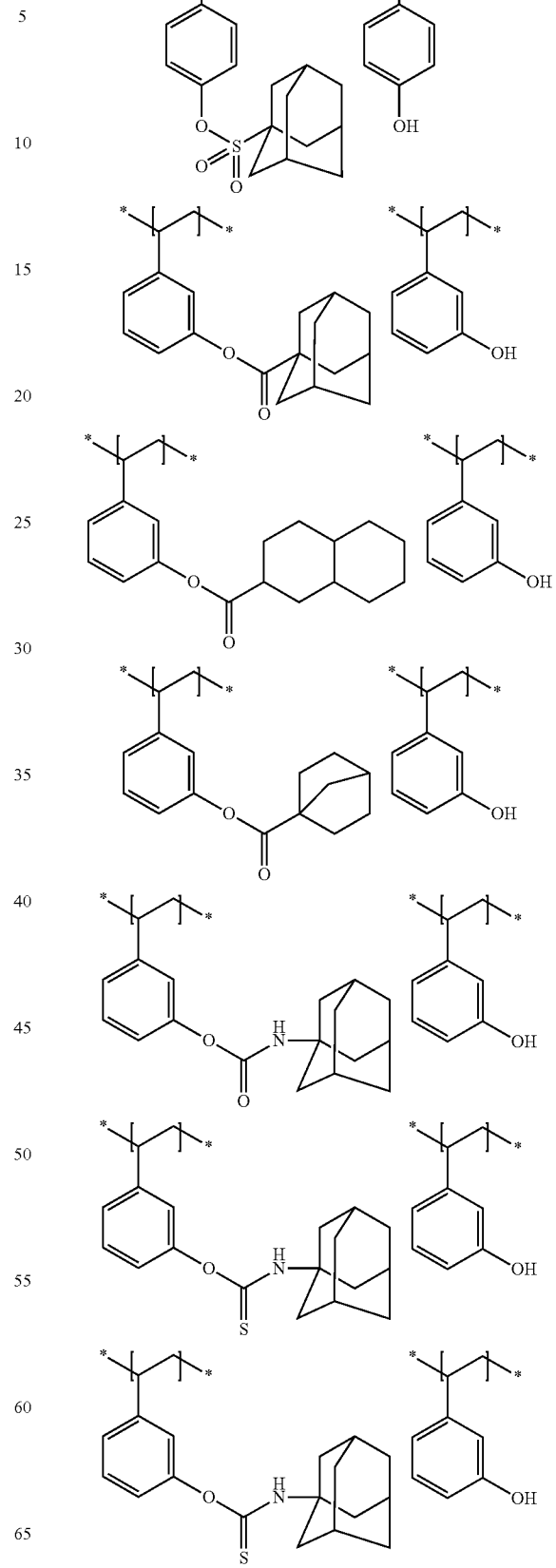

31
-continued
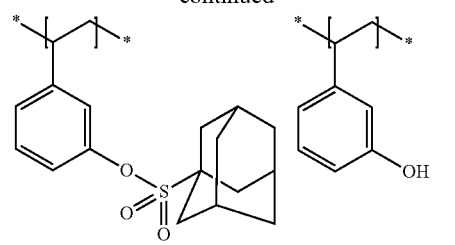
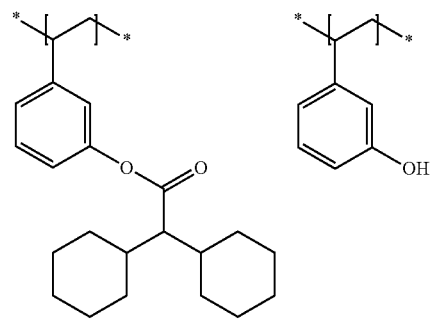
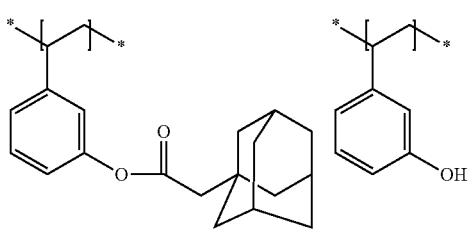
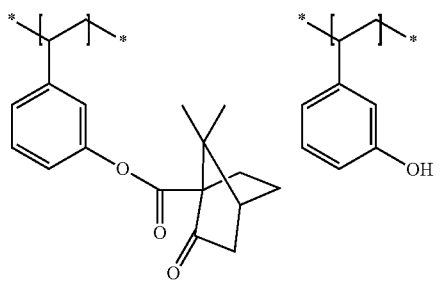
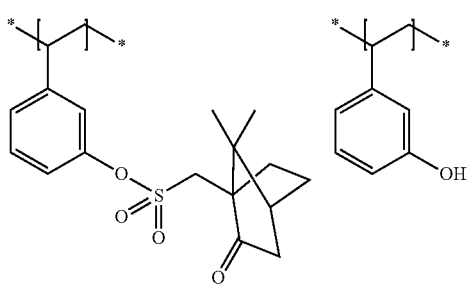
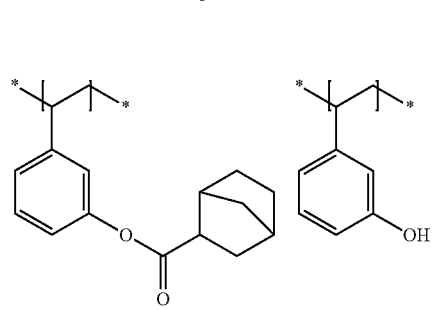
32
-continued
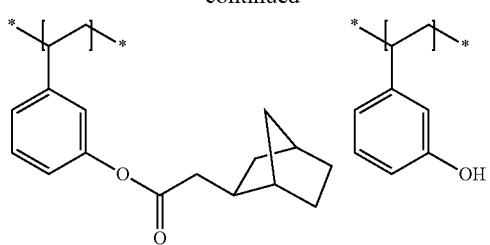
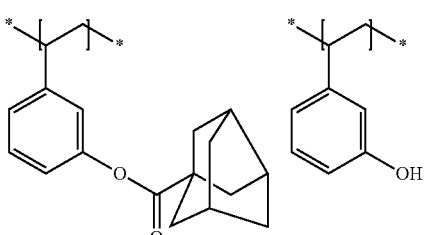
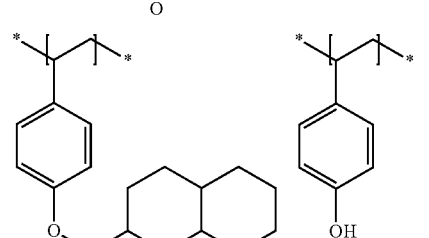
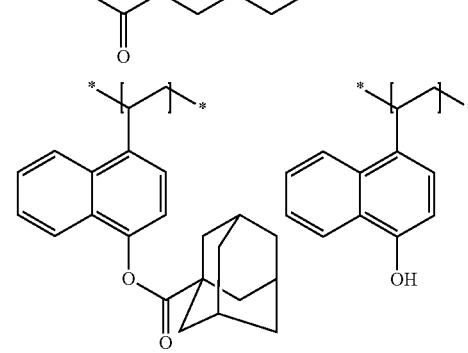
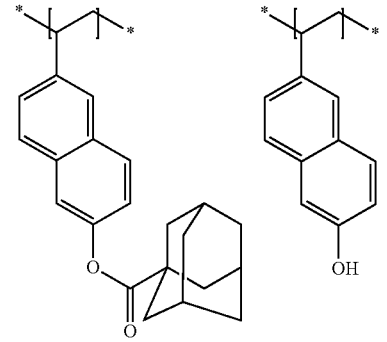
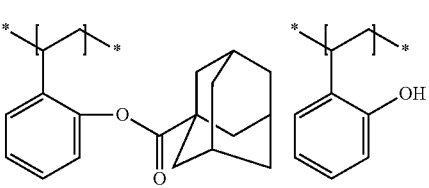

-continued
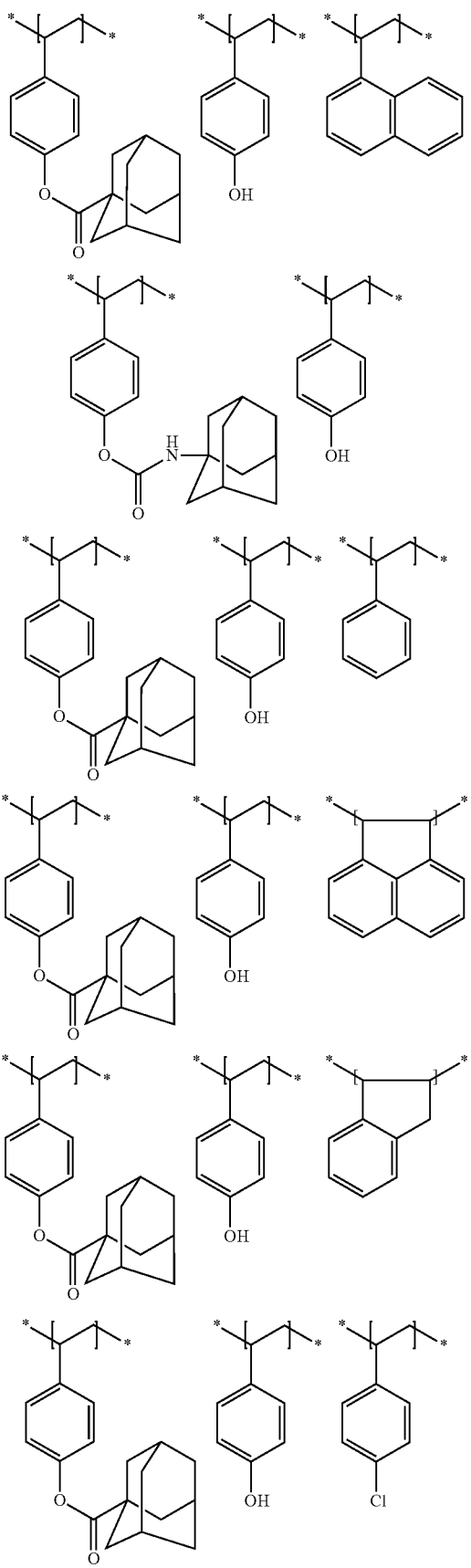
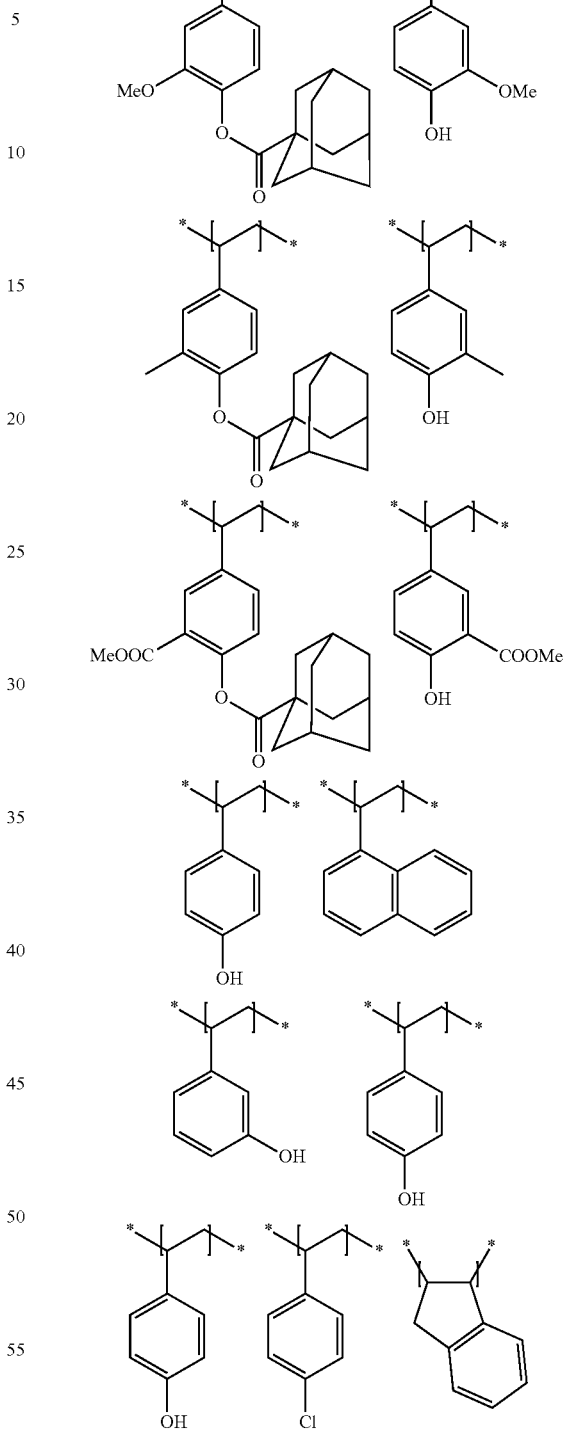
<Compound (B) Having Structure Represented by General Formula (1) or (2) within Molecule Thereof>
The actinic ray-sensitive or radiation-sensitive resin composition of the present invention includes a compound (B) having a structure represented by the following General Formula (1) or (2) within a molecule thereof (also referred to as a "compound (B)").

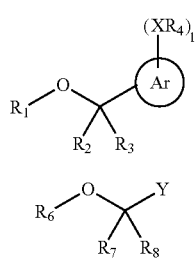

In General Formula (1),

Ar represents an aromatic ring group.

$R_2$ and $R_3$ each independently represent a hydrogen atom, an alkyl group, a cycloalkyl group, an aryl group, or an aralkyl group, and may be bonded to each other to form a ring, and further, $R_2$ and $R_3$ may be each bonded to Ar to form a ring.

In a case where $R_2$ and $R_3$ both represent a hydrogen atom, $R_1$ represents a hydrogen atom, an alkyl group, a cycloalkyl group, an aryl group, an aralkyl group, or an acyl group.

In a case where at least one of $R_2$ and $R_3$ represents a group other than a hydrogen atom, $R_1$ represents an alkyl group, a cycloalkyl group, an aryl group, an aralkyl group, or an acyl group.

$R_4$ represents a hydrogen atom, an alkyl group, an aryl group, an aralkyl group, or an acyl group.

X represents an oxygen atom or $NR_5$, and $R_5$ represents a hydrogen atom, an alkyl group, an aryl group, an aralkyl group, or an acyl group.

l represents an integer of 0 to 4.

In General Formula (2),

Y represents an oxygen atom or a nitrogen atom.

$R_6$ represents a hydrogen atom, an alkyl group, a cycloalkyl group, an aryl group, an aralkyl group, or an acyl group.

$R_7$ and $R_8$ each independently represent a hydrogen atom, an alkyl group, an aryl group, or an aralkyl group, and may be bonded to each other to form a ring, and further, $R_7$ and $R_8$ may be each bonded to Y to form a ring.

However, in General Formula (1), the number of group represented by $R_1OC(R_2)(R_3)$— bonded to Ar is one, and in General Formula (2), the number of group represented by $R_6OC(R_7)(R_8)$— bonded to Y is one.

The structure represented by General Formula (1) or (2), included in the compound (B), has a site at which the structure is bonded to the resin (A) by the action of an acid. Thus, when the compound (B) is bonded to the resin (A) by the action of an acid, the solubility of the resin (A) in a developer is reduced.

In General Formula (1), the aromatic ring group of Ar may have a substituent. Examples of the substituent include an alkyl group, a cycloalkyl group, an aralkyl group, a carboxyl group, a cyano group, an alkoxy group, an aryl group, an alkoxycarbonyloxy group, an alkylthio group, a nitro group, and a halogen atom.

The aromatic ring in the aromatic ring group of Ar is a monocyclic or polycyclic aromatic ring, and examples thereof include an aromatic hydrocarbon ring having 6 to 18 carbon atoms, such as a benzene ring, a naphthalene ring, an anthracene ring, a fluorene ring, and a phenanthrene ring, and an aromatic hetero ring including a hetero ring, such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, a thiazole ring, a xanthene ring, and a carbazole ring. Among those, a benzene ring and a naphthalene ring are preferable, and a benzene ring is the most preferable.

$R_2$ and $R_3$ each independently represent a hydrogen atom, an alkyl group, a cycloalkyl group, an aryl group, or an aralkyl group, and may be bonded to each other to form a ring. As the alkyl group, an alkyl group having 1 to 18 carbon atoms is preferable, and an alkyl group having 1 to 10 carbon atoms is more preferable. As the cycloalkyl group, a cycloalkyl group having 3 to 18 carbon atoms is preferable, and a cycloalkyl group having 5 to 10 carbon atoms is more preferable. As the aryl group, an aryl group having 6 to 18 carbon atoms is preferable, and an aryl group having 6 to 12 carbon atoms is more preferable. As the aralkyl group, an aralkyl group having 7 to 20 carbon atoms is preferable, and an aralkyl group having 7 to 13 carbon atoms is more preferable. These alkyl groups, aryl groups, and aralkyl groups may have a substituent, and examples of the substituent include a hydroxyl group, a carboxyl group, an amino group, a cyano group, an alkyl group, an alkoxy group, an aryl group, an alkoxycarbonyloxy group, an alkylthio group, a nitro group, and a halogen atom.

Moreover, $R_2$ and $R_3$ may be each bonded to Ar to form a ring, and as the formed ring, a cycloalkane ring, an aromatic ring, or the like is preferable.

$R_2$ and $R_3$ are each preferably a hydrogen atom or an alkyl group, and more preferably a hydrogen atom.

As the alkyl group represented by $R_1$, an alkyl group having 1 to 18 carbon atoms is preferable, and an alkyl group having 1 to 10 carbon atoms is more preferable.

As the cycloalkyl group represented by $R_1$, a cycloalkyl group having 3 to 18 carbon atoms is preferable, and a cycloalkyl group having 5 to 10 carbon atoms is more preferable.

As the aryl group represented by $R_1$, an aryl group having 6 to 18 carbon atoms is preferable, and an aryl group having 6 to 12 carbon atoms is more preferable.

As the aralkyl group represented by $R_1$, an aralkyl group having 7 to 20 carbon atoms is preferable, and an aralkyl group having 7 to 13 carbon atoms is more preferable.

As the acyl group represented by $R_1$, an acyl group having 2 to 19 carbon atoms is preferable, and an acyl group having 2 to 11 carbon atoms is more preferable.

These alkyl groups, aryl groups, aralkyl groups, or acyl groups may have a substituent, and examples of the substituent include a hydroxyl group, a carboxyl group, an amino group, a cyano group, an alkyl group, an alkoxy group, an aryl group, an alkoxycarbonyloxy group, an alkylthio group, a nitro group, and a halogen atom.

$R_1$ preferably represents a hydrogen atom or an alkyl group, and is more preferably an alkyl group.

X represents an oxygen atom or $NR_5$, and $R_5$ represents a hydrogen atom, an alkyl group, an aryl group, an aralkyl group, or an acyl group.

As the alkyl group represented by $R_4$, an alkyl group having 1 to 18 carbon atoms is preferable, and an alkyl group having 1 to 10 carbon atoms is more preferable.

As the aryl group represented by $R_4$, an aryl group having 6 to 18 carbon atoms is preferable, and an aryl group having 6 to 12 carbon atoms is more preferable.

As the aralkyl group represented by $R_4$, an aralkyl group having 7 to 20 carbon atoms is preferable, and an aralkyl group having 7 to 13 carbon atoms is more preferable.

As the acyl group represented by $R_4$, an acyl group having 2 to 19 carbon atoms is preferable, and an acyl group having 2 to 11 carbon atoms is more preferable.

These alkyl groups, aryl groups, aralkyl groups, or acyl groups may have a substituent, and examples of the substituent include a hydroxyl group, a carboxyl group, an amino group, a cyano group, an alkyl group, an alkoxy group, an aryl group, an alkoxycarbonyloxy group, an alkylthio group, a nitro group, and a halogen atom.

$R_4$ preferably represents a hydrogen atom or an alkyl group, and is more preferably a hydrogen atom.

X preferably represents an oxygen atom.

l represents an integer of 0 to 4, preferably represents an integer of 0 to 2, and more preferably represents 1.

In General Formula (2), Y represents an oxygen atom or a nitrogen atom, and preferably represents a nitrogen atom.

$R_6$ represents a hydrogen atom, an alkyl group, a cycloalkyl group, an aryl group, an aralkyl group, or an acyl group.

As the alkyl group represented by $R_6$, an alkyl group having 1 to 18 carbon atoms is preferable, and an alkyl group having 1 to 10 carbon atoms is more preferable.

As the cycloalkyl group represented by $R_6$, a cycloalkyl group having 3 to 18 carbon atoms is preferable, and a cycloalkyl group having 5 to 10 carbon atoms is more preferable.

As the aryl group represented by $R_6$, an aryl group having 6 to 18 carbon atoms is preferable, and an aryl group having 6 to 12 carbon atoms is more preferable.

As the aralkyl group represented by $R_6$, an aralkyl group having 7 to 20 carbon atoms is preferable, and an aralkyl group having 7 to 13 carbon atoms is more preferable.

As the acyl group represented by $R_6$, an acyl group having 2 to 19 carbon atoms is preferable, and an acyl group having 2 to 11 carbon atoms is more preferable.

These alkyl groups, aryl groups, aralkyl groups, or acyl groups may have a substituent, and examples of the substituent include hydroxyl group, a carboxyl group, an amino group, a cyano group, an alkyl group, an alkoxy group, an aryl group, an alkoxycarbonyloxy group, an alkylthio group, a nitro group, and a halogen atom.

$R_6$ preferably represents a hydrogen atom or an alkyl group, and is more preferably a hydrogen atom.

$R_7$ and $R_8$ each independently represent a hydrogen atom, an alkyl group, an aryl group, or an aralkyl group, and may be bonded to each other to form a ring.

As the alkyl group represented by each of $R_7$ and $R_8$, an alkyl group having 1 to 18 carbon atoms is preferable, and an alkyl group having 1 to 10 carbon atoms is more preferable.

As the aryl group represented by each of $R_7$ and $R_8$, an aryl group having 6 to 18 carbon atoms is preferable, and an aryl group having 6 to 12 carbon atoms is more preferable.

As the aralkyl group represented by each of $R_7$ and $R_8$, an aralkyl group having 7 to 20 carbon atoms is preferable, and an aralkyl group having 7 to 13 carbon atoms is more preferable.

These alkyl groups, aryl groups, or aralkyl groups may have a substituent, and examples of the substituent include a hydroxyl group, a carboxyl group, an amino group, a cyano group, an alkyl group, an alkoxy group, an aryl group, an alkoxycarbonyloxy group, an alkylthio group, a nitro group, and a halogen atom.

$R_7$ and $R_8$ may be bonded to each other to form a ring, and as the formed ring, a cycloalkane ring, an aromatic ring, or the like is preferable.

Furthermore, $R_7$ and $R_8$ may be each bonded to Y to form a ring, and as the formed ring, a cycloalkane ring, an aromatic ring, or the like is preferable.

$R_7$ and $R_8$ each preferably represent a hydrogen atom or an alkyl group, and more preferably represent a hydrogen atom.

The compound (B) is more preferably a compound represented by the following General Formula (1-1) or (2-1).

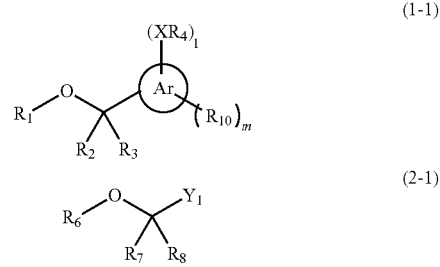

In General Formula (1-1),

Ar represents an aromatic ring group.

$R_2$ and $R_3$ each independently represent a hydrogen atom, an alkyl group, a cycloalkyl group, an aryl group, or an aralkyl group, and may be bonded to each other to form a ring, and further, $R_2$ and $R_3$ may be each bonded to Ar to form a ring.

In a case where $R_2$ and $R_3$ both represent a hydrogen atom, R1 represents a hydrogen atom, an alkyl group, a cycloalkyl group, an aryl group, an aralkyl group, or an acyl group.

In a case where at least one of $R_2$ and $R_3$ represents a group other than a hydrogen atom, $R_1$ represents an alkyl group, an aryl group, an aralkyl group, or an acyl group.

$R_4$ represents a hydrogen atom, an alkyl group, a cycloalkyl group, an aryl group, an aralkyl group, or an acyl group.

X represents an oxygen atom or $NR_5$, and $R_5$ represents a hydrogen atom, an alkyl group, an aryl group, an aralkyl group, or an acyl group.

l represents an integer of 0 to 4.

$R_{10}$ represents a substituent, and m represents an integer of 0 to 4.

In General Formula (2-1), $Y_1$ represents $OR_{11}$ or $NR_{12}R_{13}$, and $R_{11}$, $R_{12}$, and $R_{13}$ each independently represent a hydrogen atom, an alkyl group, an aryl group, an aralkyl group, an acyl group, an acyloxy group, or an amido group.

$R_6$ represents a hydrogen atom, an alkyl group, a cycloalkyl group, an aryl group, an aralkyl group, or an acyl group.

$R_7$ and $R_8$ each independently represent a hydrogen atom, an alkyl group, an aryl group, or an aralkyl group, and may be bonded to each other to form a ring, and further, $R_7$ and $R_8$ may be each bonded to $Y_1$ to form a ring.

However, in General Formula (1-1), the number of group represented by $R_1OC(R_2)(R_3)$— bonded to Ar is one, and in General Formula (2-1), the number of group represented by $R_6OC(R_7)(R_8)$— bonded to Y is one.

Ar, $R_1$, $R_2$, $R_3$, $R_4$, X, and l in General Formula (1-1) have the same definitions as Ar, $R_1$, $R_2$, $R_3$, $R_4$, X, and l in General Formula (1), respectively, and specific examples and preferred ranges thereof are also the same.

$R_{10}$ represents a substituent, and examples of the substituent include a alkyl group, a cycloalkyl group, an aralkyl group, an alkoxy group, an aryl group, an aryloxy group, a carboxyl group, a cyano group, an alkoxycarbonyloxy group, an alkylthio group, a nitro group, and a halogen atom. $R_{10}$ may be bonded to at least one of $R_2$ or $R_3$ to form a ring.

m represents an integer of 0 to 4, and preferably represents an integer of 0 to 2.

$R_6$, $R_7$, and $R_8$ in General Formula (2-1) the same definitions as $R_6$, $R_7$, and $R_8$ in General Formula (2), respectively, and specific examples and preferred ranges thereof are also the same.

$Y_1$ represents $OR_{11}$ or $NR_{12}R_{13}$, and $R_{11}$, $R_{12}$, and $R_{13}$ each independently represent a hydrogen atom, an alkyl group, an aryl group, an aralkyl group, an acyl group, an acyloxy group, or an amido group.

As the alkyl group represented by each of $R_{11}$, $R_{12}$, and $R_{13}$, an alkyl group having 1 to 18 carbon atoms is preferable, and an alkyl group having 1 to 10 carbon atoms is more preferable.

As the aryl group represented by each of $R_{11}$, $R_{12}$, and $R_{13}$, an aryl group having 6 to 18 carbon atoms is preferable, and an aryl group having 6 to 12 carbon atoms is more preferable.

As the aralkyl group represented by each of $R_{11}$, $R_{12}$, and $R_{13}$, an aralkyl group having 7 to 20 carbon atoms is preferable, and an aralkyl group having 7 to 13 carbon atoms is more preferable.

As the acyl group represented by each of $R_{11}$, $R_{12}$, and $R_{13}$, an acyl group having 2 to 19 carbon atoms is preferable, and an acyl group having 2 to 11 carbon atoms is more preferable.

As the acyloxy group represented by each of $R_{11}$, $R_{12}$, and $R_{13}$, an acyloxy group having 2 to 19 carbon atoms is preferable, and an acyloxy group having 2 to 11 carbon atoms is more preferable.

In a case where $R_{11}$, $R_{12}$, and $R_{13}$ each represent an amido group, they are preferably represented by —$CONR_{14}R_{15}$. $R_{14}$ and $R_{15}$ each independently represent a hydrogen atom, an alkyl group (preferably having 1 to 18 carbon atoms, and more preferably having 1 to 10 carbon atoms), a cycloalkyl group (preferably having 3 to 18 carbon atoms, and more preferably having 5 to 10 carbon atoms), an alkenyl group (preferably having 2 to 18 carbon atoms, and more preferably having 2 to 10 carbon atoms), cycloalkenyl group (preferably having 5 to 18 carbon atoms, and more preferably having 5 to 10 carbon atoms), an alkanyl group (preferably having 2 to 18 carbon atoms, and more preferably having 2 to 10 carbon atoms), an aryl group (preferably having 6 to 18 carbon atoms, and more preferably having 6 to 12 carbon atoms), an alkoxy group (preferably having 1 to 18 carbon atoms, and more preferably having 1 to 10 carbon atoms), or an aryloxy group (preferably having 6 to 18 carbon atoms, and more preferably having 6 to 10 carbon atoms).

These respective groups may further have a substituent, and examples of the substituent include a carboxyl group, a cyano group, an alkoxy group, an aryl group, an alkoxycarbonyloxy group, an alkylthio group, a nitro group, and a halogen atom.

$R_{14}$ and $R_{15}$ may be bonded to each other to form a ring.

$R_7$ and $R_8$ may be each bonded to $Y_1$ to form a ring, and as the formed ring, a cycloalkane ring, an aromatic ring, or the like is preferable.

Specific examples of the compound (B) are shown below, but the present invention is not limited thereto.

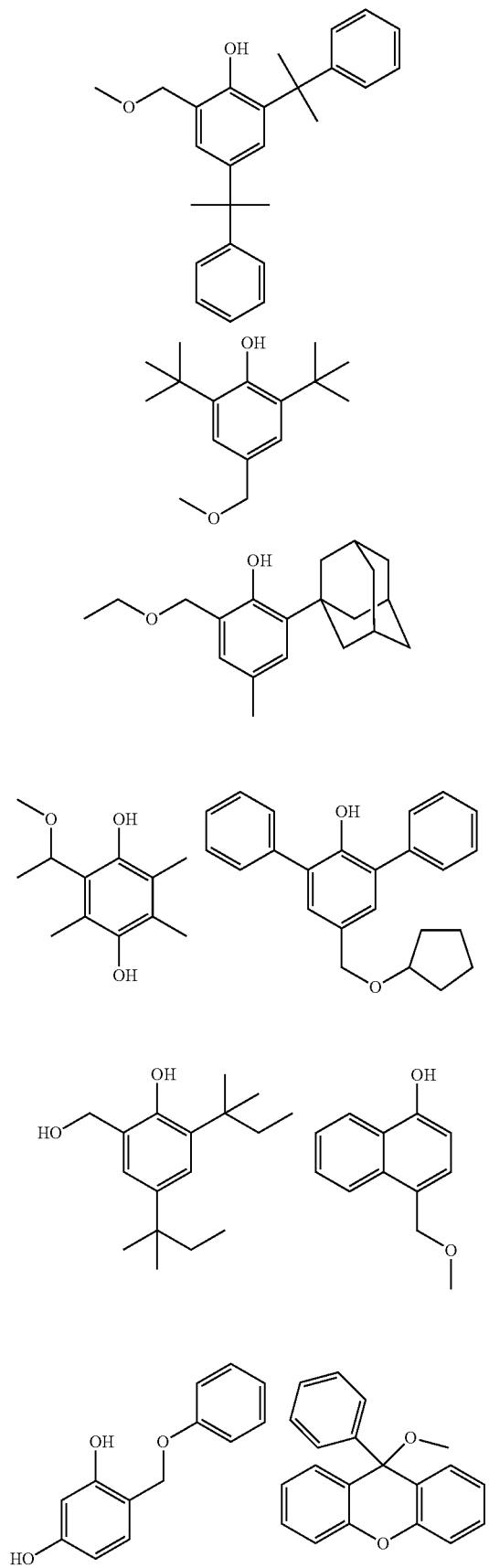

-continued

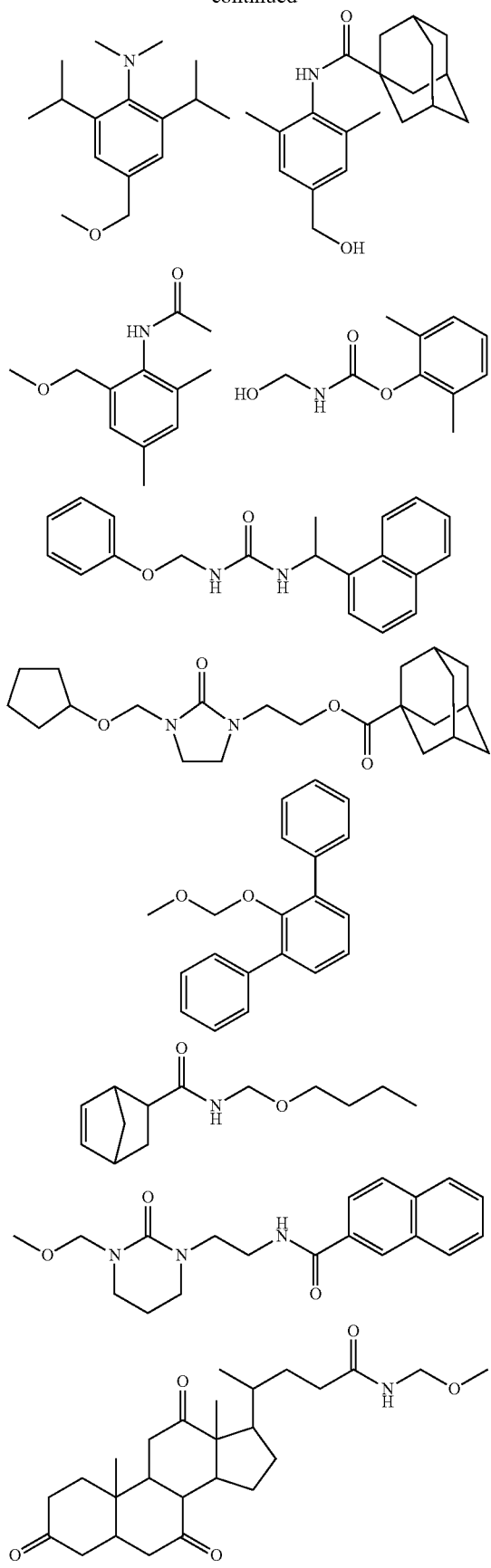

-continued

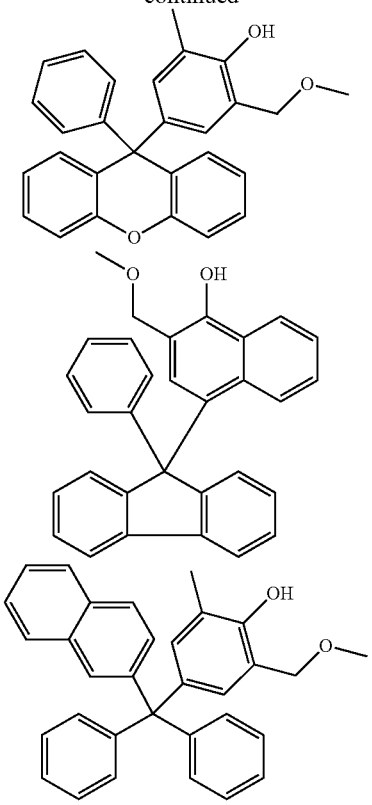

The molecular weight of the compound (B) is preferably 250 or more, and the molecular weight of the compound (B) is preferably 1000 or less.

When the molecular weight of the compound (B) is 250 or more, the PED stability tends to be more excellent.

The content of the compound (B) in the composition is preferably 5% to 70% by mass, and more preferably 10% to 60% by mass, with respect to the total solid content of the composition.

The compound (B) may be used singly or in combination of two or more kinds thereof.

The compound (B) can be synthesized by a method including, for example, allowing a compound such as a corresponding phenol, aniline, amide, urea, or the like to undergo an action under a basic condition to introduce a methylol group.

<Compound (C) that Generates Acid Upon Irradiation with Actinic Ray or Radiation>

The composition of the present invention may further include a compound (C) that generates an acid upon irradiation with actinic ray or radiation (also referred to as a "compound (C)," an "acid generator," or a "photoacid generator").

The compound (C) that generates an acid upon irradiation with actinic ray or radiation may be in a form of a low molecular compound or in a form introduced into a part of a polymer. Further, a combination of the form of a low molecular compound and the form introduced into a part of a polymer may also be used.

In a case where the compound (C) that generates an acid upon irradiation with actinic ray or radiation is in the form of a low molecular compound, the molecular weight is preferably 3,000 or less, more preferably 2,000 or less, and still more preferably 1,000 or less.

In a case where the compound (C) that generates an acid upon irradiation with actinic ray or radiation is in the form introduced into a part of a polymer, it may be introduced into a part of the acid-decomposable resin described above or into a resin other than the acid-decomposable resin.

Preferred forms of the acid generator may include an onium salt compound. Examples of such an onium salt compound include a sulfonium salt, an iodonium salt, and a phosphonium salt.

Further, other preferred forms of the acid generator may include a compound that generates a sulfonic acid, an imidic acid, or a methide acid upon irradiation with actinic ray or radiation. Examples of the acid generator in this form include a sulfonium salt, an iodonium salt, a phosphonium salt, oxime sulfonate, and imide sulfonate.

The acid generator is preferably a compound that generates an acid upon irradiation with electron beams or extreme ultraviolet rays.

In the present invention, preferred examples of the onium salt compound include a sulfonium compound represented by the following General Formula (7) and an iodonium compound by the following General Formula (8).

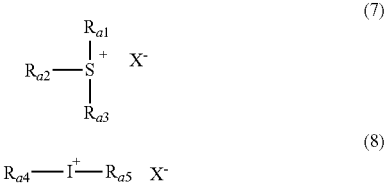

(7)

(8)

In General Formula (7) and General Formula (8), $R_{a1}$, $R_{a2}$, $R_{a3}$, $R_{a4}$, and $R_{a5}$ each independently represent an organic group.

$X^-$ represents an organic anion.

Hereinafter, the sulfonium compound represented by General Formula (7) and the iodonium compound by General Formula (8) will be described in more detail.

$R_{a1}$, $R_{a2}$, and $R_{a3}$ in General Formula (7) and $R_{a4}$ and $R_{a5}$ in General Formula (8) each independently represent an organic group. Preferably, at least one of $R_{a1}$, $R_{a2}$, or $R_{a3}$, and at least one of $R_{a4}$ or $R_{a5}$ are each an aryl group. As the aryl group, a phenyl group or a naphthyl group is preferable, and a phenyl group is more preferable.

Examples of the organic anion of $X^-$ in General Formulae (7) and (8) include a sulfonate anion, a carboxylate anion, a bis(alkylsulfonyl)amide anion, and a tris(alkylsulfonyl)methide anion. The organic anion is preferably an organic anion represented by the following General Formula (9), (10), or (11), and more preferably any of those of the following General Formula (9).

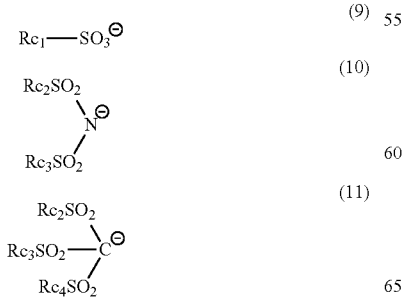

(9)

(10)

(11)

In General Formulae (9), (10) and (11), $R_{c1}$, $R_{c2}$, $R_{c3}$, and $R_{c4}$ each independently represent an organic group.

The organic anion of $X^-$ correspond to a sulfonic acid, an imidic acid, a methide acid, or the like which is an acid generated by actinic ray or radiation, such as electron beams or extreme ultraviolet rays.

Examples of the organic groups of $R_{c1}$, $R_{c2}$, $R_{c3}$, and $R_{c4}$ include an alkyl group, an aryl group, and a group formed of a plurality of these groups linked to each other. Among these organic groups, an alkyl group having a fluorine atom or a fluoroalkyl group substituted at its 1-position, and a phenyl group having a fluorine atom or a fluoroalkyl group substituted therein are preferable. The incorporation of a fluorine atom or a fluoroalkyl group increases the acidity of an acid generated upon irradiation with light, whereby the sensitivity is improved. However, it is preferable that the terminal group contains no fluorine atom as a substituent.

Moreover, in the present invention, from the viewpoint of suppressing the diffusion of an acid after exposure into unexposed areas to attain improvement of resolution and pattern shape, the compound (C) is preferably a compound capable of generating an acid (more preferably sulfonic acid) having a volume of 130 Angstrom$^3$ or more, more preferably a compound capable of generating an acid (more preferably sulfonic acid) having a volume of 190 Angstrom$^3$ or more, more preferably a compound capable of generating an acid (more preferably sulfonic acid) having a volume of 270 Angstrom$^3$ or more, and particularly preferably compound (B) is a compound capable of generating an acid (more preferably sulfonic acid) having a volume of 400 Angstrom$^3$ or more. However, from the viewpoint of sensitivity and coating solvent solubility, the volume is preferably 2,000 Angstrom$^3$ or less, and more preferably 1,500 Angstrom$^3$ or less. The value of the volume was determined by means of "WinMOPAC" manufactured by Fujitsu Limited. That is, first, the chemical structure of the acid generated by each of the compounds was inputted. Subsequently, while regarding this structure as an initial structure, the most stable conformation of the acid was determined by a molecular force field calculation using an MM3 method. Thereafter, a molecular orbital calculation using a PM3 method was carried out with respect to the most stable conformation. Thus, the "accessible volume" of each of the acids can be calculated.

Acid generators which are particularly preferable in the present invention are shown below. Further, calculated volume values (unit of Angstrom$^3$) are noted in some of acid generator examples. In addition, each of the calculated values means the value of the volume of an acid having a proton bonded to an anion moiety.

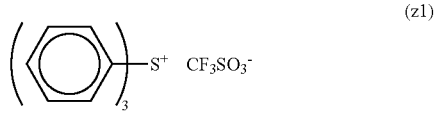

(z1)

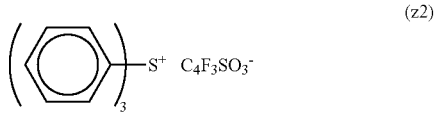

(z2)

113Å$^3$

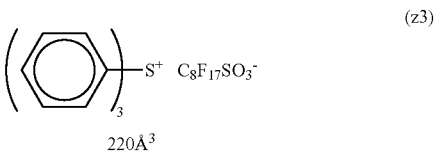

(z3)

220Å$^3$

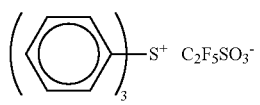 (z4)
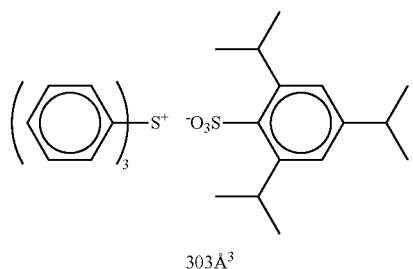 (z5)
303Å³
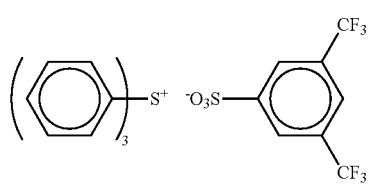 (z6)
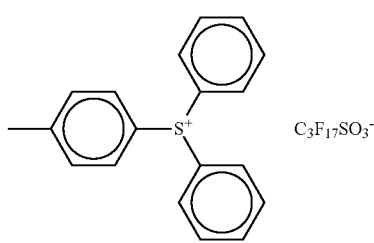 (z7)
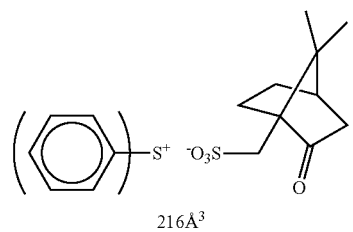 (z8)
216Å³
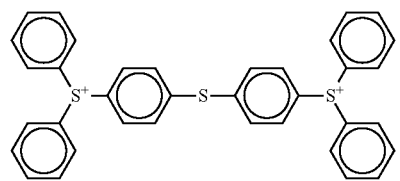 (z9)
127Å³
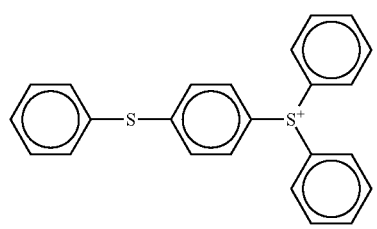 (z10)
127Å³
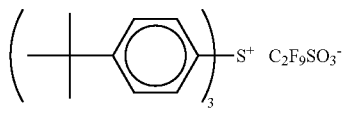 (z11)
113Å³
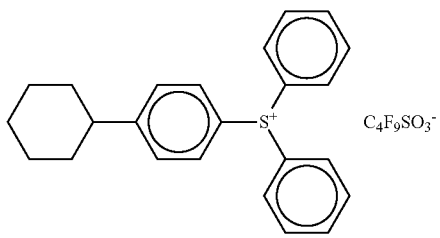 (z12)
113Å³
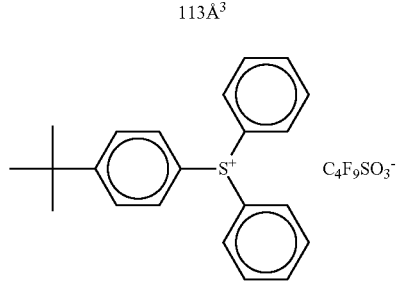 (z13)
113Å³
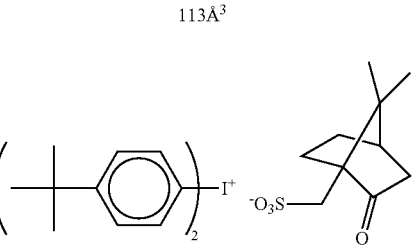 (z14)
216Å³
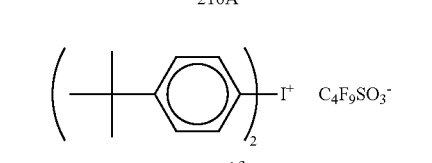 (z15)
113Å³
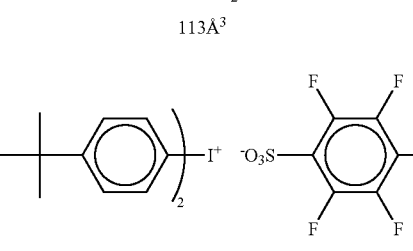 (z16)
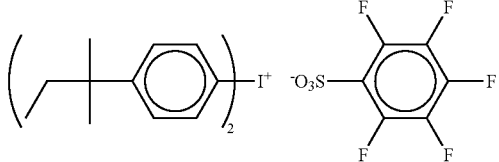
127Å³
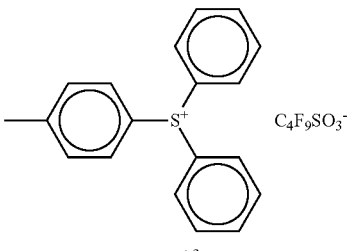 (z17)
113Å³

-continued
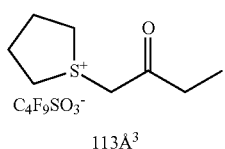
(z18)
113Å³
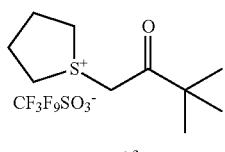
(z19)
113Å³
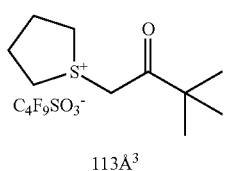
(z20)
113Å³
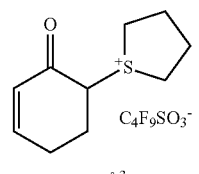
(z21)
113Å³
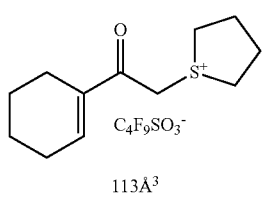
(z22)
113Å³
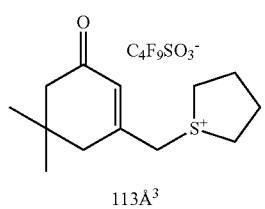
(z23)
113Å³
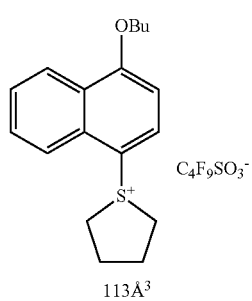
(z24)
113Å³
-continued
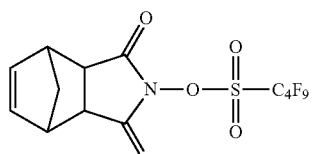
(z25)
113Å³
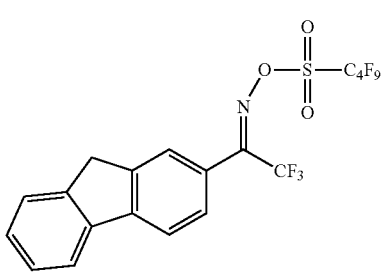
(z26)
113Å³
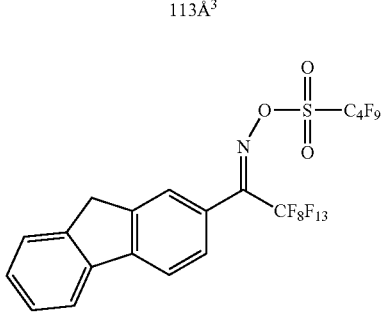
(z27)
113Å³
(z28)
113Å³
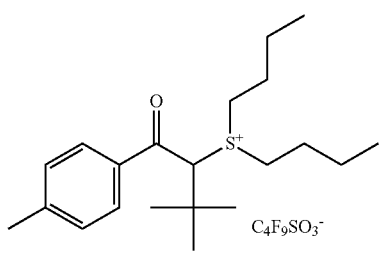
(z29)
113Å³
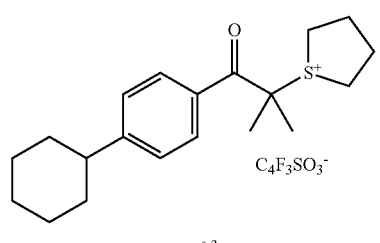
(z30)
113Å³

-continued
(z31)
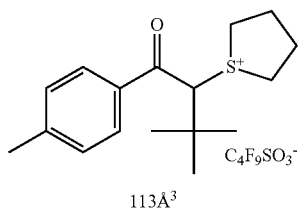
113Å³
(z32)
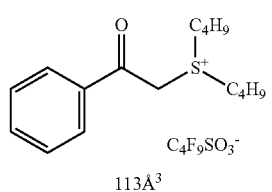
113Å³
(z33)
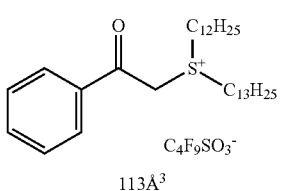
113Å³
(z34)
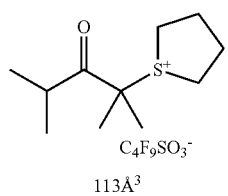
113Å³
(z35)
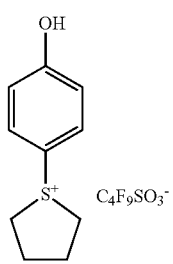
113Å³
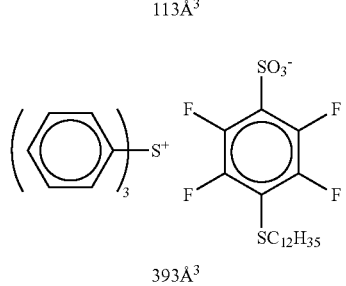
393Å³
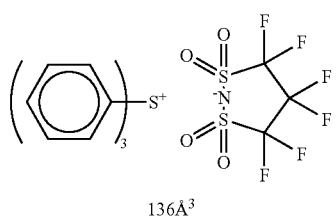
136Å³
-continued
(z38)
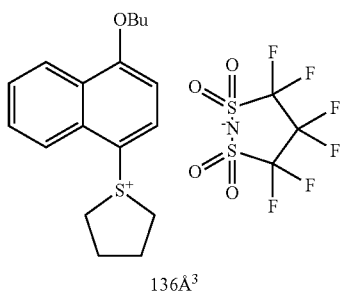
136Å³
(z40)
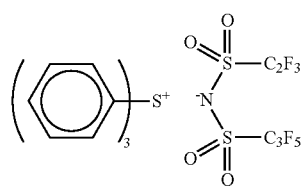
173Å³
(z42)
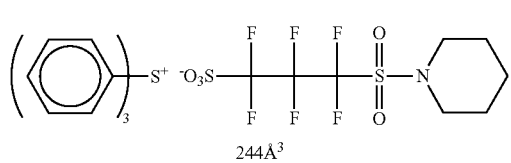
244Å³
(z43)
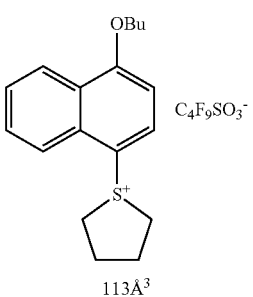
113Å³
(z44)
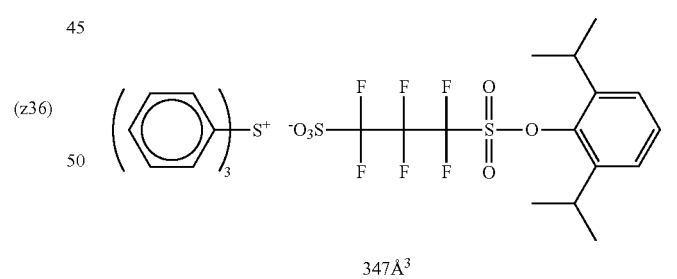
347Å³
(z45)
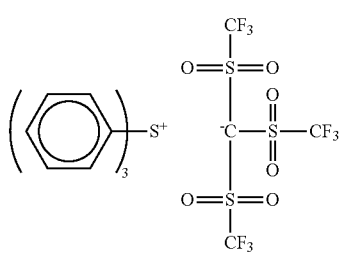
189Å³

(z46)
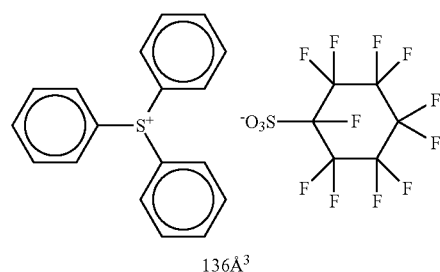
136Å³
(z47)
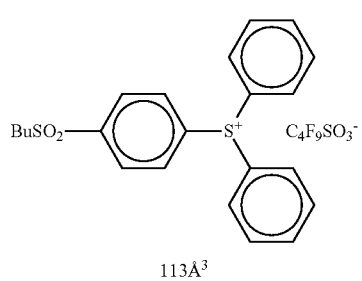
113Å³
(z48)
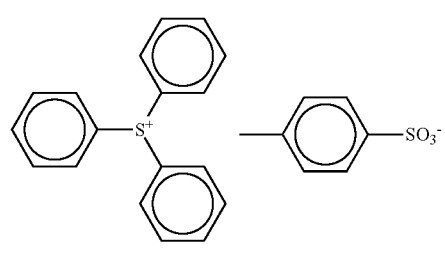
188Å³
(z49)
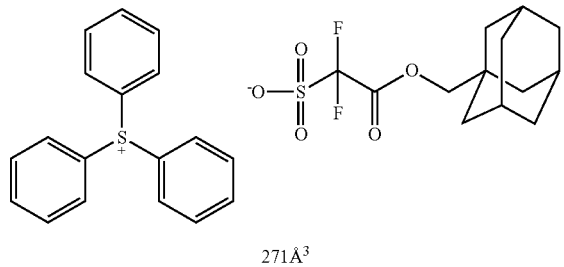
271Å³
(z50)
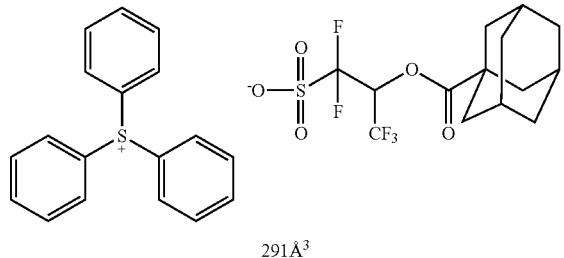
291Å³
(z51)
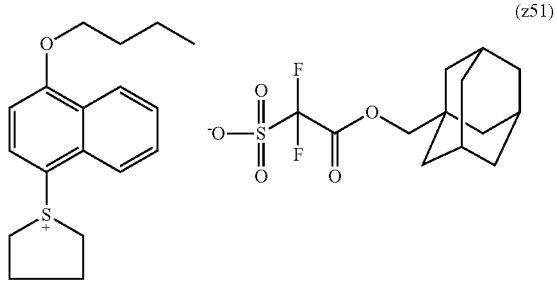
271Å³
(z52)
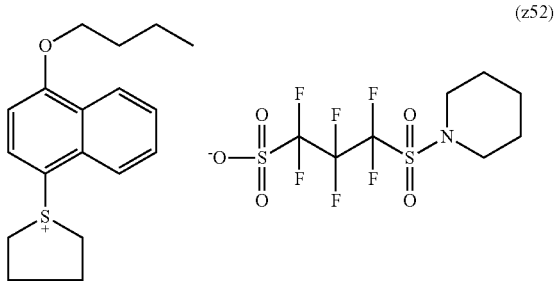
244Å³
(z53)
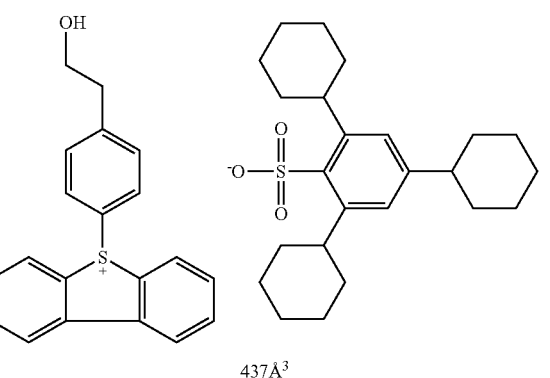
437Å³
(z54)
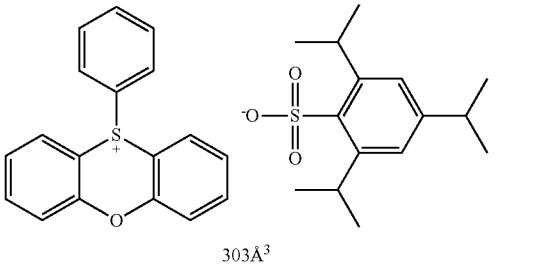
303Å³

(z55)
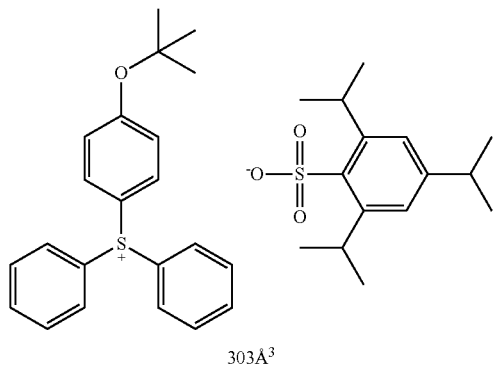
303Å³
(z56)
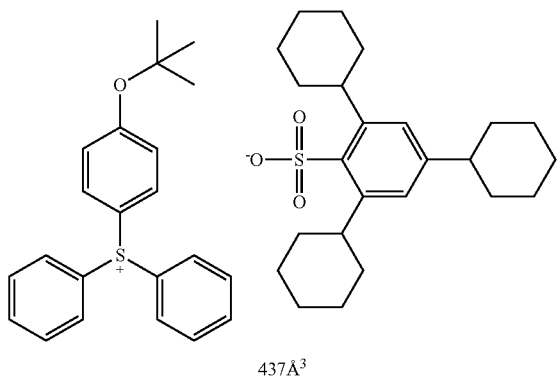
437Å³
(z57)
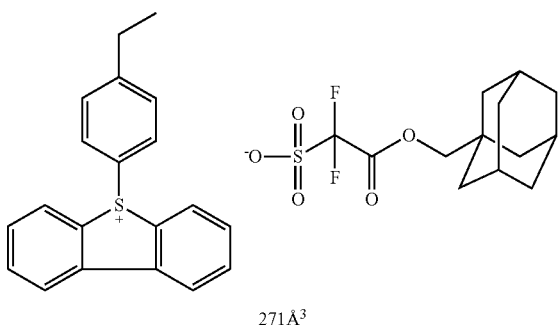
271Å³
(z58)
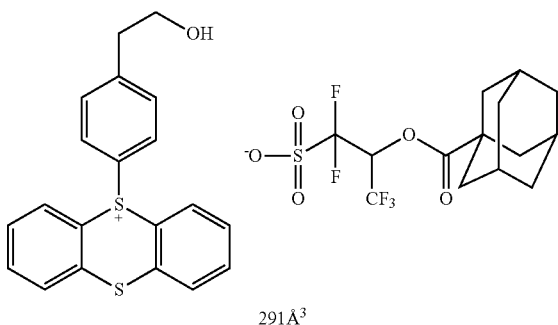
291Å³
(z59)
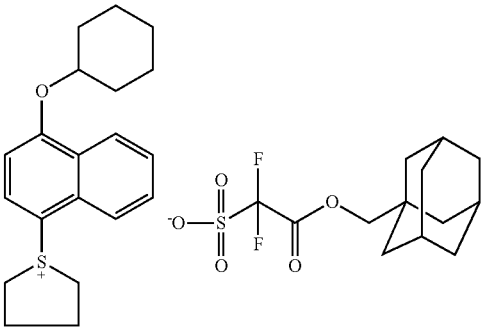
271Å³
(z60)
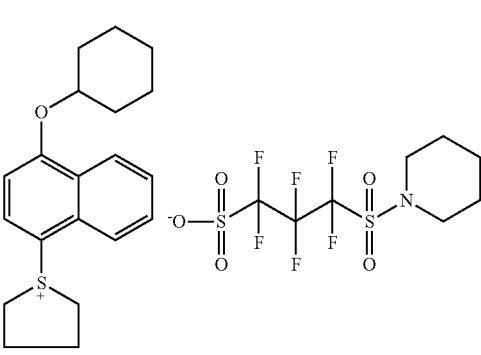
244Å³
(z61)
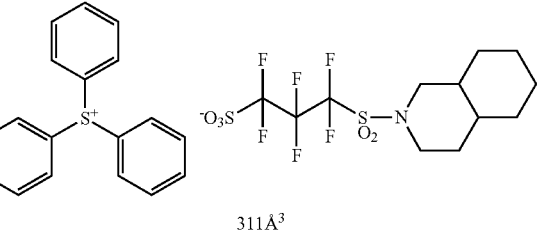
311Å³
(z62)
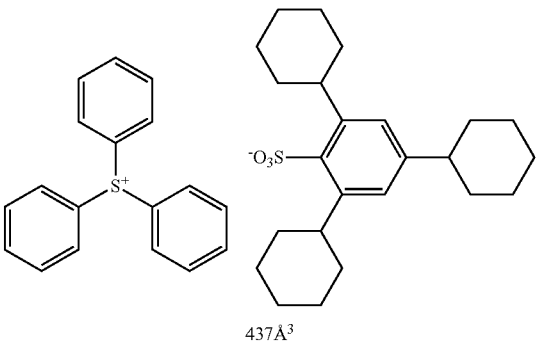
437Å³

-continued (z63)
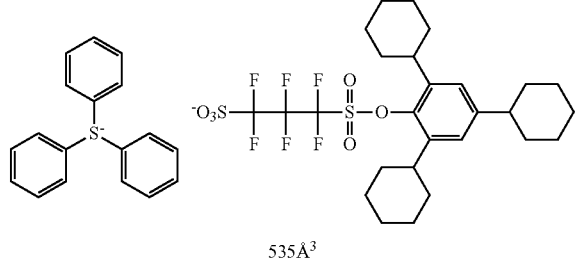
535Å³

(z64)
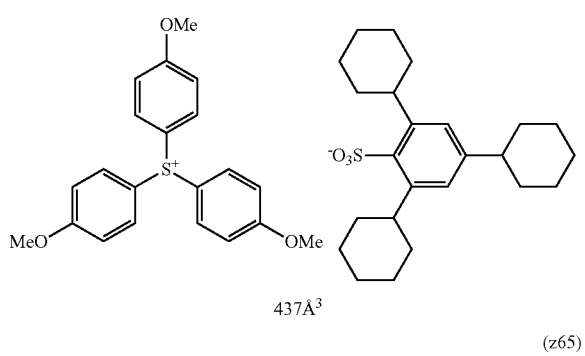
437Å³

(Z68)
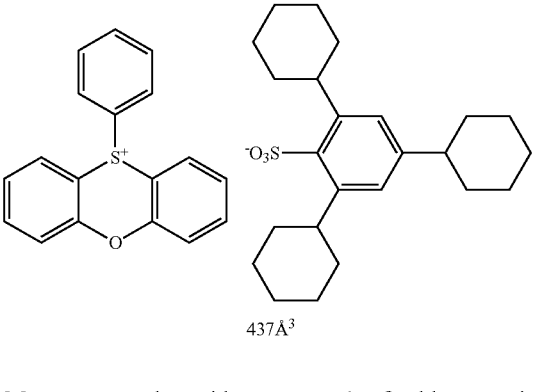
437Å³

Moreover, as the acid generator (preferably an onium compound) used in the present invention, a polymeric acid generator in which a group (photoacid generating group) that generates an acid upon irradiation with actinic ray or radiation is introduced in the main chain or side chain of the polymeric compound.

The content of the acid generator in the composition is preferably 0.1% to 25% by mass, more preferably 0.5% to 20% by mass, and still more preferably 1% to 18% by mass, with respect to the total solid content of the composition.

The acid generator may be used singly or in combination of two or more kinds thereof.

<Crosslinking Agent (D)>

The composition of the present invention may further include a crosslinking agent (hereinafter also referred to as a "compound (D)"). As the compound (D), a compound containing two or more hydroxymethyl groups or alkoxymethyl groups within a molecule thereof is preferable. From the viewpoint of improvement of LER, it is preferable that the compound (D) contains methylol groups.

First, a case where the compound (D) is a low molecular compound (hereinafter also referred to as a compound (D-1)) will be described below. Preferred examples of the compound (D-1) include a hydroxymethylated or alkoxymethylated phenol compound, an alkoxymethylated melamine-based compound, an alkoxymethyl glycol uril-based compound, and an alkoxymethylated urea-based compound. Particularly preferred examples of the compound (D-1) include an alkoxymethyl glycol uril derivative or phenol derivative having a molecular weight of 1,200 or less, which contains 3 to 5 benzene rings in each molecule and further contains two or more hydroxymethyl groups or alkoxymethyl groups in total.

As the alkoxymethyl group, a methoxymethyl group or an ethoxymethyl group is preferable.

Among these examples of the compound (D-1), a phenol derivative having a hydroxymethyl group can be obtained by reacting a corresponding phenol compound having no hydroxymethyl group with formaldehyde in the presence of a base catalyst. Further, a phenol derivative having an alkoxymethyl group can be obtained by reacting a corresponding phenol derivative having a hydroxymethyl group with an alcohol in the presence of an acid catalyst.

Other preferred examples of the compound (D-1) include compounds each having an N-hydroxymethyl group or an N-alkoxymethyl group, such as an alkoxymethylated melamine-based compound, an alkoxymethyl glycol uril-based compound, and an alkoxymethylated urea-based compound.

Examples of such compounds include hexamethoxymethylmelamine, hexaethoxymethylmelamine, tetramethoxymethyl glycol uril, 1,3-bismethoxymethyl-4,5-bismethoxyethyleneurea, and bismethoxymethylurea. These are disclosed in EP0133216A, GE3634671A, GE3711264A, and EP0212482A.
Among the specific examples of the compound (D-1), particularly preferred ones are shown below.
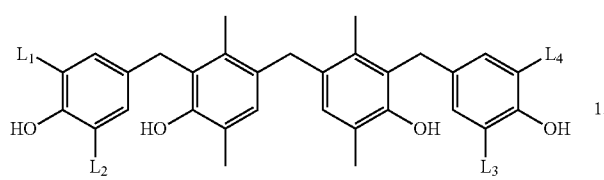
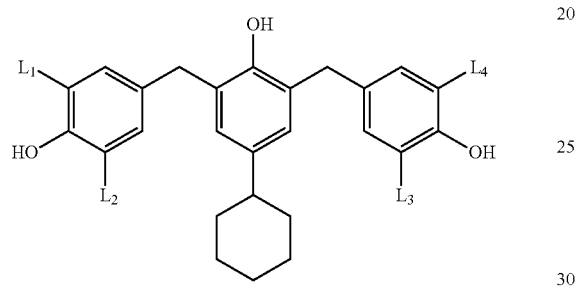
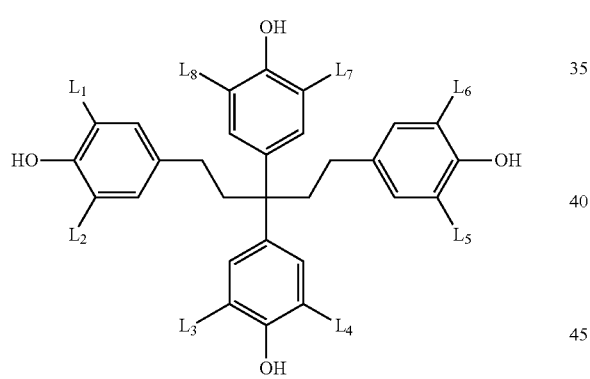
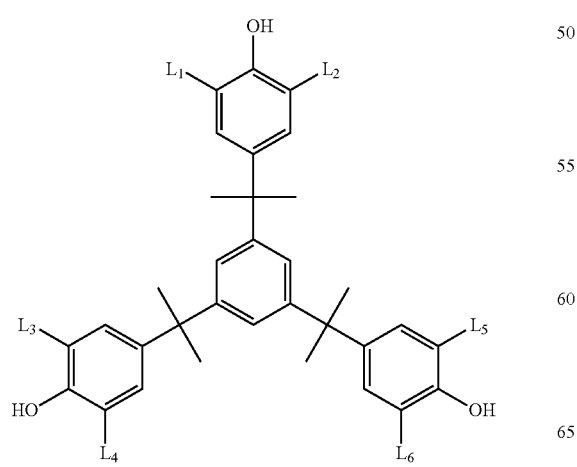
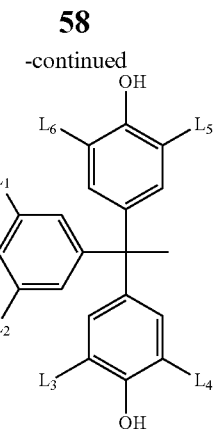
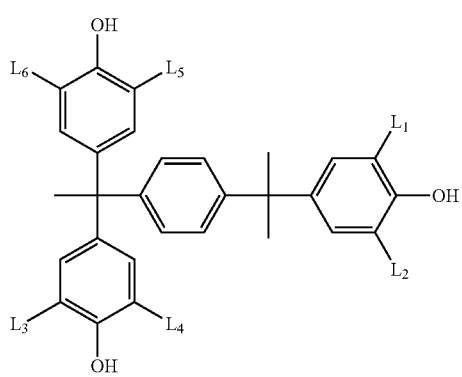
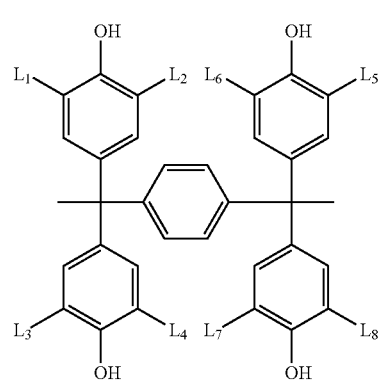
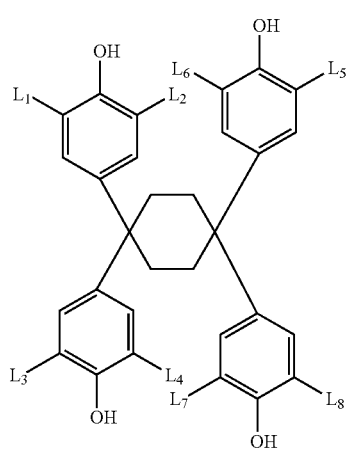

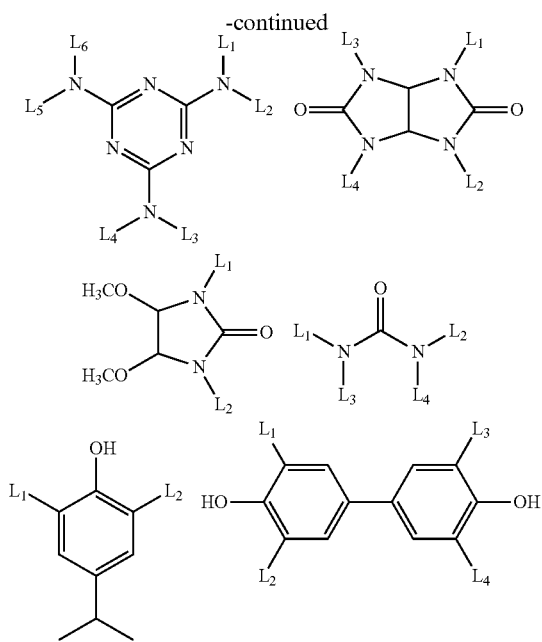

In the formulae, $L_1$ to $L_8$ each independently represent a hydrogen atom, a hydroxymethyl group, a methoxymethyl group, an ethoxymethyl group, or an alkyl group having 1 to 6 carbon atoms.

In the present invention, the content of the compound (D-1) is preferably 3% to 65% by mass, and more preferably 5% to 50% by mass, with respect to the total solid content of the composition of the present invention. By setting the content of the compound (D-1) to a range of 3% to 65% by mass, not only reduction in a remaining film rate and resolving power, but also favorable maintenance of the stability during the storage of the composition of the present invention can be attained.

In the present invention, the compound (D-1) may be used singly or in combination of two or more kinds thereof. It is preferable to use two or more kinds of the compounds (D-1) in combination from the viewpoint of a good pattern shape.

For example, in a case where the phenol derivative is used in combination with the other compound (D-1), for example, the above-mentioned compound having an N-alkoxymethyl group, the ratio of the phenol derivative to the other compound (D-1) in terms of a molar ratio is usually 90/10 to 20/80, preferably 85/15 to 40/60, and more preferably 80/20 to 50/50.

The compound (D) may be a resin (hereinafter also referred to as a compound (D-2)) including a repeating unit having an acid-crosslinkable group. In a case of this aspect, as a crosslinking group is contained in a molecular unit of the repeating unit, the crosslinking reactivity is higher than that in an ordinary aspect using a resin and a crosslinking agent. Accordingly, a hard film can be formed, thereby permitting the controls of acid diffusiveness and dry etching resistance. As a result, any diffusiveness of acids in areas exposed to actinic ray or radiation, such as electron beams or extreme ultraviolet rays, can be effectively suppressed, whereby the resolving power, the pattern shape, and the LER with respect to fine patterns are excellent. In addition, in a case where a reaction site of the resin is in the vicinity of the reaction site of a crosslinking group as in a repeating unit represented by the following General Formula (1), a composition having improved sensitivity in pattern formation is provided.

Examples of the compound (D-2) include a resin including a repeating unit represented by the following General Formula (1). The repeating unit represented by General Formula (1) has a structure containing at least one methylol group which may have a substituent.

Here, the "methylol group" is a group represented by the following General Formula (M). In an aspect of the present invention, the methylol group is preferably a hydroxymethyl group or an alkoxymethyl group.

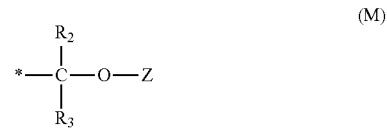

In the formula, $R_2$, $R_3$, and Z are as defined in General Formula (1') which will be described later.

First, General Formula (1') will be described.

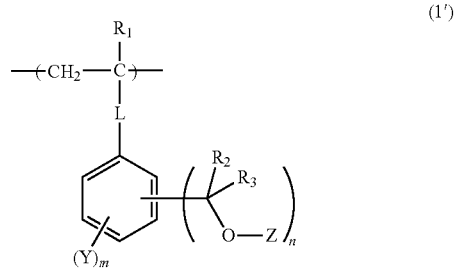

In General Formula (1'), $R_1$ represents a hydrogen atom, a methyl group or a halogen atom.

$R_2$ and $R_3$ each represent a hydrogen atom, an alkyl group, or a cycloalkyl group.

L represents a divalent linking group or a single bond.

Y represents a substituent other than a methylol group.

Z represents a hydrogen atom or a substituent.

m is an integer of 0 to 4.

n is an integer of 1 to 5.

m+n is 5 or less.

In a case where m is 2 or more, a plurality of Y's may be the same as or different from each other.

In a case where n is 2 or more, a plurality of $R_2$'s, $R_3$'s, and Z's may be the same as or different from each other.

Further, two or more of Y, $R_2$, $R_3$, and Z may be bonded to each other to form a cyclic structure.

Each of $R_1$, $R_2$, $R_3$, L, and Y may have a substituent.

Furthermore, when m is 2 or more, a plurality of Y's may be bonded via a single bond or a linking group to each other to form a cyclic structure.

In addition, the repeating unit represented by General Formula (1') is preferably represented by the following General Formula (2') or (3').

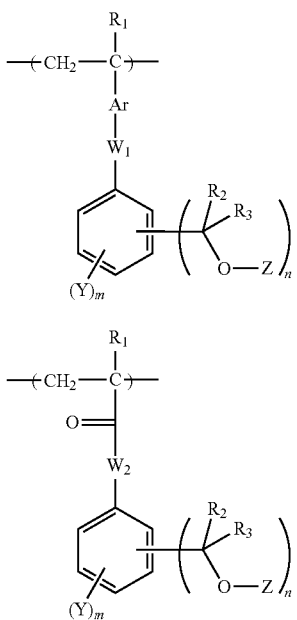

(2')

(3')

In General Formulae (2') and (3'), $R_1$, $R_2$, $R_3$, Y, Z, m, and n have the same definitions as in General Formula (1'), respectively.

Ar represents an aromatic ring.

$W_1$ and $W_2$ each represent a divalent linking group or a single bond.

Furthermore, the repeating unit represented by General Formula (1') is more preferably represented by the following General Formula (2") or (3").

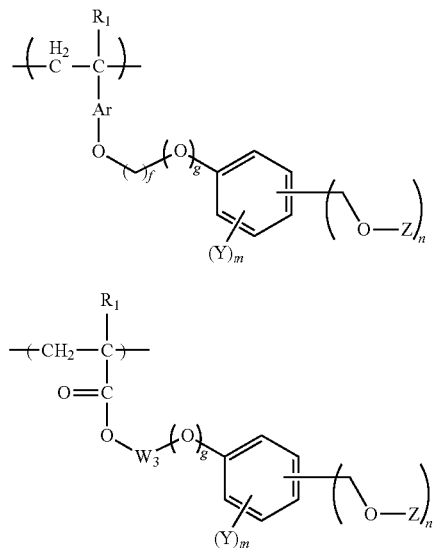

(2")

(3")

$R_1$, Y, Z, m, and n in General Formulae (2") and (3") have the same definitions as the respective groups in General Formula (1'). Ar in General Formula (2") has the same definition as Ar in General Formula (2').

In General Formula (3"), $W_3$ represents a divalent linking group.

In General Formula (2"), f is an integer of 0 to 6.

In General Formulae (2") and (3"), g is 0 or 1.

Furthermore, General formula (2") is particularly preferably represented by any one of the following General Formulae (1-a) to (1-c). The compound (D) particularly preferably includes a repeating unit represented by any one of the following General Formulae (1-a) to (1-c) or a repeating unit represented by General Formula (3").

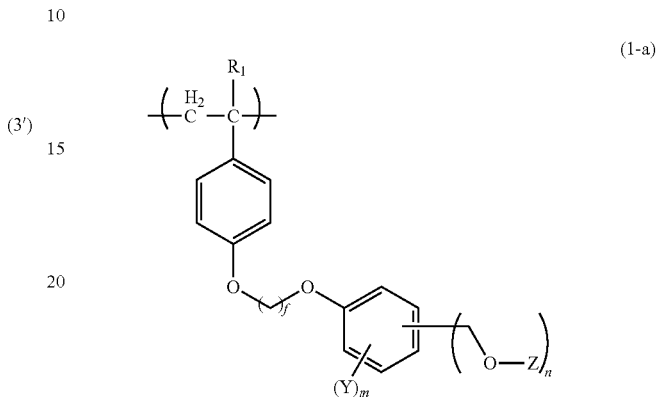

(1-a)

(1-b)

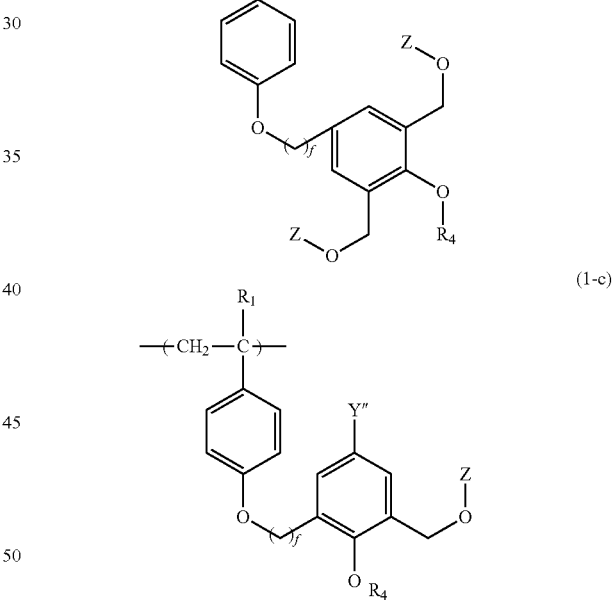

(1-c)

In General Formulae (1-a) to (1-c), $R_1$, Y, and Z are as defined above in connection with General Formula (1).

In General Formulae (1-a) to (1-c),

Y''' represents a hydrogen atom or a monovalent substituent, provided that Y''' may be a methylol group.

$R_4$ represents a hydrogen atom or a monovalent substituent.

f is an integer of 1 to 6.

m is 0 or 1, and n is an integer of 1 to 3.

The content of the repeating unit having an acid-crosslinkable group in the compound (D-2) is preferably 3% to 40% by mass, and more preferably 5% to 30% by mass, with respect to all the repeating units of the compound (D-2).

The content of the compound (D-2) is preferably 5% to 50% by mole, and more preferably 10% to 40% by mole, with respect to the total solid content of the composition of the present invention.

The compound (D-2) may contain two or more kinds of repeating units each containing an acid-crosslinkable group, or two or more kinds of the compounds (D-2) may be used in combination. Further, the compound (D-1) can also be used in combination with the compound (D-2).

Specific examples of the repeating units each containing an acid-crosslinkable group contained in the compound (D-2) include the following structures.

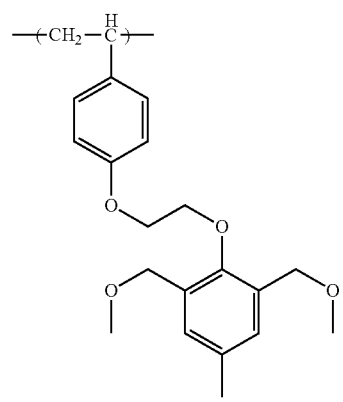

(Q-1)

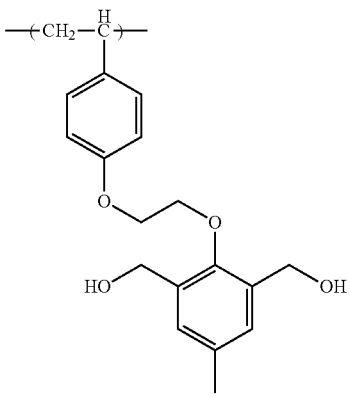

(Q-2)

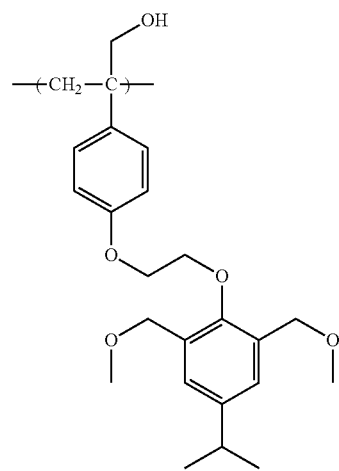

(Q-3)

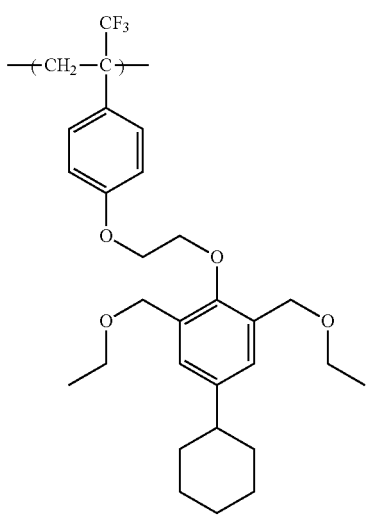

(Q-4)

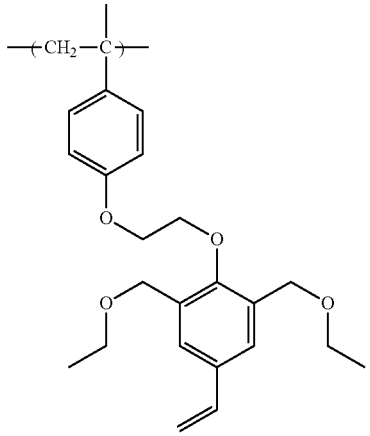

(Q-5)

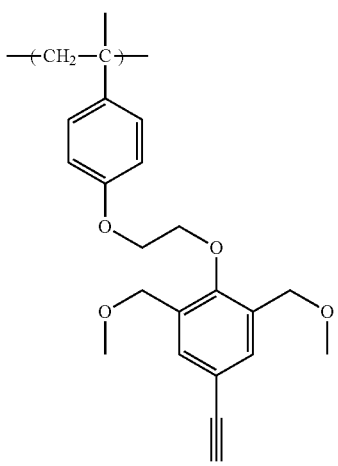

(Q-6)

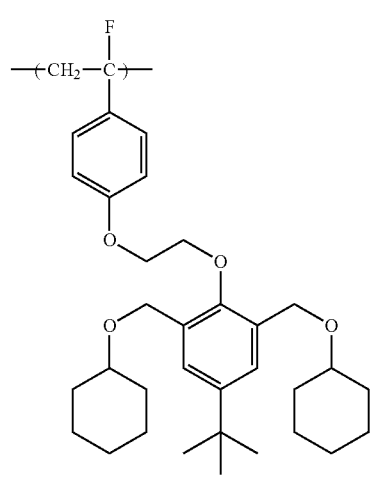 (Q-7)
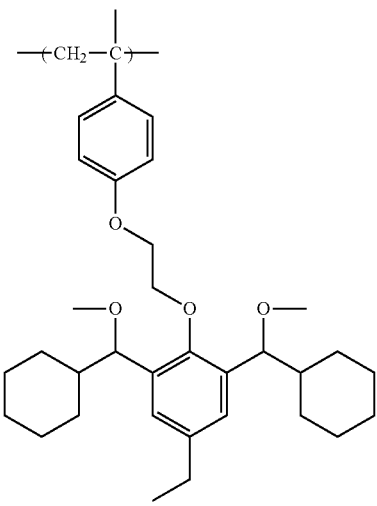 (Q-10)
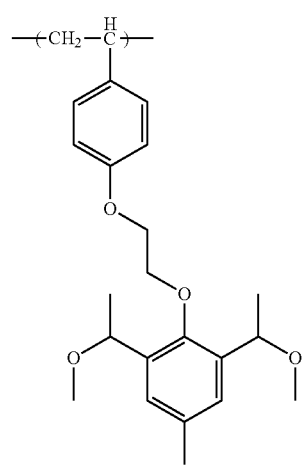 (Q-8)
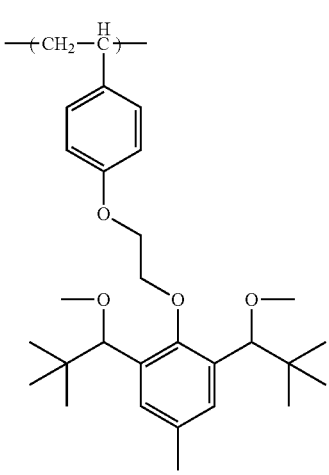 (Q-11)
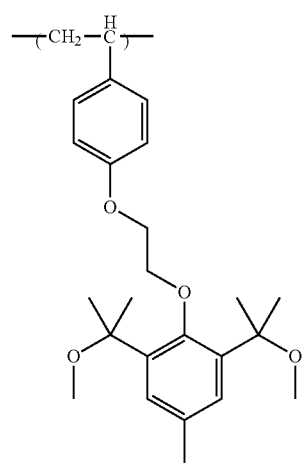 (Q-9)
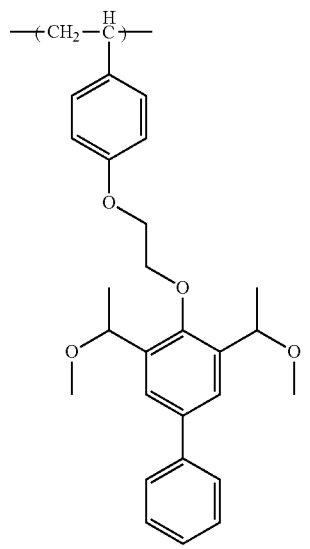 (Q-12)

-continued
(Q-13)
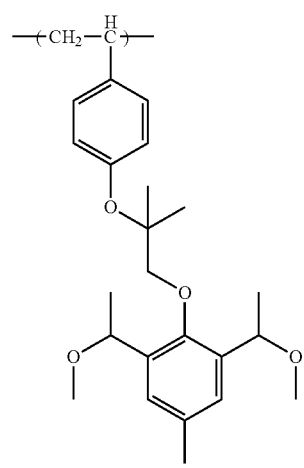
(Q-14)
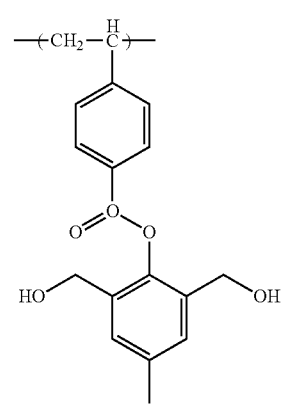
(Q-15)
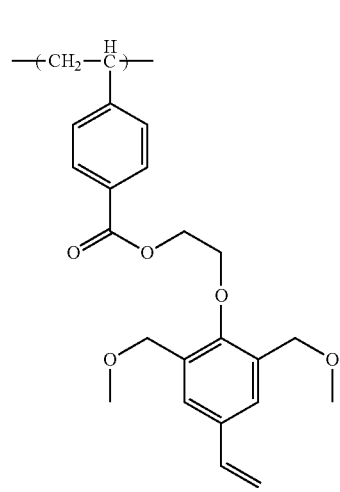
-continued
(Q-16)
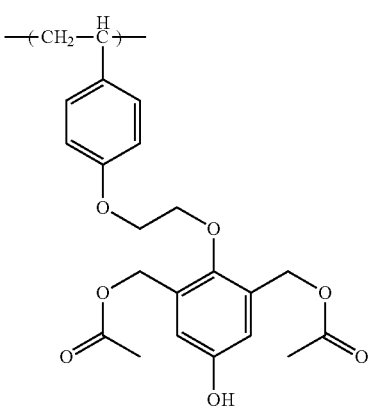
(Q-17)
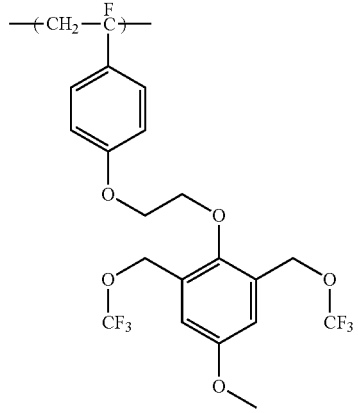
(Q-18)
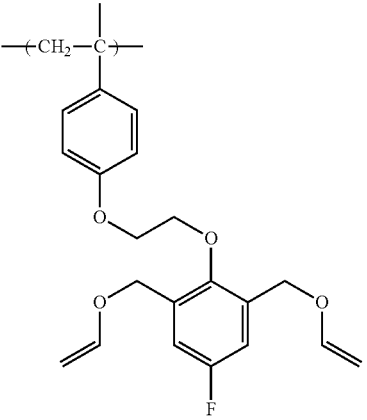

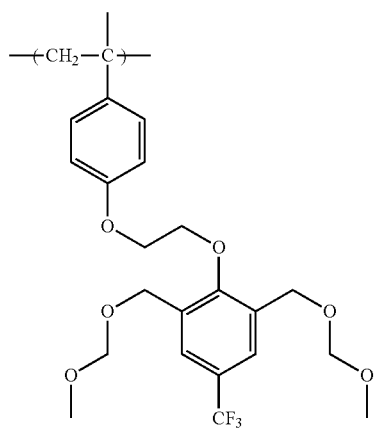
(Q-19)
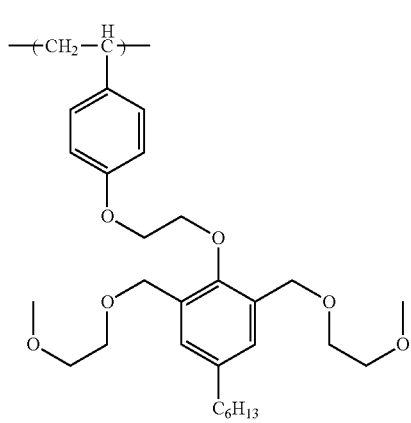
(Q-20)
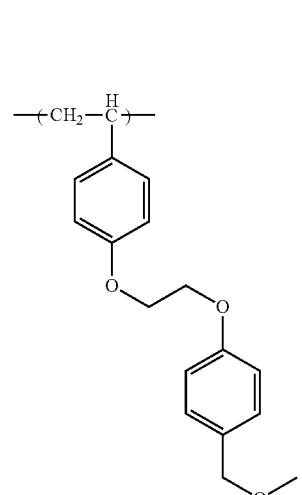
(Q-21)
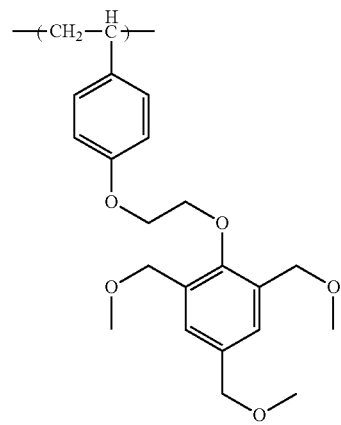
(Q-22)
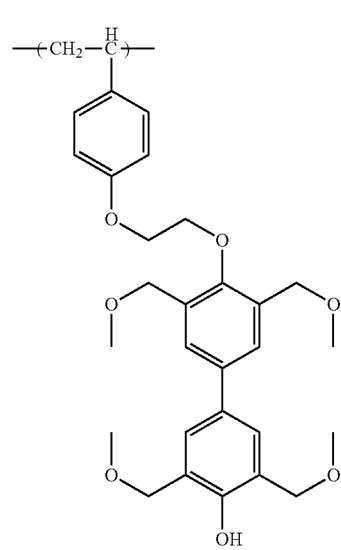
(Q-23)
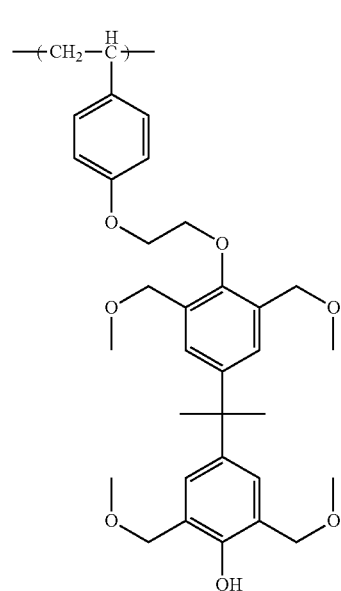
(Q-24)

(Q-25)
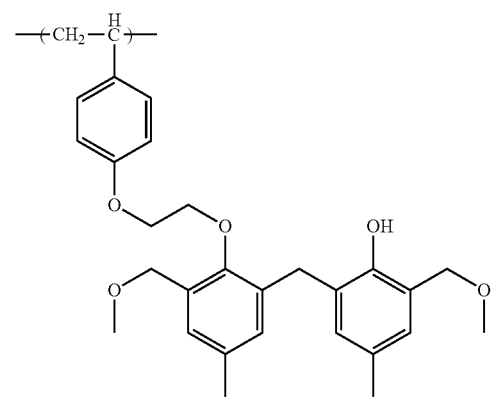
(Q-26)
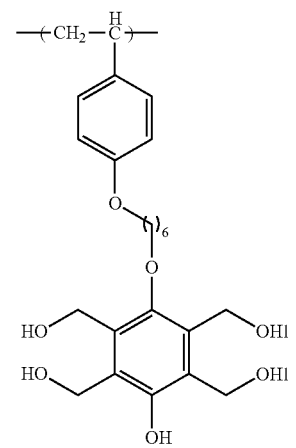
(Q-27)
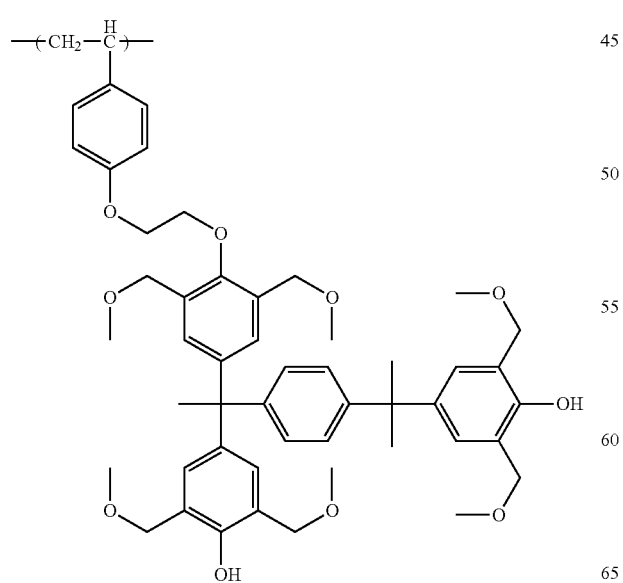
(Q-28)
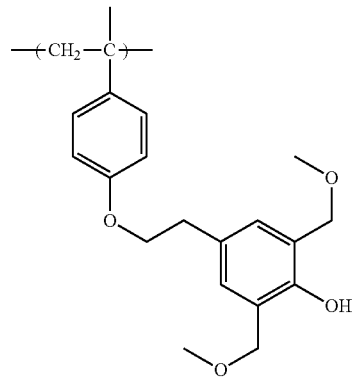
(Q-29)
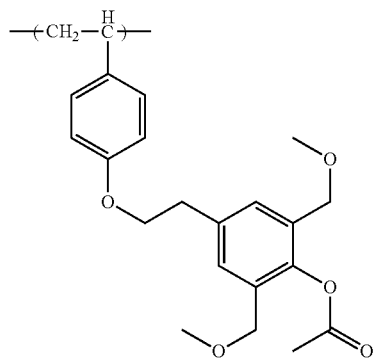
(Q-30)
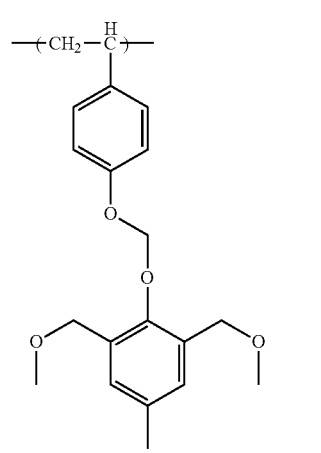
(Q-31)
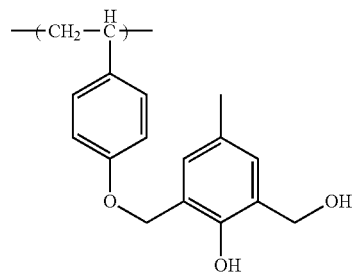

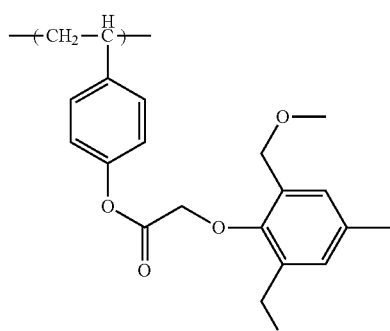
(Q-32)
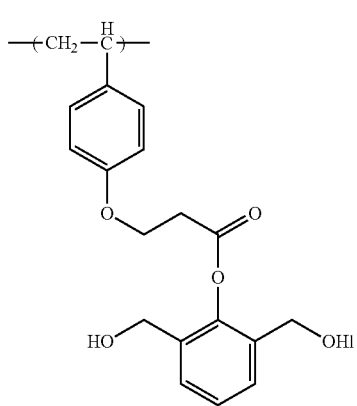
(Q-33)
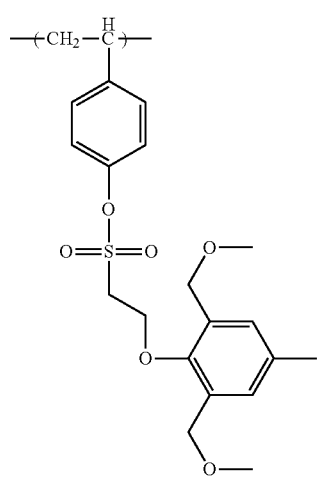
(Q-34)
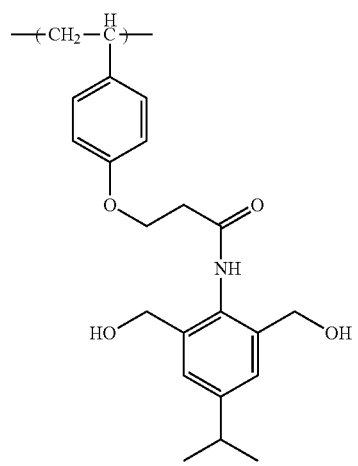
(Q-35)
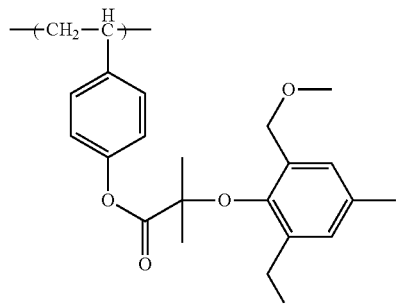
(Q-36)
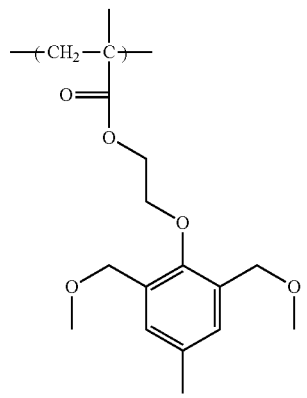
(Q-37)
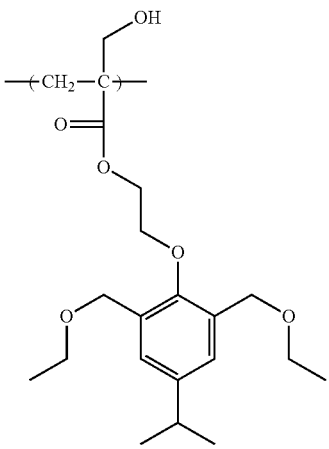
(Q-38)

-continued
(Q-39) 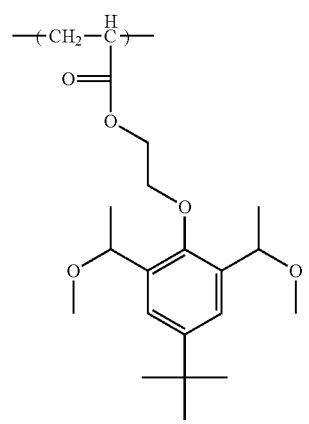
(Q-40) 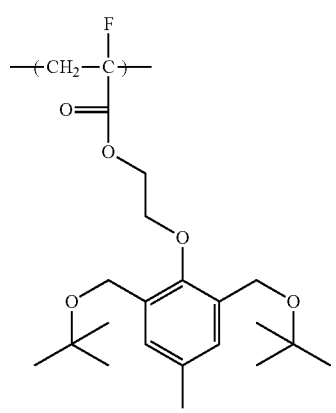
(Q-41) 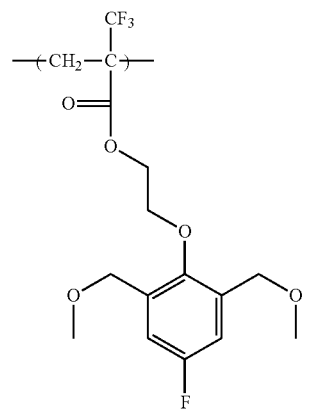
(Q-42) 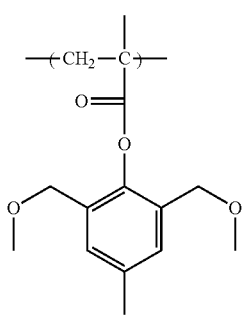
-continued
(Q-43) 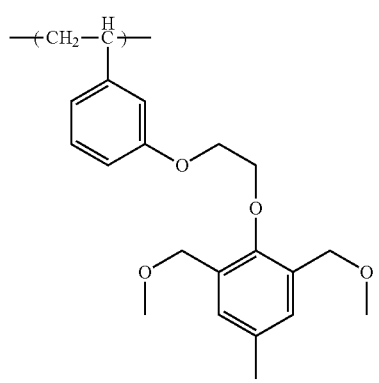
(Q-44) 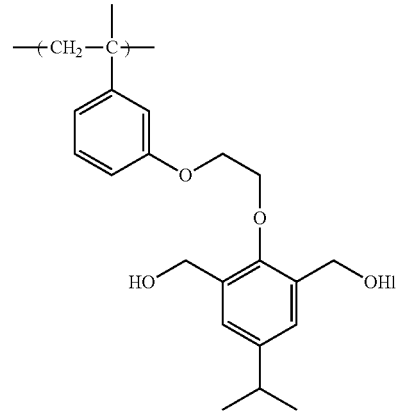
(Q-45) 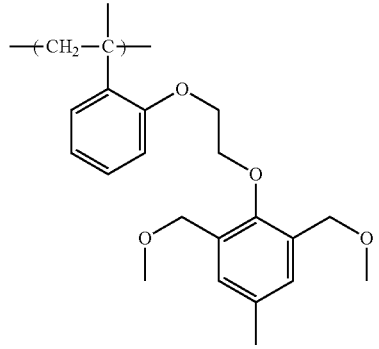
(Q-46) 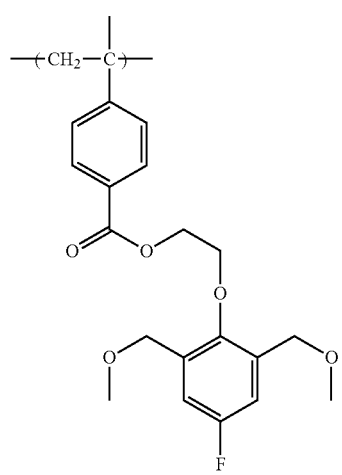

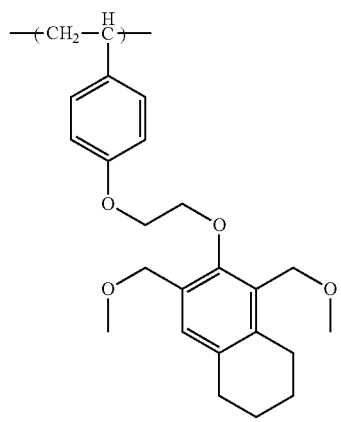 (Q-47)
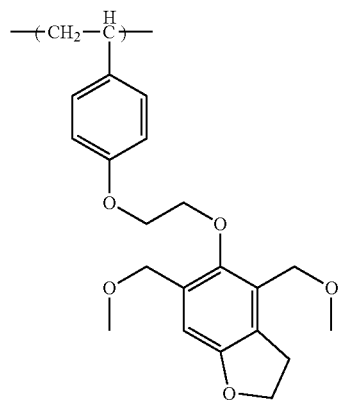 (Q-50)
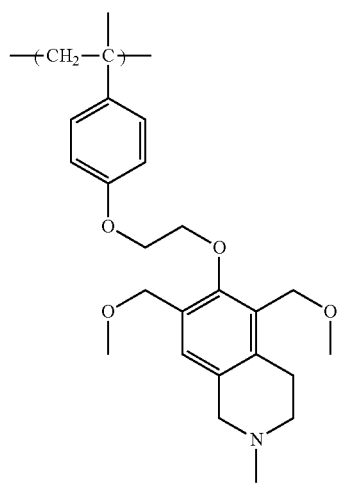 (Q-48)
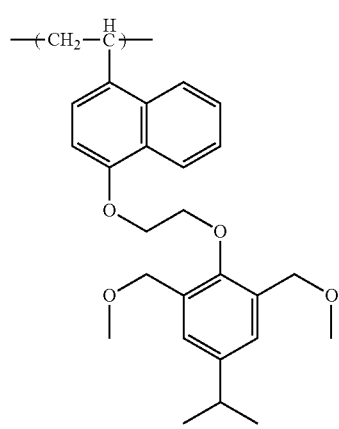 (Q-51)
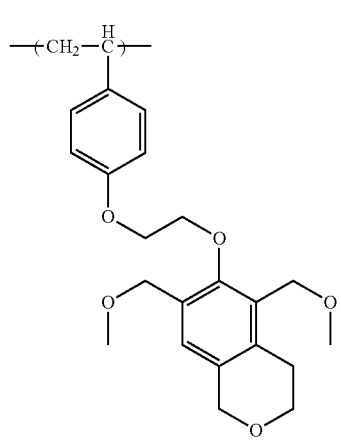 (Q-49)
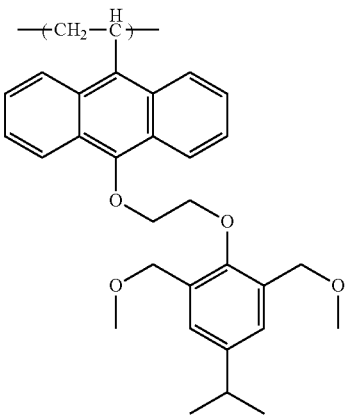 (Q-52)

(Q-53)
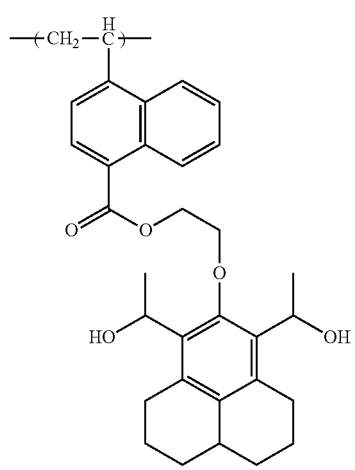
(Q-56)
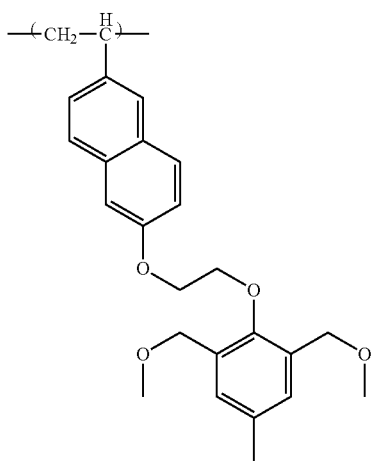
(Q-54)
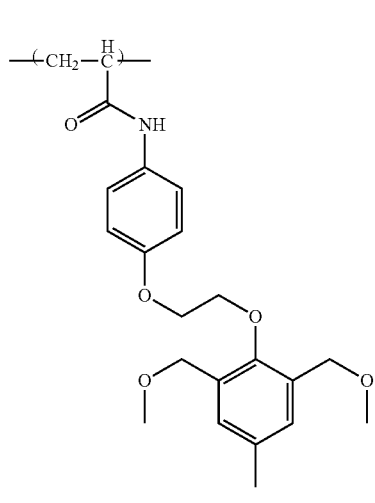
(Q-57)
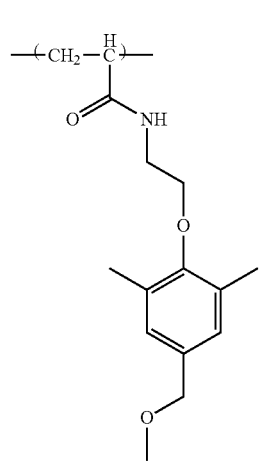
(Q-55)
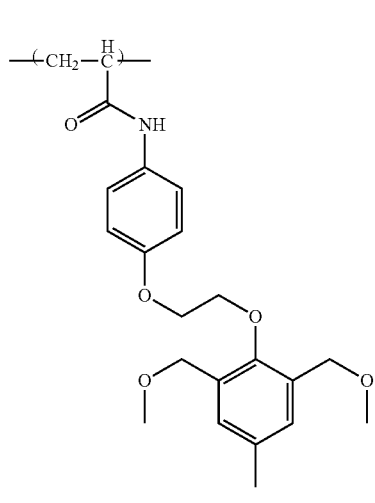
(Q-58)
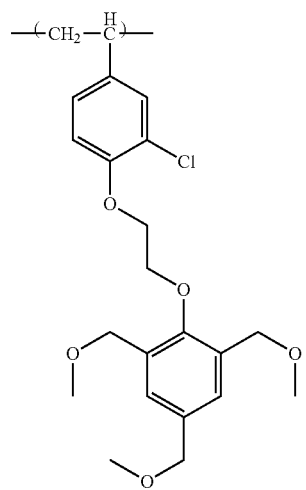

(Q-59)
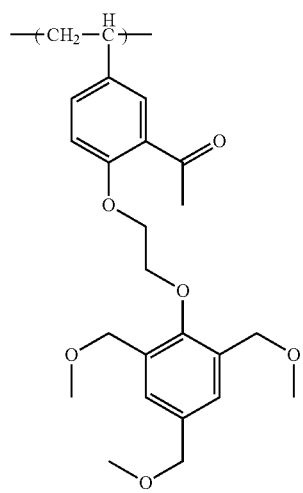
(Q-60)
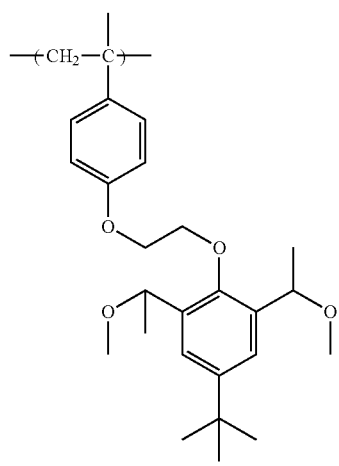
(Q-61)
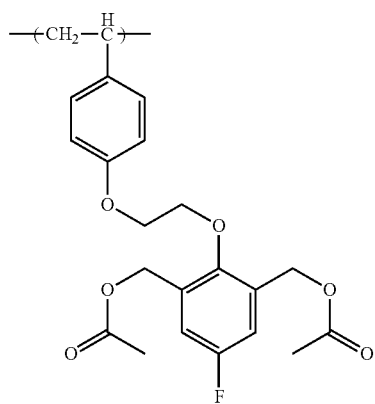
(Q-62)
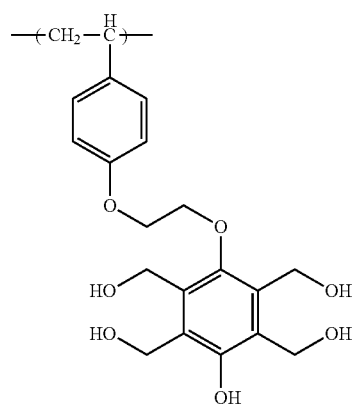
(Q-63)
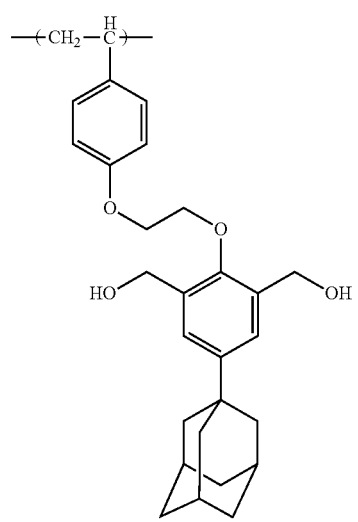
(Q-64)
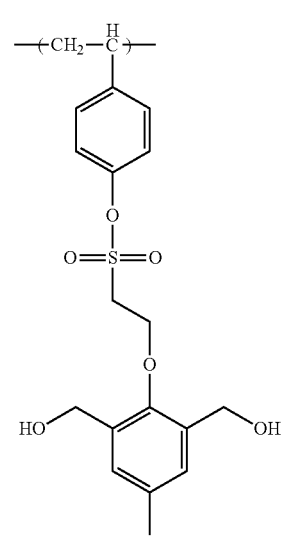

(Q-65)
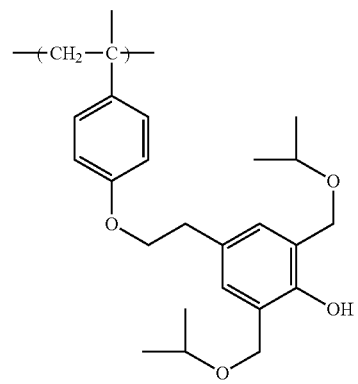
(Q-66)
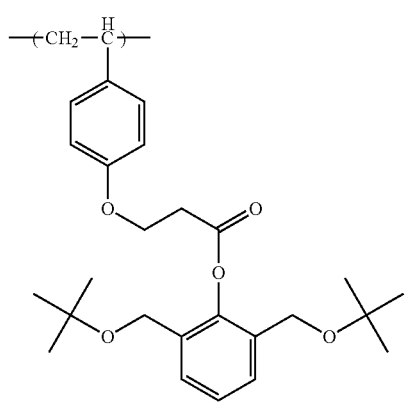
(Q-67)
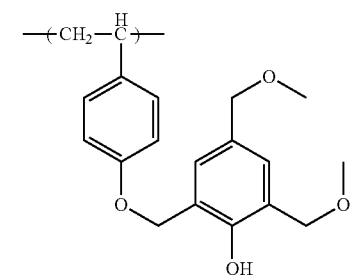
(Q-68)
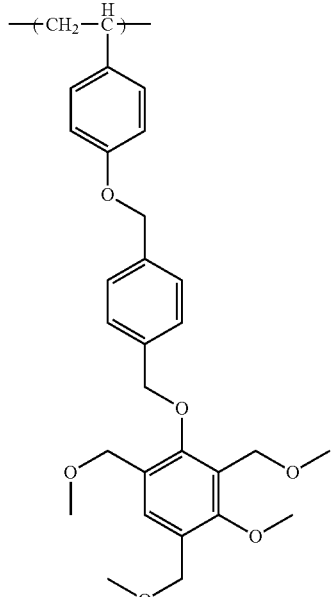
(Q-69)
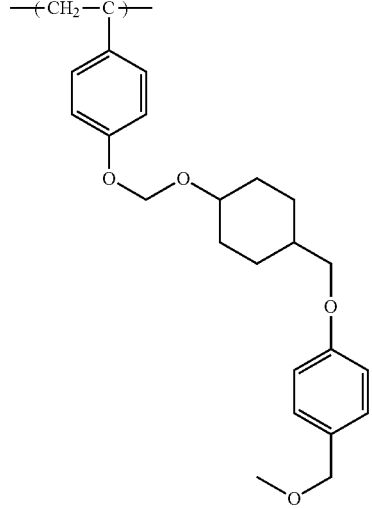
(Q-70)
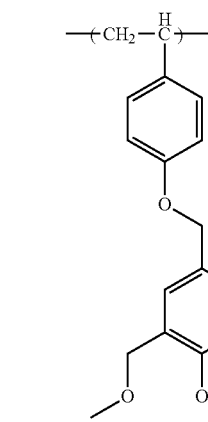

(Q-71)
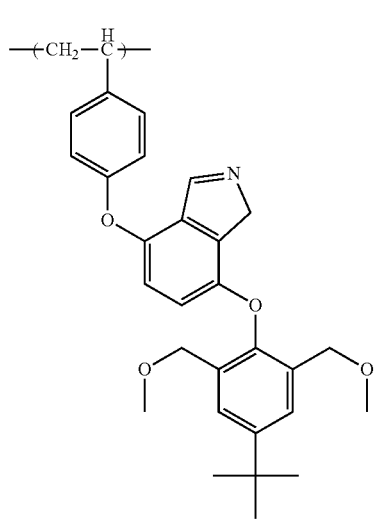
(Q-72)
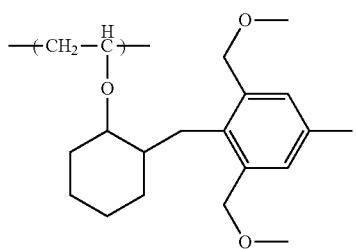
(Q-73)
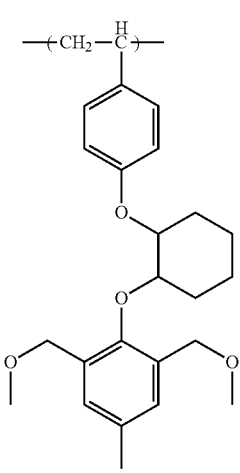
(Q-74)
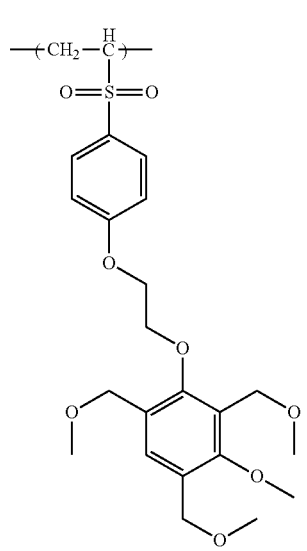
(Q-75)
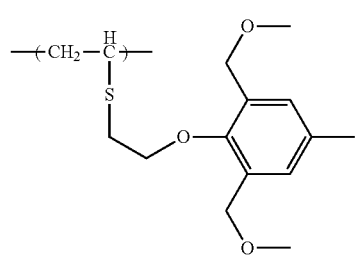
(Q-76)
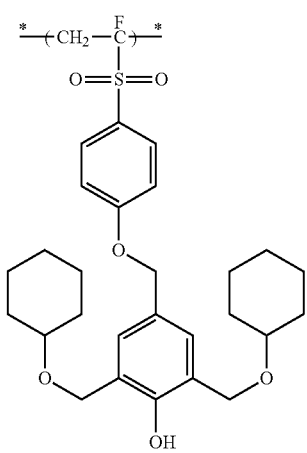
(Q-77)
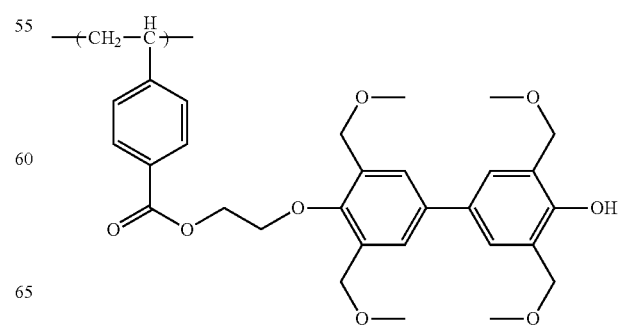

(Q-76)
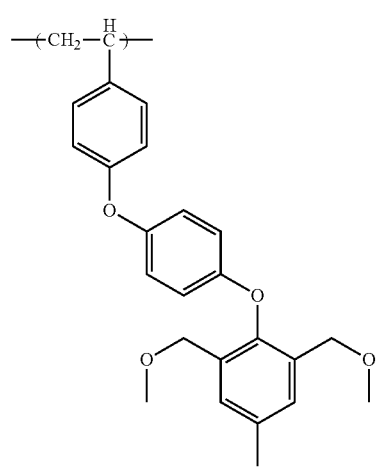
(Q-79)
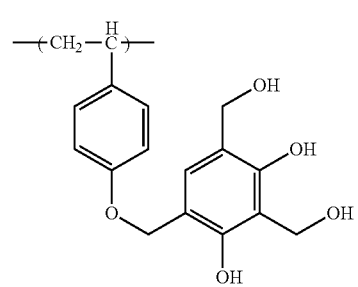
(Q-80)
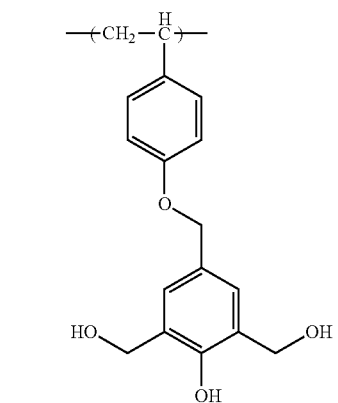
(Q-81)
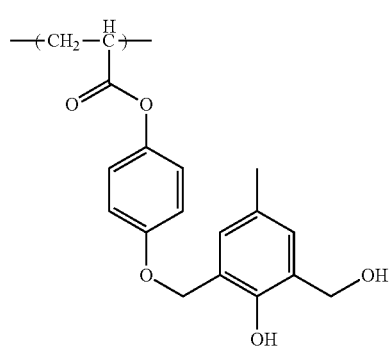
(Q-76)
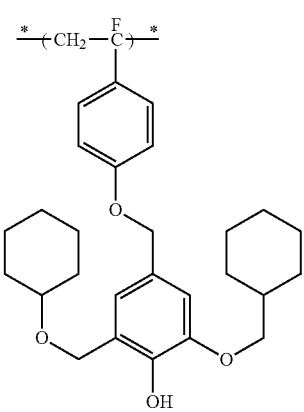
(Q-77)
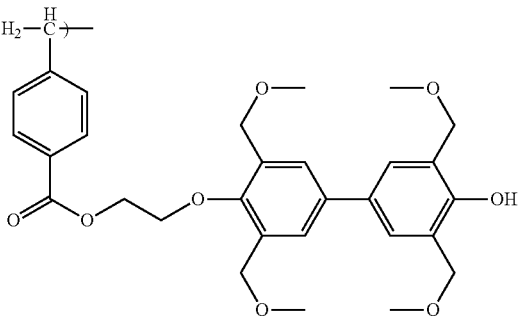
(Q-78)
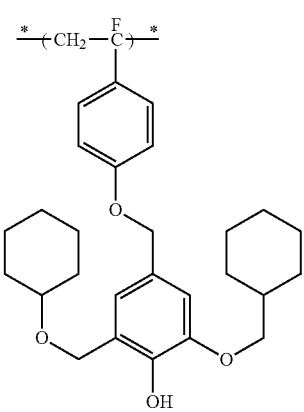
(Q-79)
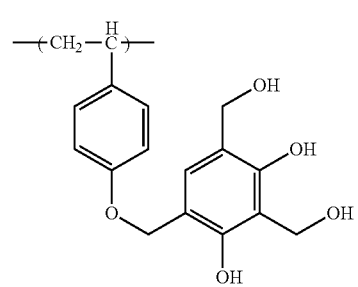

(Q-80) 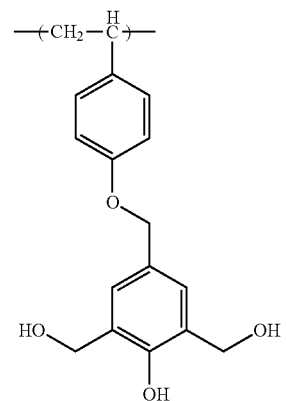
(Q-91) 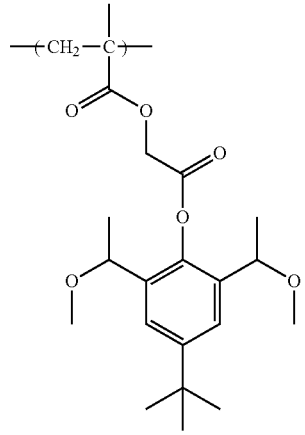
(Q-81) 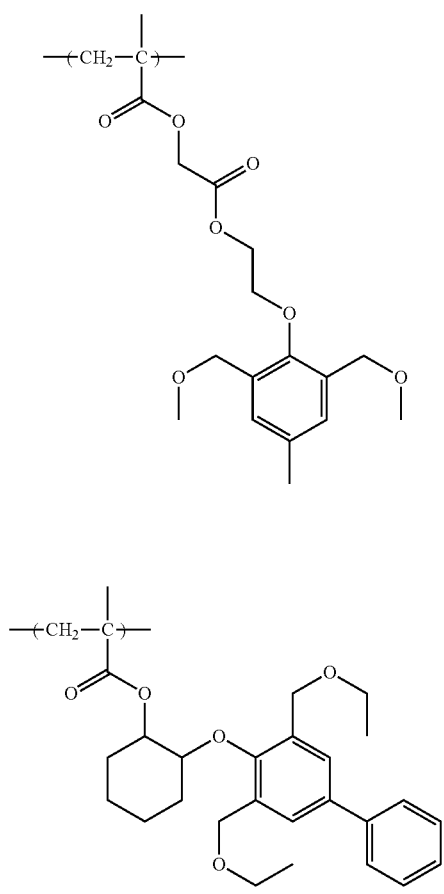
(Q-92) 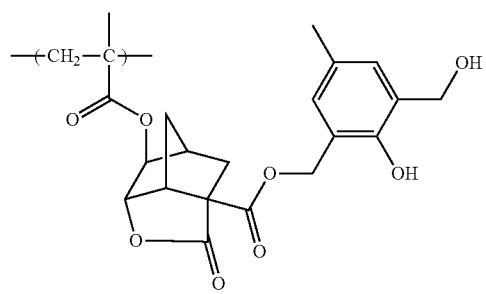
(Q-89)
(Q-93) 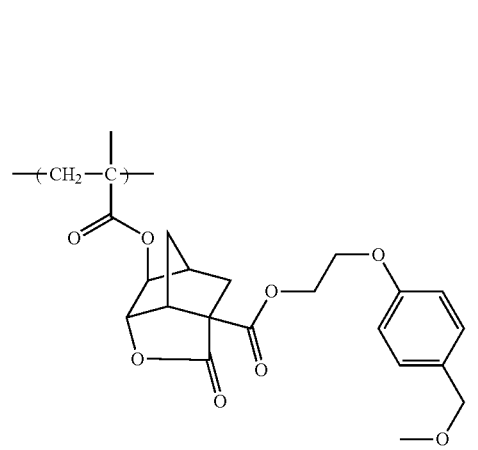
(Q-90)
(Q-94) 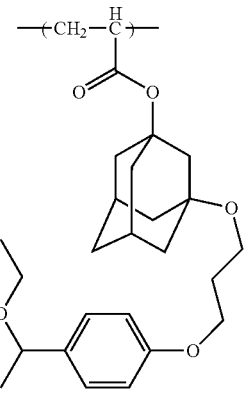

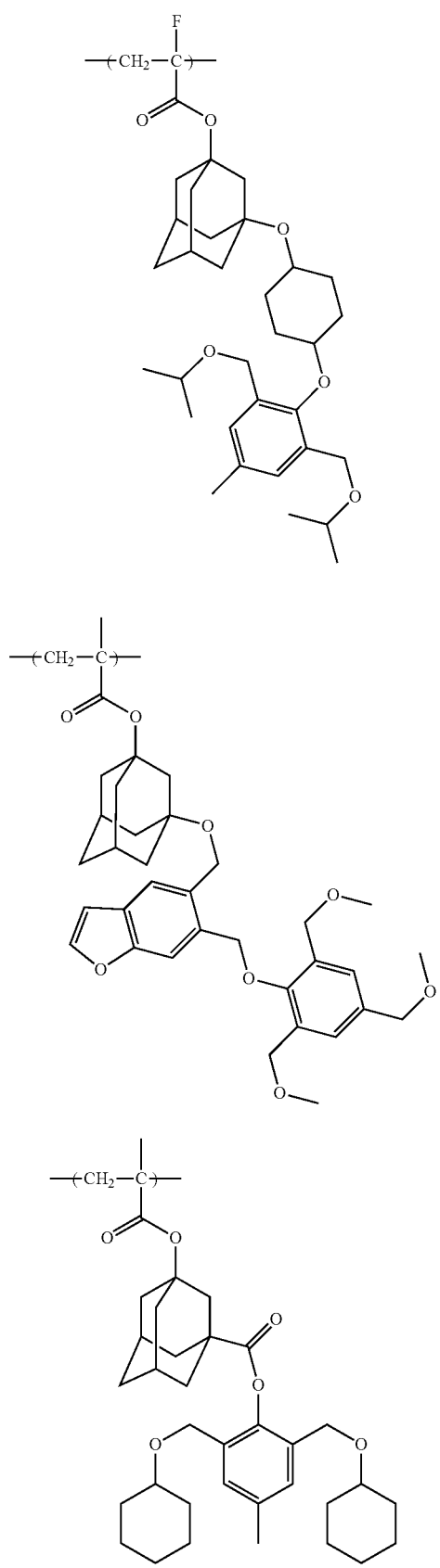
(Q-95)
(Q-96)
(Q-97)
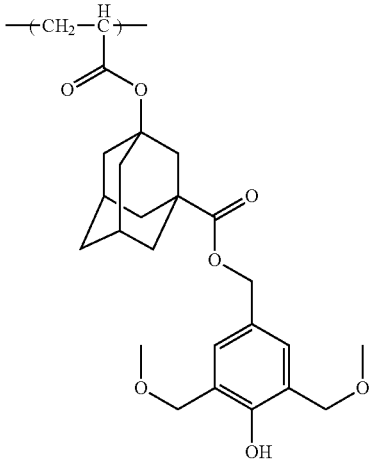
(Q-96)
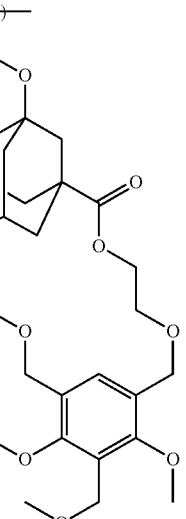
(Q-99)
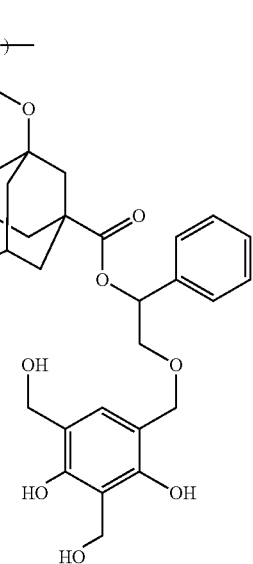
(Q-100)

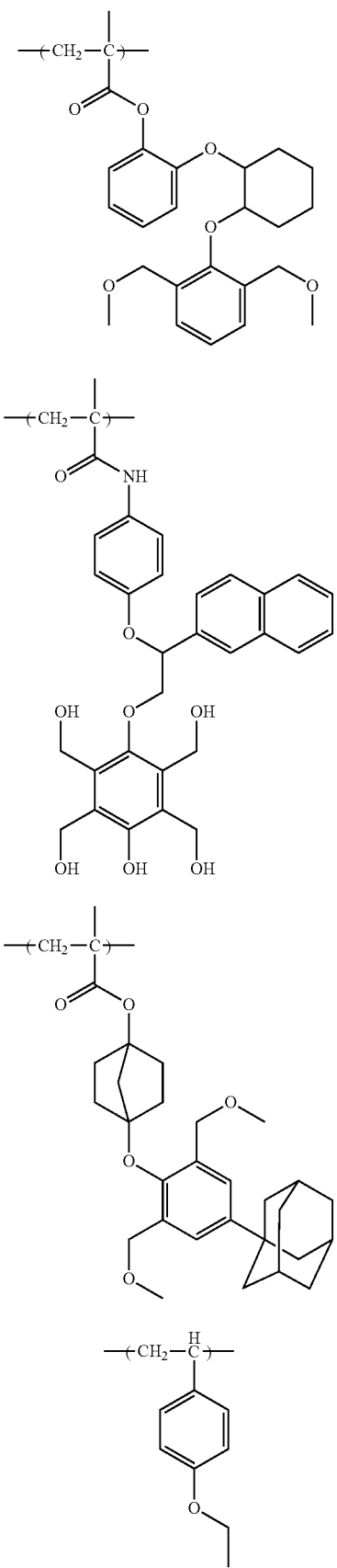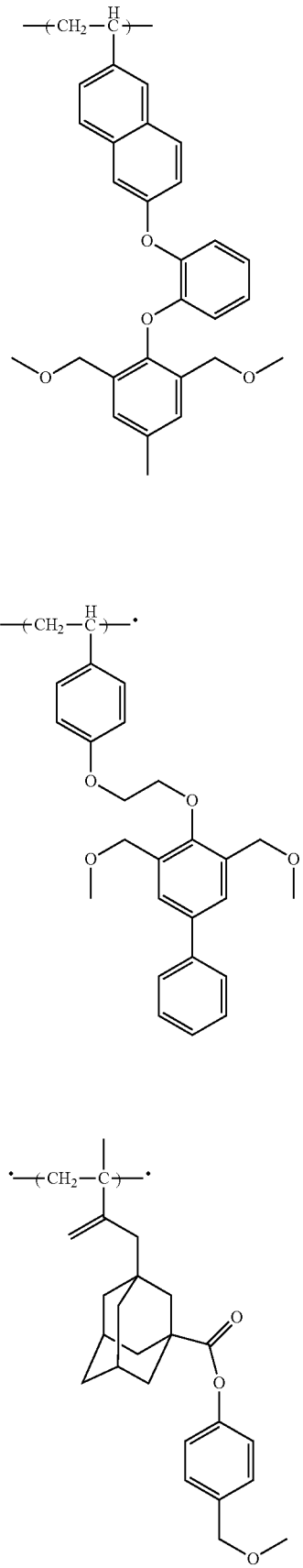

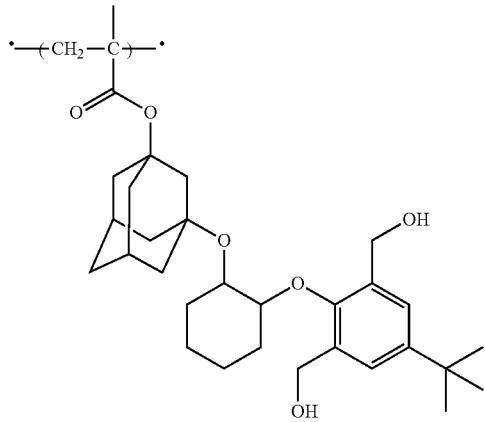
(A-108)

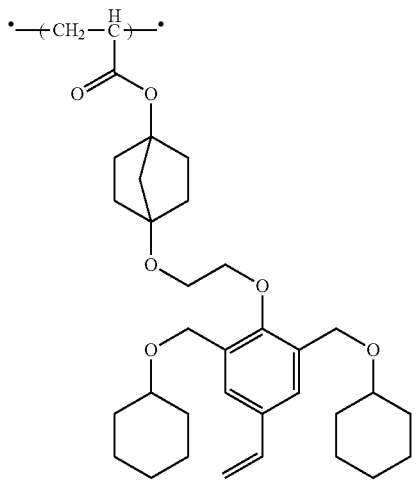
(A-111)

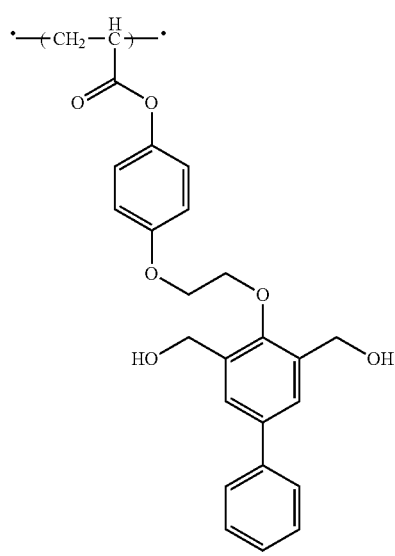
(A-109)

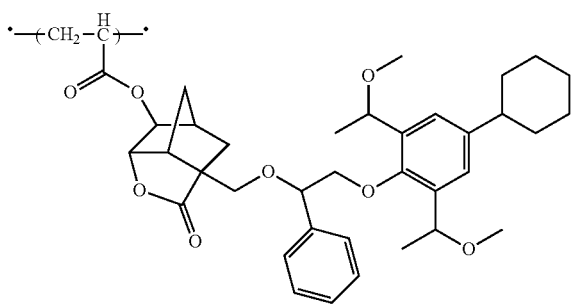
(A-110)

<Basic Compound (E)>

It is preferable that the composition of the present invention further includes a basic compound as an acid scavenger. The composition including a basic compound could suppress a deterioration due to a change over time from exposure to post-exposure baking. As the basic compound, an organic basic compound is preferable. More specific examples thereof include aliphatic amines, aromatic amines, heterocyclic amines, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, amide derivatives, and imide derivatives. Further, an amine oxide compound (described in JP2008-102383A) and an ammonium salt (preferably a hydroxide or a carboxylate; more specifically, tetraalkylammonium hydroxide, typically tetrabutylammonium hydroxide, is preferable from the viewpoint of LER) is also appropriately used.

Moreover, a compound whose basicity increases by the action of an acid can be used as one kind of basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethylaniline, tris(methoxyethoxyethyl)amine, the compounds set forth as examples in column 3, line 60 et seq. of U.S. Pat. No. 6,040,112A, 2-[2-{2-(2,2-dimethoxy-phenoxyethoxy)ethyl}-bis(2-methoxyethyl)]amine, and the compounds (C1-1) to (C3-3) set forth as examples in Section <0066> of US2007/0224539A1. Examples of the compounds having a nitrogen-containing heterocyclic structure include 2-phenylbenzimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]non-5-ene, 1,8-diazabicyclo[5.4.0]undec-7-ene, and tetrabutylammonium hydroxide.

Furthermore, it is preferable that the composition of the present invention includes a basic compound whose basicity decreases upon irradiation with actinic ray or radiation (hereinafter also referred to as a "photolytic basic compound"). A photolytic basic compound (compound that initially exhibits basicity since a basic nitrogen atom acts as a base but upon irradiation with actinic ray or radiation, is decomposed to generate an amphoteric ion compound containing a basic nitrogen atom and an organic acid moiety, these inducing an intramolecular neutralization to result in a decrease in or a loss of the basicity, for example, the onium salts described in JP3577743B, JP2001-215689A, JP2001-166476A, and JP2008-102383A), and a photobasicity generator (for example, the compound described in JP2010-243773A).

Among these basic compounds, an ammonium salt is preferable from the viewpoint of improvement of resolution.

In the present invention, the content of the basic compound is preferably 0.01% to 10% by mass, more preferably 0.03% to 5% by mass, and particularly preferably 0.05% to 3% by mass, with respect to the total solid content of the composition.

In one aspect, it is more preferable that the basic compound is an onium salt compound containing a nitrogen atom in a cation moiety thereof (hereinafter also referred to as a "compound (E)").

Examples of the onium salt compound include a diazonium salt compound, a phosphonium salt compound, a sulfonium salt compound, and an iodonium salt compound. Among these, a sulfonium salt compound or an iodonium salt compound is preferable, and a sulfonium salt compound is more preferable.

This onium salt compound typically includes a basic moiety containing a nitrogen atom in a cation moiety thereof. Here, the "basic moiety" refers to a site of the cation moiety of the compound (E) whose conjugate acid exhibits a pKa value of −3 or more. This pKa value is preferably in the range of −3 to 15, and more preferably 0 to 15. The pKa value refers to a value calculated by ACD/ChemSketch (ACD/Labs 8.00 Release Product Version: 8.08).

This basic moiety includes, for example, a structure selected from the group consisting of amino groups (each a group resulting from the removal of one hydrogen atom from ammonia, a primary amine, or a secondary amine; same hereinafter) and nitrogen-containing heterocyclic groups. The amino group is preferably an aliphatic amino group. The aliphatic amino group means a group resulting from the removal of one hydrogen atom from an aliphatic amine.

In this structure, it is preferable that all the atoms adjacent to a nitrogen atom contained in the structure are carbon atoms or hydrogen atoms from the viewpoint of basicity enhancement. Also, from the viewpoint of basicity enhancement, it is preferable that no electron withdrawing functional group (a carbonyl group, a sulfonyl group, a cyano group, a halogen atom, or the like) is directly bonded to the nitrogen atom.

The onium salt compound may include two or more of the above basic moieties.

In a case where the cation moiety of the compound (E) contains an amino group, it is preferable that the cation moiety includes a partial structure represented by the following General Formula (N-I).

(N-I)

In the formula, $R_A$ and $R_B$ each independently represent a hydrogen atom or an organic group.

X represents a single bond or a linking group.

At least two of $R_A$, $R_B$, and X may be bonded to each other to form a ring.

Examples of the organic group represented by $R_A$ or $R_B$ include an alkyl group, a cycloalkyl group, an alkenyl group, an aryl group, a heterocyclic hydrocarbon group, an alkoxycarbonyl group, a lactone group, and a sultone group.

These groups may have a substituent. Examples of the substituent include an alkyl group, a cycloalkyl group, an alkoxy group, an alkoxycarbonyl group, a carboxyl group, a halogen atom, a hydroxyl group, and a cyano group.

The alkyl group represented by $R_A$ or $R_B$ may be linear or branched. This alkyl group preferably has 1 to 50 carbon atoms, more preferably 1 to 30 carbon atoms, and still more preferably 1 to 20 carbon atoms. Examples of such an alkyl group include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, and a 2-ethylhexyl group.

The cycloalkyl group represented $R_A$ or $R_B$ may be monocyclic or polycyclic. Preferred examples of this cycloalkyl group include a monocycloalkyl group having 3 to 8 carbon atoms, such as a cyclopropyl group, a cyclopentyl group, and a cyclohexyl group.

The alkenyl group represented by $R_A$ or $R_B$ may be linear or branched. This alkenyl group preferably has 2 to 50 carbon atoms, more preferably 2 to 30 carbon atoms, and still more preferably 3 to 20 carbon atoms. Examples of such an alkenyl group include a vinyl group, an allyl group, and a styryl group.

The aryl group represented by $R_A$ or $R_B$ preferably has 6 to 14 carbon atoms. Examples of such a group include a phenyl group and a naphthyl group.

The heterocyclic hydrocarbon group represented $R_A$ or $R_B$ preferably has 5 to 20 carbon atoms, and more preferably 6 to 15 carbon atoms. The heterocyclic hydrocarbon group may be aromatic or non-aromatic, but the heterocyclic hydrocarbon group is preferably aromatic.

The heterocycle contained in this group may be monocyclic or polycyclic. Examples of such a heterocycle include an imidazole ring, a pyridine ring, a pyrazine ring, a pyrimidine ring, a pyridazine ring, a 2H-pyrrole ring, a 3H-indole ring, 1H-indazole ring, a purine ring, an isoquinoline ring, and a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isoxazole ring, and a benzothiazole ring.

The lactone group represented by $R_A$ or $R_B$ is, for example, a lactone group with a 5- to 7-membered ring, and may be a group resulting from fusion of a lactone group with a 5- to 7-membered ring with another cyclic structure such that a bicyclo structure or a spiro structure is formed.

The sultone group represented by $R_A$ or $R_B$ is, for example, a sultone group with a 5- to 7-membered ring, and may be a group resulting from fusion of a sultone group with a 5- to 7-membered ring with another cyclic structure such that a bicyclo structure or a spiro structure is formed.

Specifically, the groups having the structures shown below are preferable.

LC1-1 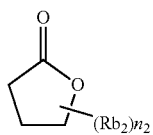
LC1-2 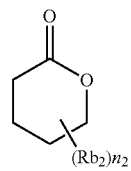
LC1-3 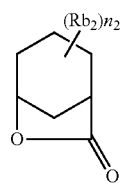
LC1-4 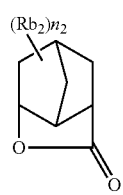
LC1-5 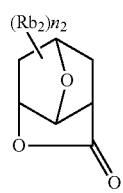
LC1-6 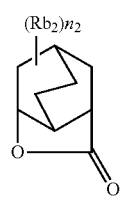
LC1-7 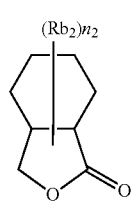
LC1-8 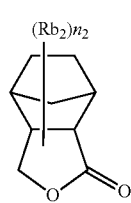
-continued
LC1-9 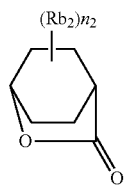
LC1-10 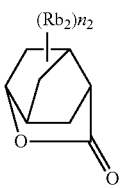
LC1-11 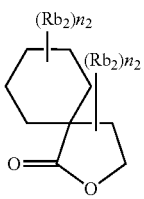
LC1-12 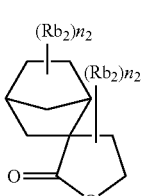
LC1-13 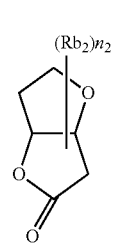
LC1-14 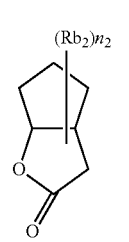
LC1-15 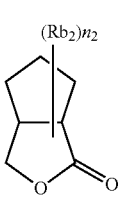
LC1-16 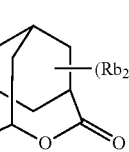

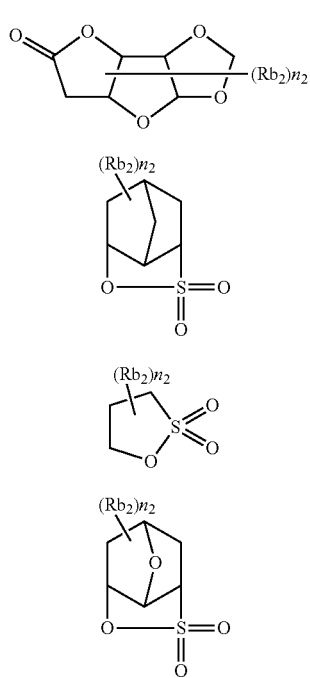

LC1-17

SL1-1

SL1-2

SL1-3

The lactone group and the sultone group may or may not each have a substituent (Rb$_2$). Preferred examples of the substituent (Rb$_2$) include the same substituents as those described above as R$_A$ and R$_B$. n$_2$ represents an integer of 0 to 4. When n$_2$ is 2 or more, the substituents (Rb$_2$) that are present in plural may be the same as or different from each other. Further, the substituents (Rb$_2$) that are present in plural may be bonded to each other to form a ring.

Examples of the linking group represented by X include a linear or branched alkylene group, a cycloalkylene group, an ether bond, an ester bond, an amide bond, a urethane bond, a urea bond, and a group formed by combination of two or more of these. X is preferably a single bond, an alkylene group, a group formed by combination of an alkylene group and an ether bond, or a group formed by combination of an alkylene group and an ester bond. The number of atoms constituting the linking group represented by X is preferably 20 or less, and more preferably 15 or less. Each of the linear or branched alkylene group and cycloalkylene group preferably has 8 or less carbon atoms, and may have a substituent. The substituent preferably has 8 or less carbon atoms. Examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms).

At least two of R$_A$, R$_B$, and X may be bonded to each other to form a ring. The number of carbon atoms constituting the ring is preferably 4 to 20, and the ring may be monocyclic or polycyclic. An oxygen atom, a sulfur atom, a nitrogen atom, an ester bond, an amide bond, or a carbonyl group may be contained in the ring.

In a case where the cation moiety of the compound (E) contains a nitrogen-containing heterocyclic group, the nitrogen-containing heterocyclic group may or may not have aromaticity. The nitrogen-containing heterocyclic group may be monocyclic or polycyclic. The nitrogen-containing heterocyclic group is preferably a group containing a piperidine ring, a morpholine ring, a pyridine ring, an imidazole ring, a pyrazine ring, a pyrrole ring, or a pyrimidine ring.

The onium salt compound (E) is preferably a compound represented by the following General Formula (N-II).

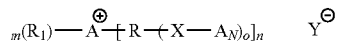

(N-II)

In the formula,

A represents a sulfur atom or an iodine atom.

R$_1$ represents a hydrogen atom or an organic group. In a case where a plurality of R$_1$'s are present, they may be the same as or different from each other.

R represents a (o+1)-valent organic group. In a case where a plurality of R's are present, they may be the same as or different from each other.

X represents a single bond or a linking group. In a case where a plurality of X's are present, they may be the same as or different from each other.

A$_N$ represents a basic moiety containing a nitrogen atom. In a case where a plurality of A$_N$'s are present, they may be the same as or different from each other.

In a case where A is a sulfur atom, n is an integer of 1 to 3 and m is an integer satisfying the relationship of m+n=3.

In a case where A is an iodine atom, n is 1 or 2, and m is an integer satisfying the relationship of m+n=2.

o is an integer of 1 to 10.

Y$^-$ represents an anion (details thereof are as described later as the anion moiety of the compound (E)).

At least two of R$_1$, X, R, and A$_N$ may be bonded to each other to form a ring.

Examples of the (o+1)-valent organic group represented by R include a (linear or branched) chained or cyclic aliphatic hydrocarbon group, a heterocyclic hydrocarbon group or an aromatic hydrocarbon group. An aromatic hydrocarbon group is preferable. In a case where R is an aromatic hydrocarbon group, it preferably bonded at the p-position (1,4-position) of the aromatic hydrocarbon group.

The linking group represented by X is the same as that represented by X of General Formula (N-I), and specific examples thereof are also the same.

The basic moiety represented by A$_N$ is the same as the "basic moiety" contained in the cation moiety of the compound (E) described above. For example, the basic moiety may include an amino group or a nitrogen-containing heterocyclic group. In a case where the basic moiety contains an amino group, examples of the amino group include an —N(R$_A$)(R$_B$) group in General Formula (N-I) described above.

Examples of the organic group represented by R$_1$ include an alkyl group, an alkenyl group, an alicyclic group, an aromatic hydrocarbon group, and a heterocyclic hydrocarbon group. In a case of m=2, two R$_1$'s may be bonded to each other to form a ring. These groups or rings may further include a substituent.

The alkyl group represented by R$_1$ may be linear or branched. This alkyl group preferably has 1 to 50 carbon atoms, more preferably 1 to 30 carbon atoms, and still more preferably 1 to 20 carbon atoms. Examples of such an alkyl group include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, and a 2-ethylhexyl group.

The alkenyl group represented by $R_1$ may be linear or branched. This alkenyl group preferably has 2 to 50 carbon atoms, more preferably 2 to 30 carbon atoms, and still more preferably 3 to 20 carbon atoms. Examples of such an alkenyl group include a vinyl group, an allyl group, and a styryl group.

The alicyclic group represented by $R_1$ is, for example, a cycloalkyl group. The cycloalkyl group may be monocyclic or polycyclic. Preferred examples of this alicyclic group include a monocycloalkyl group having 3 to 8 carbon atoms, such as a cyclopropyl group, a cyclopentyl group, and a cyclohexyl group.

The aromatic hydrocarbon group represented by $R_1$ preferably has 6 to 14 carbon atoms. Examples of such a group include an aryl group, such as a phenyl group and a naphthyl group. The aromatic hydrocarbon group represented by $R_1$ is preferably a phenyl group.

The heterocyclic hydrocarbon group represented by $R_1$ may have or may not have aromaticity. This heterocyclic hydrocarbon group preferably has aromaticity.

The heterocycle contained in this group may be monocyclic or polycyclic. Examples of the heterocycle include an imidazole ring, a pyridine ring, a pyrazine ring, a pyrimidine ring, a pyridazine ring, a 2H-pyrrole ring, a 3H-indole ring, 1H-indazole ring, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isoxazole ring, and a benzothiazole ring.

Preferably, $R_1$ is an aromatic hydrocarbon group, or two $R_1$'s are bonded to each other to form a ring.

The ring that may be formed by the mutual bonding of at least two of $R_1$, X, R, and $A_N$ is preferably a 4- to 7-membered ring, more preferably a 5- or 6-membered ring, and particularly preferably a 5-membered ring. Further, a heteroatom such as an oxygen atom, a sulfur atom, and a nitrogen atom may be contained in the skeleton of the ring.

In a case where the group represented by $R_1$ or the ring formed by the mutual bonding of two $R_1$'s further includes a substituent, examples of the substituent are as follows. That is, examples of the substituent include a halogen atom (—F, —Br, —Cl, or —I), a hydroxyl group, an alkoxy group, an aryloxy group, a mercapto group, an alkylthio group, an arylthio group, an amino group, an acyloxy group, a carbamoyloxy group, an alkylsulfoxy group, an arylsulfoxy group, an acylthio group, an acylamino group, a ureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, a carbamoyl group, an alkylsulfinyl group, an arylsulfinyl group, an alkylsulfonyl group, an arylsulfonyl group, a sulfo group (—SO$_3$H) or its conjugated base group (referred to as a sulfonato group), an alkoxysulfonyl group, an aryloxysulfonyl group, a sulfinamoyl group, a phosphono group (—PO$_3$H$_2$) or its conjugated base group (referred to as a phosphonato group), a phosphonooxy group (—OPO$_3$H$_2$), or its conjugated base group (referred to as a phosphonatooxy group), a cyano group, a nitro group, an aryl group, an alkenyl group, an alkynyl group, a heterocyclic group, a silyl group, and an alkyl group.

Among these substituents, a hydroxyl group, an alkoxy group, a cyano group, an aryl group, an alkenyl group, an alkynyl group, an alkyl group, and the like are preferable.

In General Formula (N-II), o is preferably an integer of 1 to 4, more preferably 1 or 2, and still more preferably 1.

With regard to the compound (E) represented by General Formula (N-II), in one aspect, it is preferable that at least one of n R's in the formula is an aromatic hydrocarbon group. Further, it is preferable that X in at least one of o —(X-$A_N$) groups bonded to at least one of the aromatic hydrocarbon groups is a linking group whose portion of bonding to the aromatic hydrocarbon group is a carbon atom.

That is, in compound (E) in this aspect, the basic moiety represented by $A_N$ is bonded via the carbon atom directly bonded to the aromatic hydrocarbon group represented by R to the aromatic hydrocarbon group.

The aromatic hydrocarbon group represented by R may contain a heterocycle as the aromatic ring in the aromatic hydrocarbon group. Further, the aromatic ring may be monocyclic or polycyclic.

The aromatic ring group preferably has 6 to 14 carbon atoms. Examples of the group include aryl groups such as a phenyl group, a naphthyl group, and an anthryl group. In a case where the aromatic ring group contains a heterocycle, examples of the heterocycle include a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

The aromatic hydrocarbon group represented by R is preferably a phenyl group or a naphthyl group, and particularly preferably a phenyl group.

The aromatic hydrocarbon group represented by R may further include a substituent other than a group represented by —(X-$A_N$) described later. As the substituent, for example, those enumerated above as a substituent in $R_1$ can be used.

Moreover, in this aspect, the linking group as X in at least one —(X-$A_N$) group to be used as a substituent in the aromatic ring R is not particularly limited as long as the binding site to the aromatic hydrocarbon group represented by R is a carbon atom. This linking group includes, for example, an alkylene group, a cycloalkylene group, an arylene group, —COO—, —CO—, or a combination of these. The linking group may contain a combination of each of these groups with at least one selected from the group consisting of —O—, —S—, —OCO—, —S(=O)—, —S(=O)$_2$—, —OS(=O)$_2$—, and —NR'—. Here, R' represents, for example, a hydrogen atom, an alkyl group, a cycloalkyl group, or an aryl group.

The alkylene group that can be included in the linking group represented by X may be linear or branched. The alkylene group preferably has 1 to 20 carbon atoms, and more preferably 1 to 10 carbon atoms. Examples of such an alkylene group include a methylene group, an ethylene group, a propylene group, and a butylene group.

The cycloalkylene group that can be contained in the linking group represented by X may be monocyclic or polycyclic. The cycloalkylene group preferably has 3 to 20 carbon atoms, and more preferably 3 to 10 carbon atoms. Examples of such a cycloalkylene group include a 1,4-cyclohexylene group.

The arylene group that can be contained in the linking group represented by X preferably has 6 to 20 carbon atoms, more preferably 6 to 10 carbon atoms. Examples of such an arylene group include a phenylene group and a naphthylene group.

It is preferable that at least one of X's is represented by the following General Formula (N-III) or (N-IV).

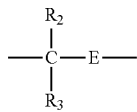
(N-III)

In the formula,

R$_2$ and R$_3$ each represent a hydrogen atom, an alkyl group, an alkenyl group, an alicyclic group, an aromatic hydrocarbon group, or a heterocyclic hydrocarbon group. R$_2$ and R$_3$ may be bonded to each other to form a ring. At least one of R$_2$ and R$_3$ may be bonded to E to form a ring.

E represents a linking group or a single bond.

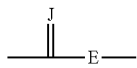
(N-IV)

In the formula,

J represents an oxygen atom or a sulfur atom.

E represents a linking group or a single bond.

Examples of each of the groups represented by R$_2$ and R$_3$, and the substituent which these groups may further include are the same as mentioned above, respectively, with regard to R$_1$. Each of the ring formed by the bonding of R$_2$ and R$_3$ and the ring formed by the bonding of at least one of R$_2$ or R$_3$ to E is preferably a 4- to 7-membered ring, and more preferably a 5- or 6-membered ring. It is preferable that R$_2$ and R$_3$ are each independently a hydrogen atom or an alkyl group.

The linking group represented by E includes, for example, an alkylene group, a cycloalkylene group, an arylene group, —COO—, —CO—, —O—, —S—, —OCO—, —S(=O)—, —S(=O)$_2$—, —OS(=O)$_2$—, —NR—, or a combination of these. Here, R represents, for example, a hydrogen atom, an alkyl group, a cycloalkyl group, or an aryl group.

It is preferable that the linking group represented by E is at least one selected from the group consisting of an alkylene bond, an ester bond, an ether bond, a thioether bond, a urethane bond, (a group represented by

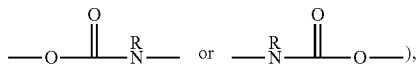), a urea bond (a group represented by

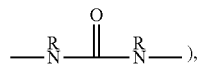), an amide bond, and a sulfonamide bond. The linking group represented by E is more preferably an alkylene bond, an ester bond, or an ether bond.

Furthermore, the compound (E) may be a compound comprising a plurality of moieties each containing a nitrogen atom. For example, the compound (E) may be a compound having the structure represented by General Formula (N-II) in which at least one of R$_1$'s is represented by General Formula (N-I).

In one aspect, the compound (E) represented by General Formula (N-II) is represented by the following General Formula (N-V).

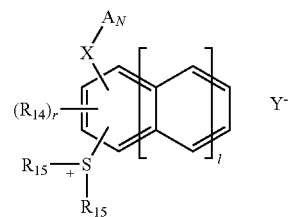
(N-V)

In the formula, X, A$_N$, and Y$^-$ have the same definitions as the respective groups in General Formula (N-II), and specific examples and preferred examples thereof are also the same.

R$_{14}$, R$_{15}$, r, and l have the same definitions as the respective groups and indexes in General Formula (ZI-4), which show one aspect of a photoacid generator, and specific examples and preferred examples thereof are also the same.

Furthermore, in one aspect, the compound (E) represented by General Formula (N-II) is represented by the following General Formula (N-VI).

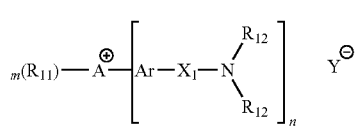
(N-VI)

In General Formula (N-VI),

A represents a sulfur atom or an iodine atom.

R$_{11}$'s each independently represent an alkyl group, an alkenyl group, an alicyclic group, an aromatic hydrocarbon group, or a heterocyclic hydrocarbon group. In a case of m=2, two R$_{11}$'s may be bonded to each other to form a ring.

Ar's each independently represent a aromatic hydrocarbon group.

X$_1$'s each independently represent a divalent linking group.

R$_{12}$'s each independently represent a hydrogen atom or an organic group.

In a case where A is a sulfur atom, m is an integer of 1 to 3 and n is an integer satisfying the relationship of m+n=3.

In a case where A is an iodine atom, m is an integer of 1 or 2 and n is an integer satisfying the relationship of m+n=2.

Y$^-$ represents an anion (details thereof are as described later as the anion moiety of the compound (E)).

Specific examples and preferred examples of the alkyl group, the alkenyl group, the alicyclic group, the aromatic hydrocarbon group, and the heterocyclic hydrocarbon group as R$_{11}$ are the same as the specific examples and the preferred examples as the alkyl group, the alkenyl group, the alicyclic group, the aromatic hydrocarbon group, and the heterocyclic hydrocarbon group as R$_1$ in General Formula (N-II), respectively.

Specific examples and preferred examples of the aromatic hydrocarbon group as Ar are the same as the specific examples and the preferred examples of the aromatic hydrocarbon group as R in General Formula (N-II).

Specific examples and preferred examples of the divalent linking group as $X_1$ are the same as the specific examples and the preferred examples of the divalent linking group as X in General Formula (N-II).

Specific examples and preferred examples of the organic group as $R_{12}$ are the same as the specific examples and the preferred examples as $R_A$ and $R_B$ in General Formula (N-I), respectively.

An aspect in which X is an alkylene group (for example, a methylene group) and in which two $R_{12}$'s are bonded to each other to form a ring is particularly preferable from the viewpoint of dependence on post-exposure heating (PEB) temperature and post-exposure line width (PED) stability.

The anion moiety of the compound (E) is not particularly limited. It is preferable that the anion contained in the compound (E) is a non-nucleophilic anion. Here, the non-nucleophilic anion refers to an anion whose capability of inducing a nucleophilic reaction is markedly low, which anion is capable of suppressing any decomposition over time by an intramolecular nucleophilic reaction. Thus, the temporal stability of the composition according to the present invention is improved.

Examples of the non-nucleophilic anion include a sulfonate anion, a carboxylate anion, a sulfonylimide anion, a bis(alkylsulfonyl)imide anion, and a tris(alkylsulfonyl)methyl anion.

Examples of the sulfonate anion include an aliphatic sulfonate anion, an aromatic sulfonate anion, and a camphor sulfonate anion.

Examples of the carboxylate anion include an aliphatic carboxylate anion, an aromatic carboxylate anion, and an aralkyl carboxylate anion.

The aliphatic moiety in the aliphatic sulfonate anion may be an alkyl group or a cycloalkyl group, and is preferably an alkyl group having 1 to 30 carbon atoms or a cycloalkyl group having 3 to 30 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

Preferred examples of the aromatic group in the aromatic sulfonate anion include an aryl group having 6 to 14 carbon atoms, such as a phenyl group, a tolyl group, and a naphthyl group.

The alkyl group, the cycloalkyl group, and the aryl group in the aliphatic sulfonate anion and the aromatic sulfonate anion may each have a substituent. Examples of the substituent that can be contained in the alkyl group, the cycloalkyl group, and the aryl group in the aliphatic sulfonate anion and the aromatic sulfonate anion include a nitro group, a halogen atom (a fluorine atom, a chlorine atom, bromine atom, or an iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). With regard to the aryl group or the cyclic structure of each of these groups, examples of the substituent include an alkyl group (preferably having 1 to 15 carbon atoms).

Examples of the aliphatic moiety in the aliphatic carboxylate anion include the same alkyl groups and cycloalkyl groups with regard to the aliphatic sulfonate anion.

Examples of the aromatic group in the aromatic carboxylate anion include the same aryl groups with regard to the aromatic sulfonate anion.

Preferred examples of the aralkyl group in the aralkyl carboxylate anion include an aralkyl group having 6 to 12 carbon atoms, for example, a benzyl group, a phenethyl group, a naphthylmethyl group, a naphthylethyl group, and a naphthylbutyl group.

The alkyl group, the cycloalkyl group, the aryl group, and the aralkyl group in the aliphatic carboxylate anion, the aromatic carboxylate anion, and the aralkyl carboxylate anion may each have a substituent. Examples of the substituent which can be included in the alkyl group, the cycloalkyl group, the aryl group, and the aralkyl group in the aliphatic carboxylate anion, the aromatic carboxylate anion, and the aralkyl carboxylate anion include the same halogen atoms, alkyl groups, cycloalkyl groups, alkoxy groups, alkylthio groups, and the like with regard to the aromatic sulfonate anion.

Examples of the sulfonylimide anion include a saccharin anion.

The alkyl group in the bis(alkylsulfonyl)imide anion and the tris(alkylsulfonyl)methyl anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, and a neopentyl group. Examples of the substituent of these alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group. An alkyl group substituted with a fluorine atom is preferable. In a preferred aspect, two alkyl groups in the bis(alkylsulfonyl)imide anion are bonded to each other to form a cyclic structure. In that instance, the formed cyclic structure is preferably a 5- to 7-membered ring.

Examples of other non-nucleophilic anions include phosphorus fluoride, boron fluoride, and antimony fluoride.

The non-nucleophilic anion is preferably an aliphatic sulfonate anion substituted at its α-position of sulfonic acid with a fluorine atom, an aromatic sulfonate anion substituted with a fluorine atom or a group containing a fluorine atom, a bis(alkylsulfonyl)imide anion whose alkyl group is substituted with a fluorine atom or a tris(alkylsulfonyl)methide anion whose alkyl group is substituted with a fluorine atom. More preferably, the non-nucleophilic anion is a perfluorinated aliphatic sulfonate anion having 4 to 8 carbon atoms or a benzenesulfonate anion containing a fluorine atom. Still more preferably, the non-nucleophilic anion is a nonafluorobutanesulfonate anion, a perfluorooctanesulfonate anion, a pentafluorobenzenesulfonate anion, or a 3,5-bis(trifluoromethyl)benzenesulfonate anion.

Moreover, the non-nucleophilic anion is preferably represented by, for example, the following General Formula (LD1).

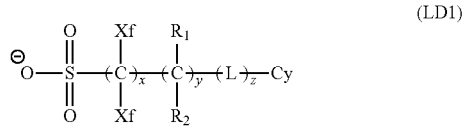

In the formula,

Xf's each independently represent a fluorine atom or an alkyl group substituted with at least one fluorine atom.

$R_1$ and $R_2$ each independently represent a hydrogen atom, a fluorine atom or an alkyl group.

L's each independently represent a divalent linking group.

Cy represents a cyclic organic group.

x is an integer of 1 to 20.

y is an integer of 0 to 10.

z is an integer of 0 to 10.

Xf represents a fluorine atom or an alkyl group substituted with at least one fluorine atom. This alkyl group preferably has 1 to 10 carbon atoms, and more preferably 1 to 4 carbon atoms. The alkyl group substituted with at least one fluorine atom is preferably a perfluoroalkyl group.

Xf is preferably a fluorine atom or a perfluoroalkyl group having 1 to 4 carbon atoms. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$.

$R_1$ and $R_2$ each independently represent a hydrogen atom, a fluorine atom or an alkyl group. A substituent (preferably a fluorine atom) may be introduced in this alkyl group. The alkyl group preferably has 1 to 4 carbon atoms. More preferably, $R_1$ and $R_2$ are each a perfluoroalkyl group having 1 to 4 carbon atoms. Specific examples of the alkyl groups with a substituent, represented by $R_1$ and $R_2$, include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

L represents a divalent linking group. Examples of the divalent linking group include —COO—, —OCO—, —CONH—, —CO—, —O—, —S—, —SO—, —$SO_2$—, an alkylene group, a cycloalkylene group, and an alkenylene group. Among these, —CONH—, —CO—, or —$SO_2$— is preferable, and —CONH— or —$SO_2$— is more preferable.

Cy represents a cyclic organic group. Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, and an adamantyl group is preferable from the viewpoints of inhibiting diffusivity into the film during post-exposure heating (PEB) process and improving Mask Error Enhancement Factor (MEEF).

The aryl group may be monocyclic or polycyclic. Examples of the aryl group include a phenyl group, a naphthyl group, a phenanthryl group, and an anthryl group. Among these, a naphthyl group having a relatively low light absorbance at 193 nm is preferable.

The heterocyclic group may be monocyclic or polycyclic, but the heterocyclic group which is polycyclic can further suppress acid diffusion. Further, the heterocyclic group may or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having no aromaticity include a tetrahydropyran ring, a lactone ring, a sultone ring, and a decahydroisoquinoline ring. As a heterocycle in the heterocyclic group, a furan ring, a thiophene ring, a pyridine ring, or a decahydroisoquinoline ring is particularly preferable. In addition, examples of the lactone ring include the lactone structures exemplified with regard to $R_A$ and $R_B$ in General Formula (N-I).

The cyclic organic group may have a substituent. Examples of the substituent include an alkyl group, a cycloalkyl group, an aryl group, a hydroxyl group, an alkoxy group, an ester group, an amido group, a urethane group, a ureido group, a thioether group, a sulfonamido group, and a sulfonic acid ester group. The alkyl group may be linear or branched. Further, the alkyl group preferably has 1 to 12 carbon atoms. The cycloalkyl group may be monocyclic or polycyclic. Further, the cycloalkyl group preferably has 3 to 12 carbon atoms. The aryl group preferably has 6 to 14 carbon atoms.

x is preferably 1 to 8, and among these, it is more preferably 1 to 4, and particularly preferably 1. y is preferably 0 to 4, and more preferably 0. z is preferably 0 to 8, and among these, it is more preferably 0 to 4.

Moreover, the non-nucleophilic anion is preferably represented by, for example, the following General Formula (LD2).

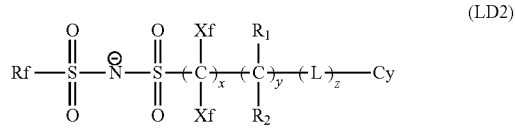

In General Formula (LD2), Xf, $R_1$, $R_2$, L, Cy, x, y, and z have the same definitions as the respective groups in General Formula (LD1). Rf is a group containing a fluorine atom.

Examples of the group containing a fluorine atom represented by Rf include an alkyl group containing at least one fluorine atom, a cycloalkyl group containing at least one fluorine atom, and an aryl group containing at least one fluorine atom.

These alkyl group, cycloalkyl group, and aryl group may be substituted with a fluorine atom, or may be substituted with another substituent containing a fluorine atom. In a case where Rf is a cycloalkyl group containing at least one fluorine atom or an aryl group containing at least one fluorine atom, examples of such other substituents containing a fluorine atom include an alkyl group substituted with at least one fluorine atom.

Furthermore, these alkyl group, cycloalkyl group, and aryl group may further be substituted with a substituent containing no fluorine atom. Examples of this substituent include any of those mentioned above with respect to Cy in which no fluorine atom is contained.

Examples of the alkyl group containing at least one fluorine atom represented by Rf include the same groups as those described above as the alkyl group substituted with at least one fluorine atom, represented by Xf. Examples of the cycloalkyl group containing at least one fluorine atom represented by Rf include a perfluorocyclopentyl group and a perfluorocyclohexyl group. Examples of the aryl group containing at least one fluorine atom represented by Rf include a perfluorophenyl group.

Examples of a preferred aspect of the anion moiety of the compound (E) include the structures exemplified as the preferred anion structure of a photoacid generator, other than the structures represented by General Formulae (LD1) and (LD2).

Furthermore, in the compound (E), the fluorine content represented by (sum of the masses of all fluorine atoms contained in the compound)/(sum of the masses of all atoms contained in the compound) is preferably 0.30 or less, more preferably 0.25 or less, still more preferably 0.20 or less, particularly preferably 0.15 or less, and most preferably 0.10 or less.

Specific examples of the compound (E) are shown below, but are not limited thereto.

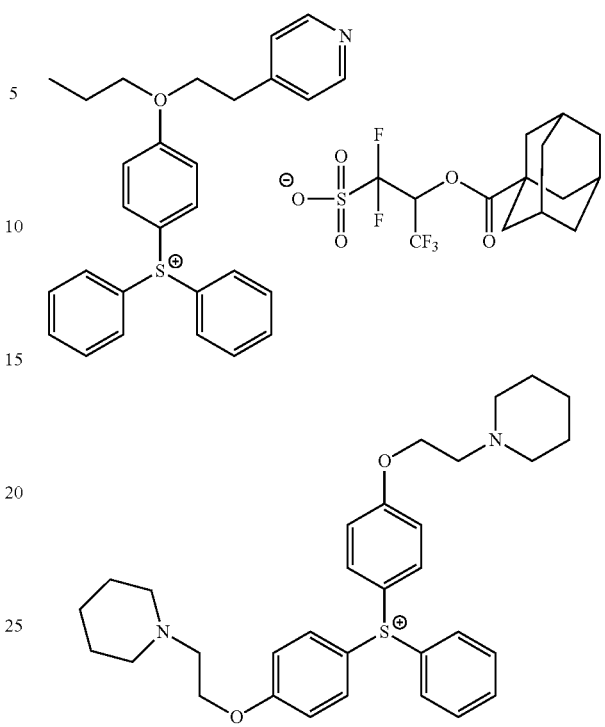

-continued

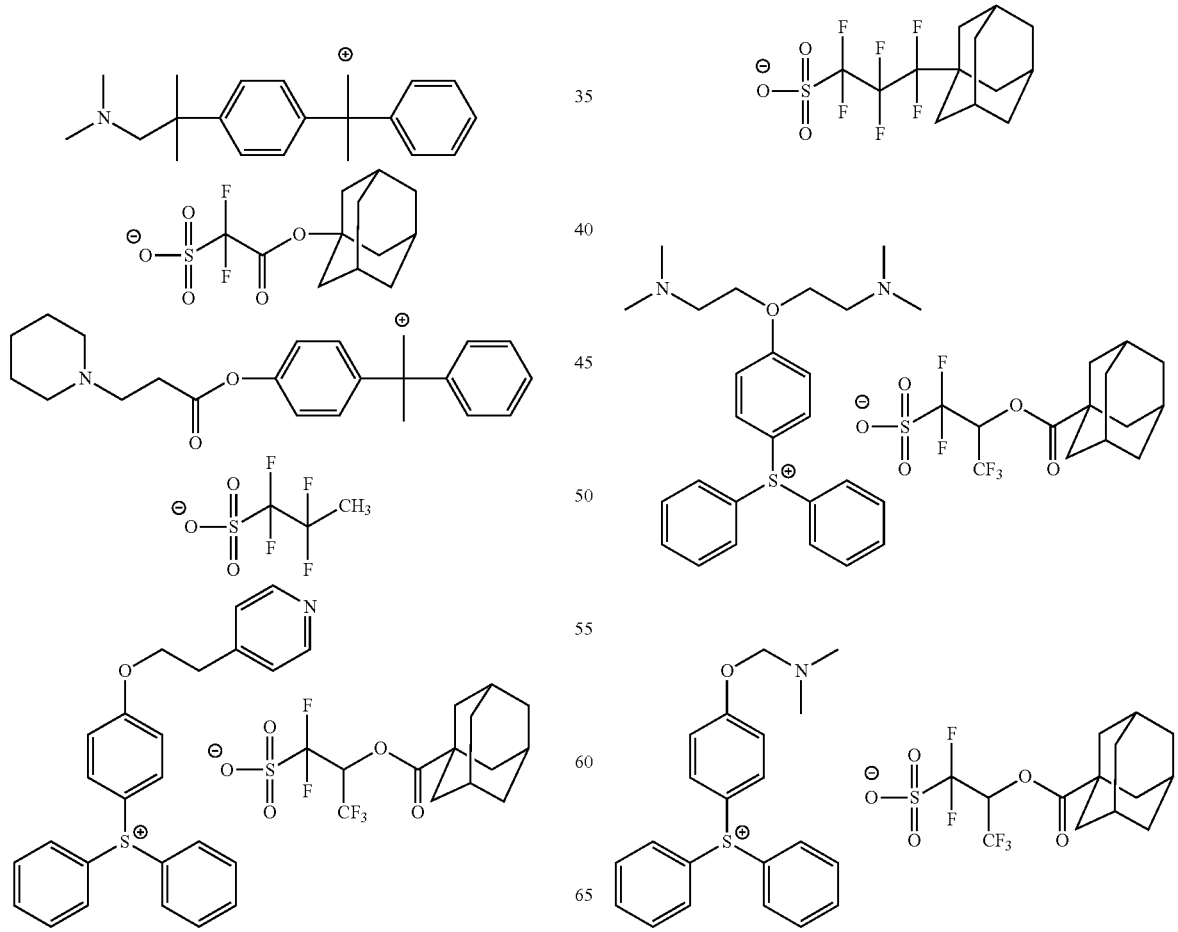

113
-continued
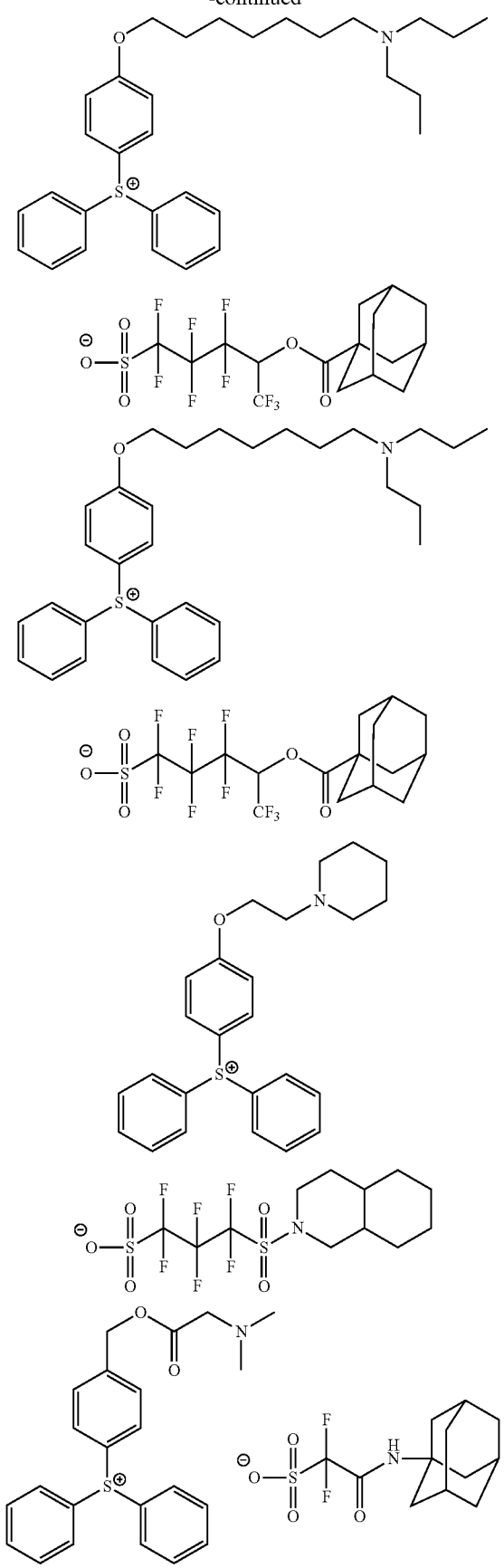
114
-continued
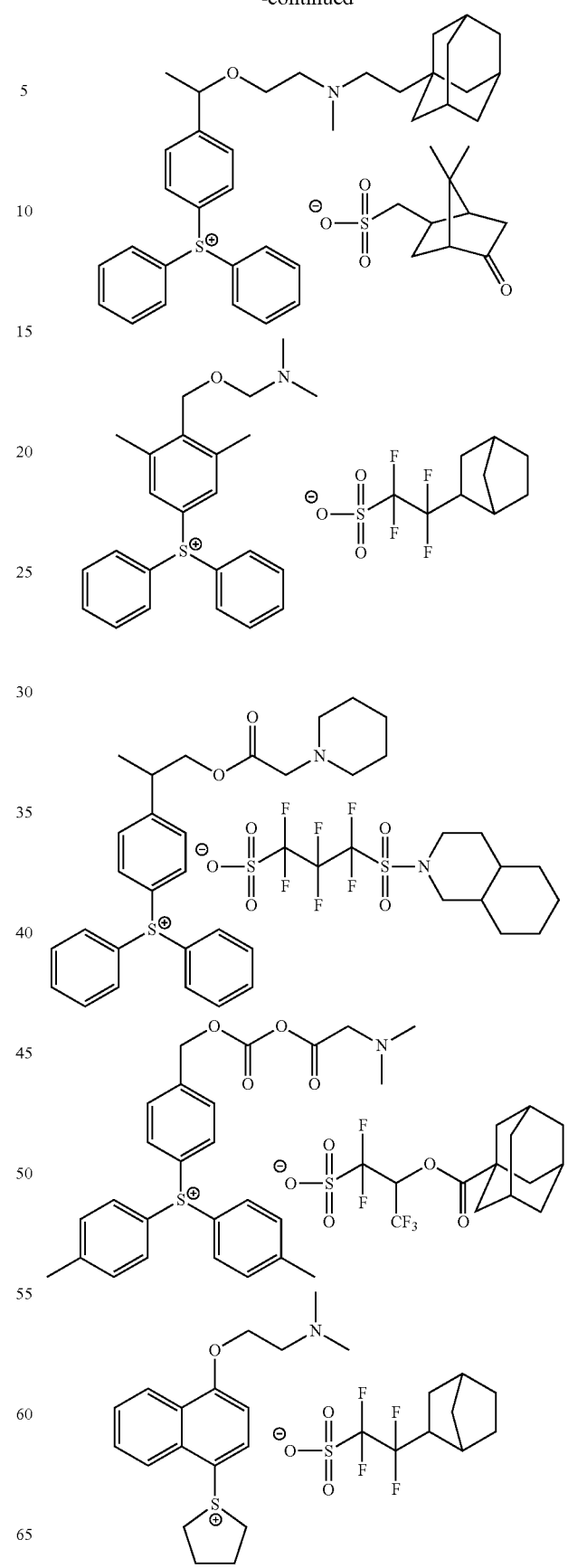

115
-continued
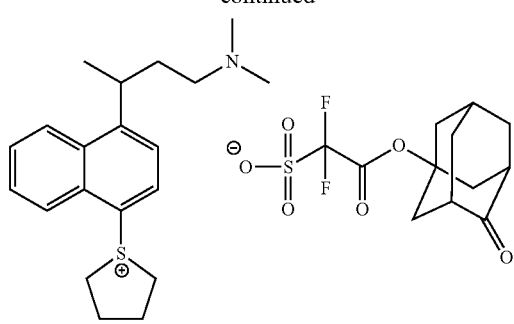
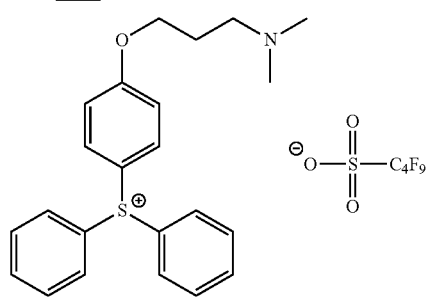
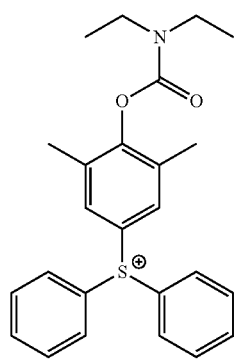
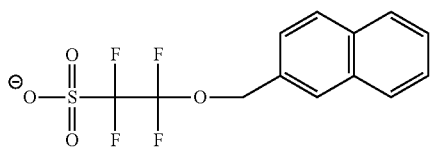
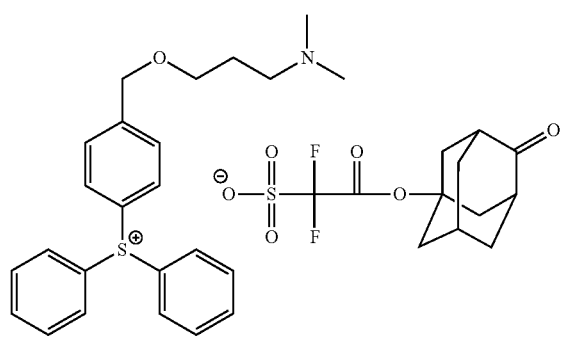
116
-continued
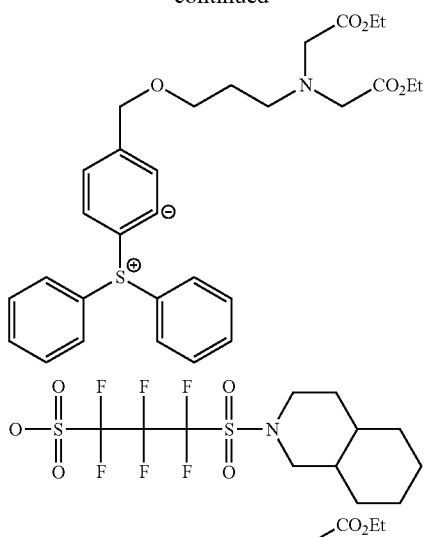
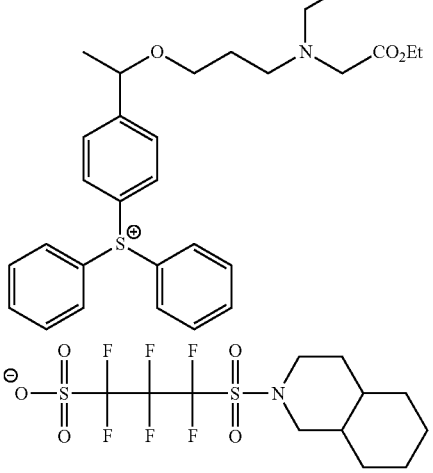
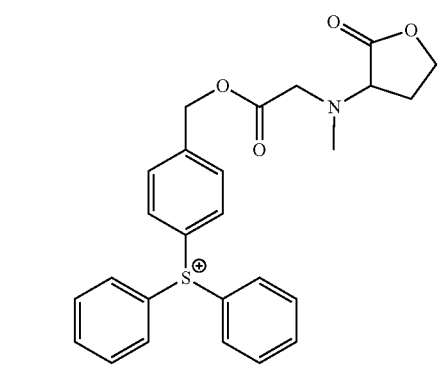

117
-continued
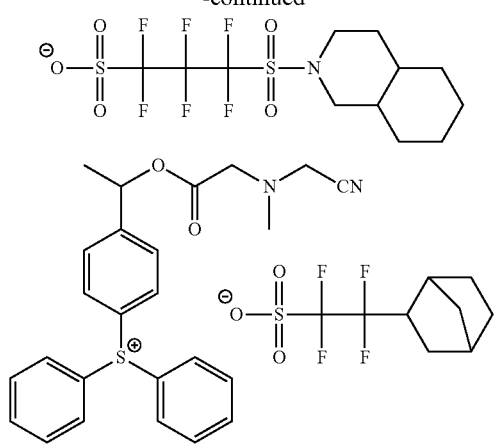
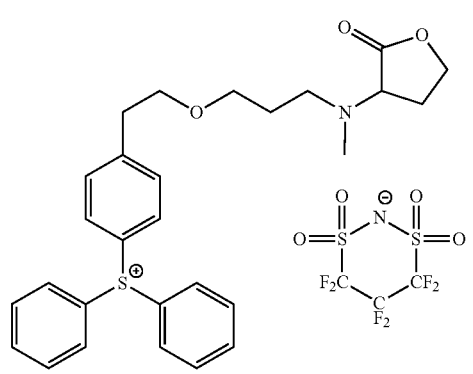
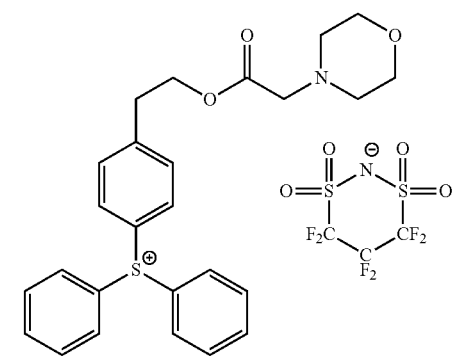
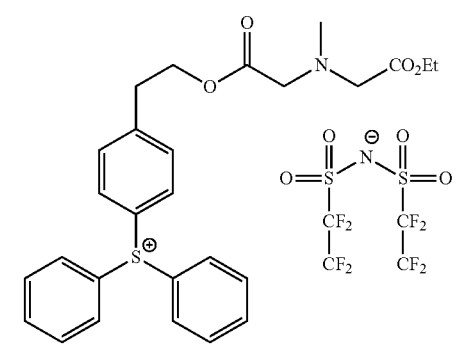
118
-continued
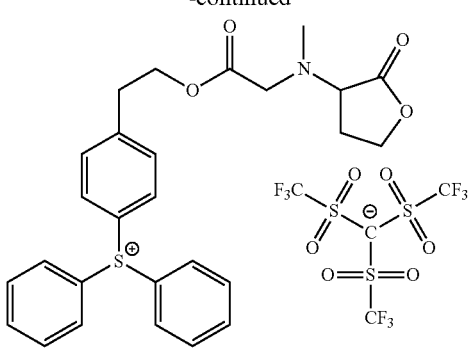
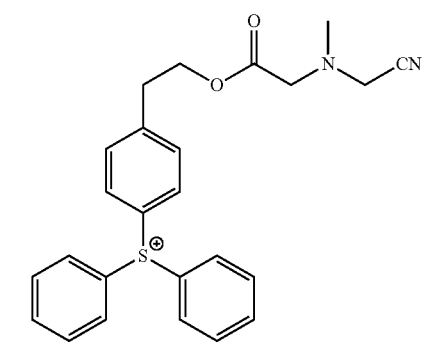
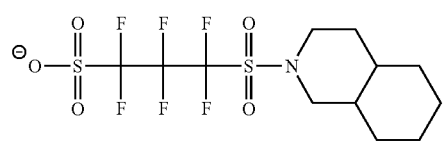
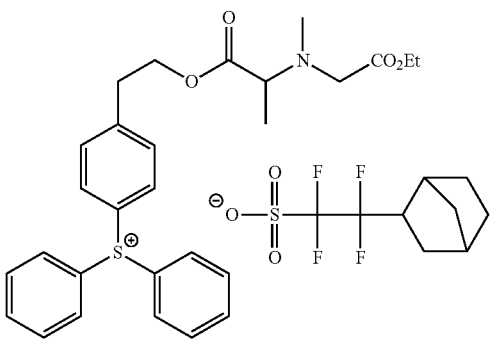
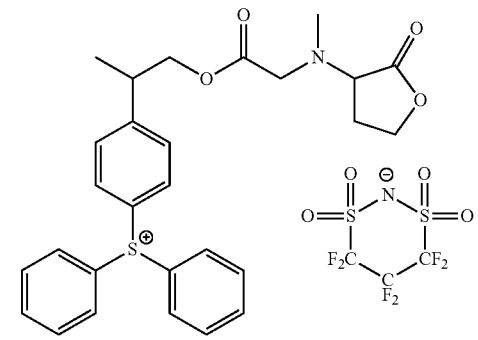

119
-continued
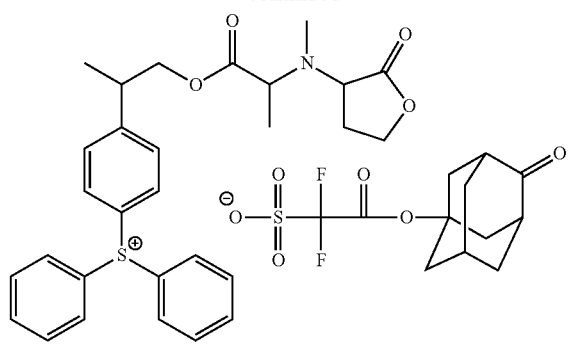
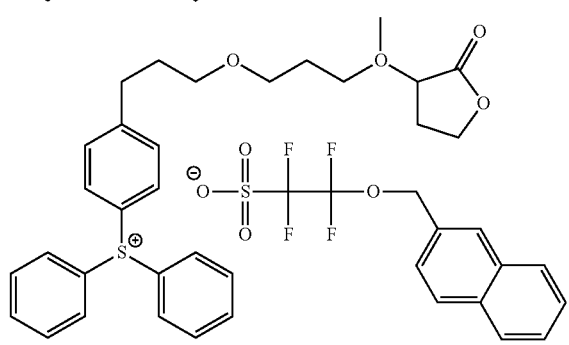
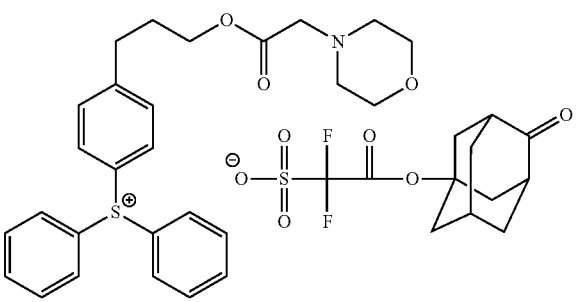
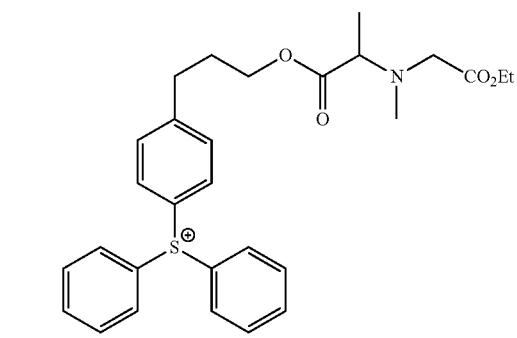
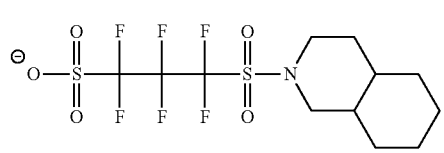
120
-continued
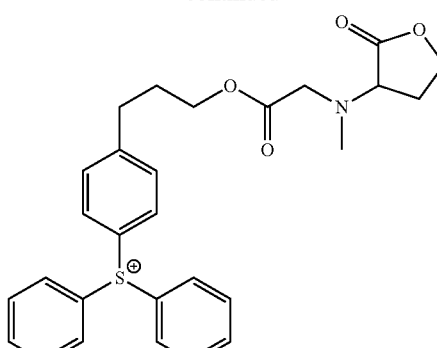
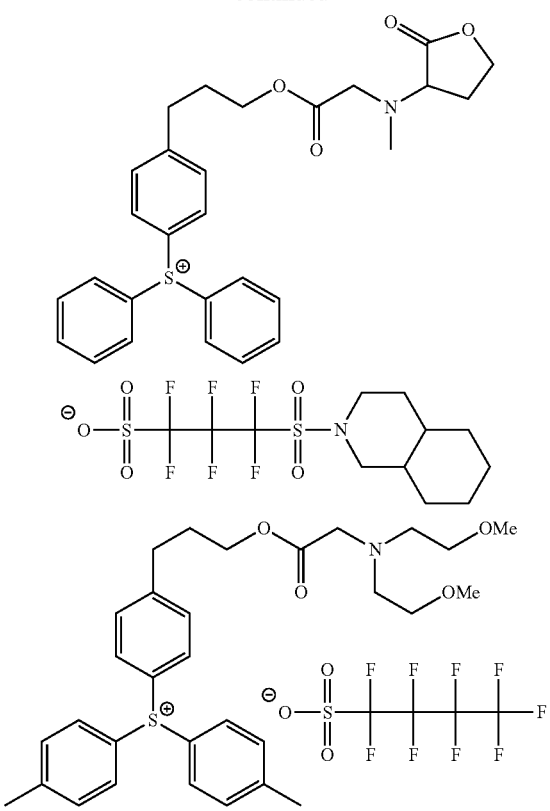
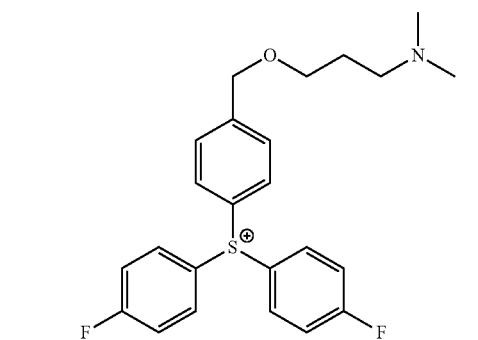
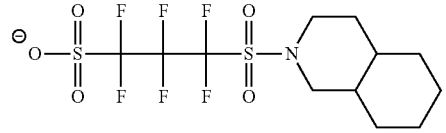
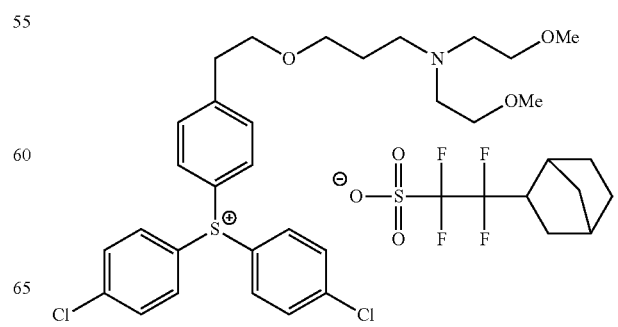

121
-continued
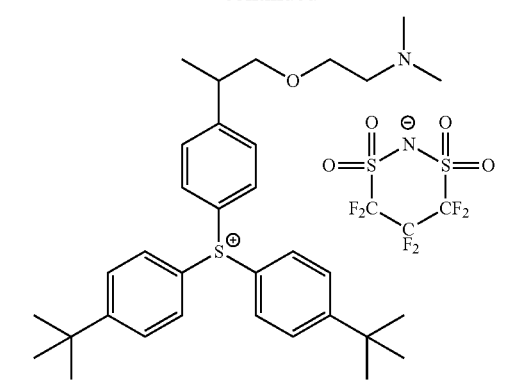
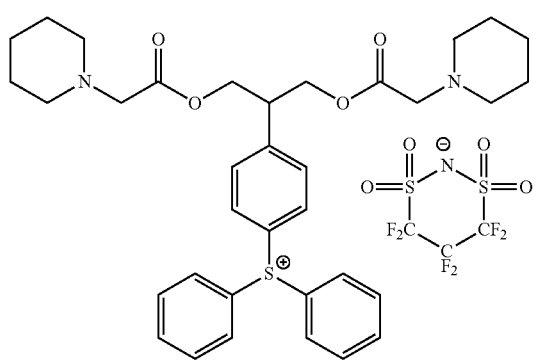
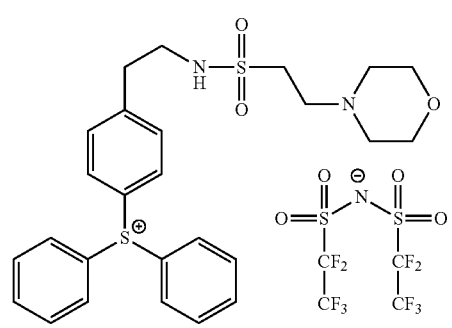
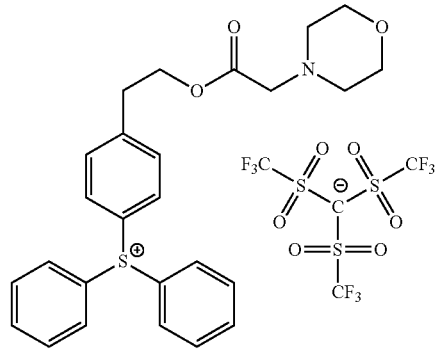
122
-continued
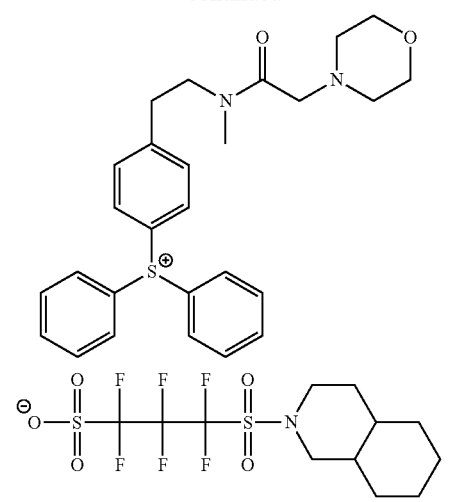
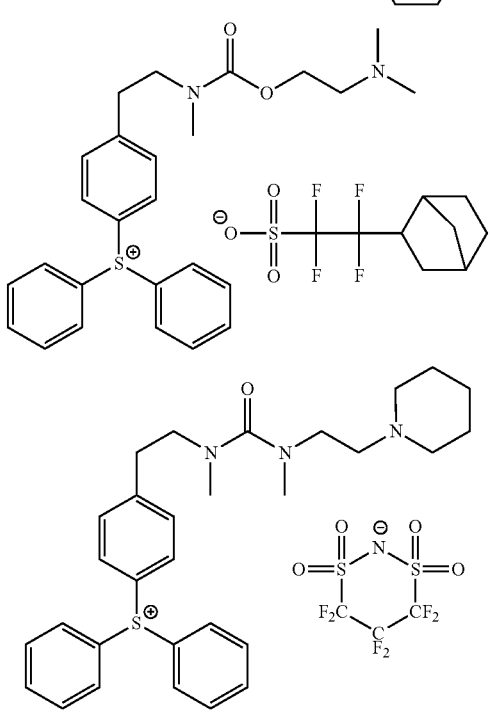
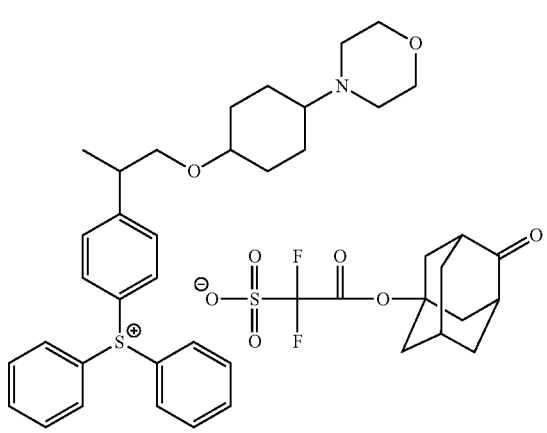

123
-continued
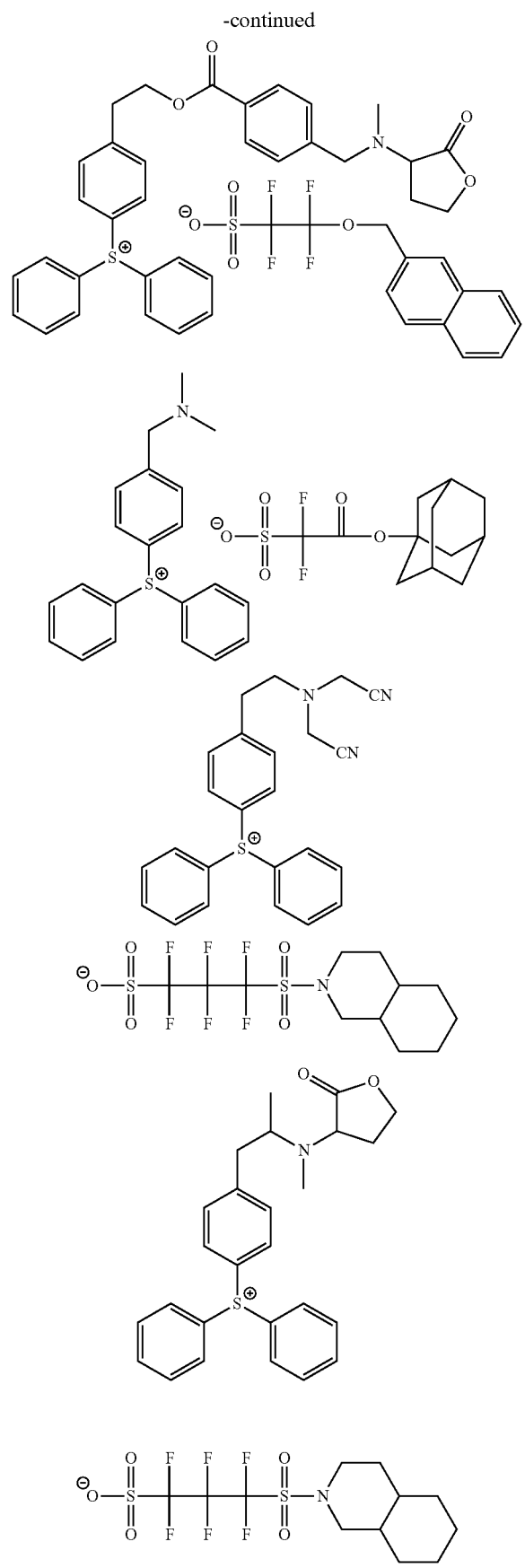
124
-continued
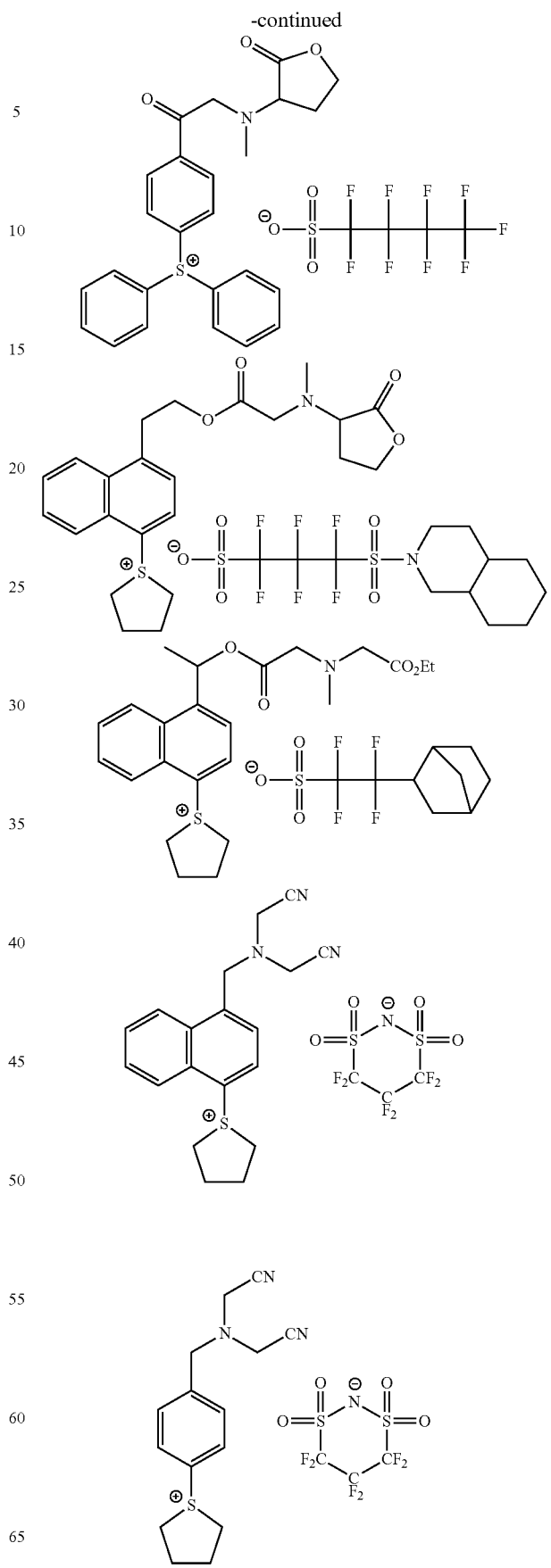

125
-continued
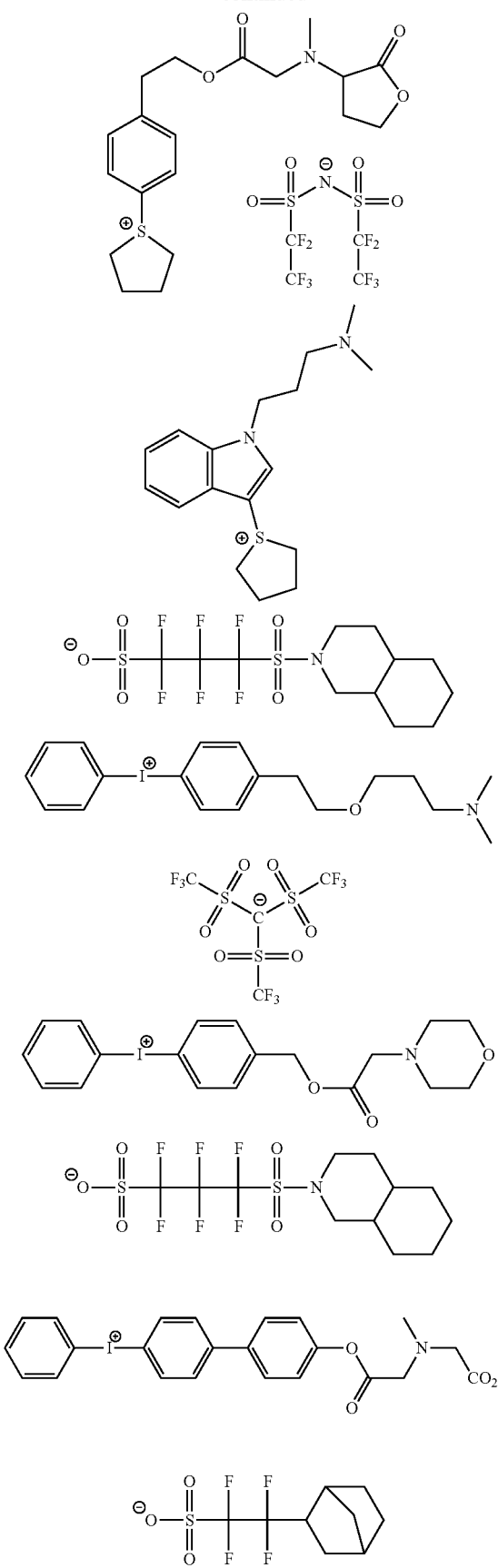
126
-continued
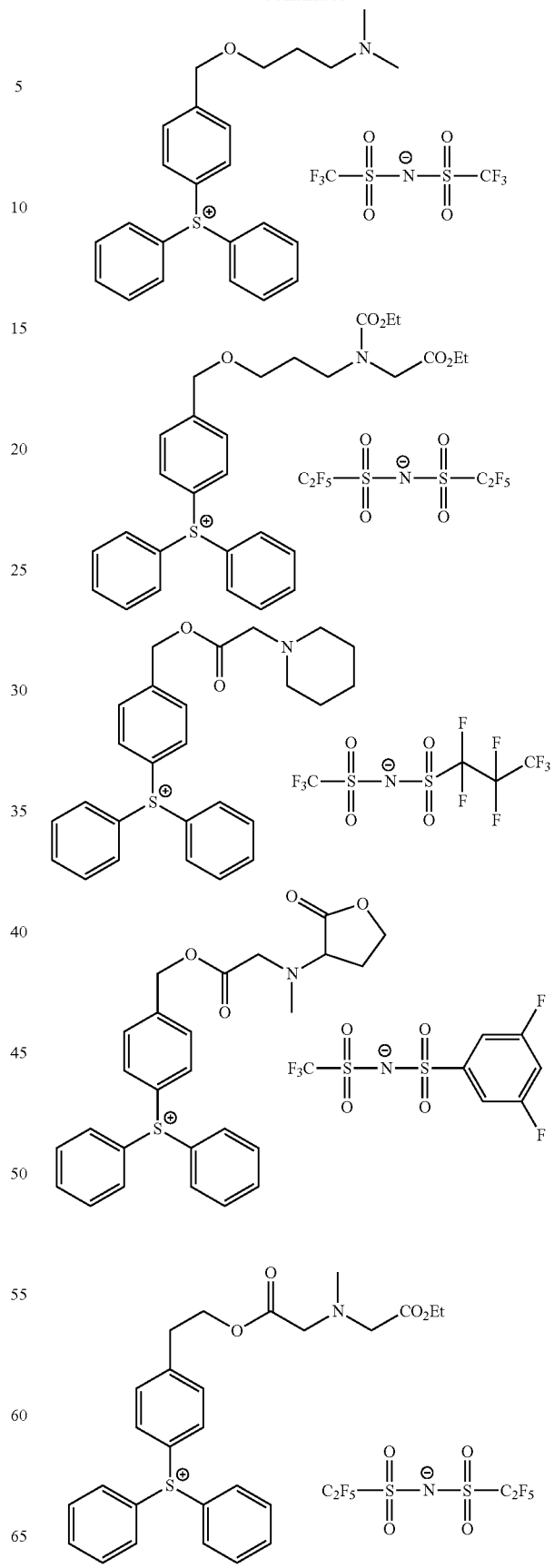

127
-continued
128
-continued
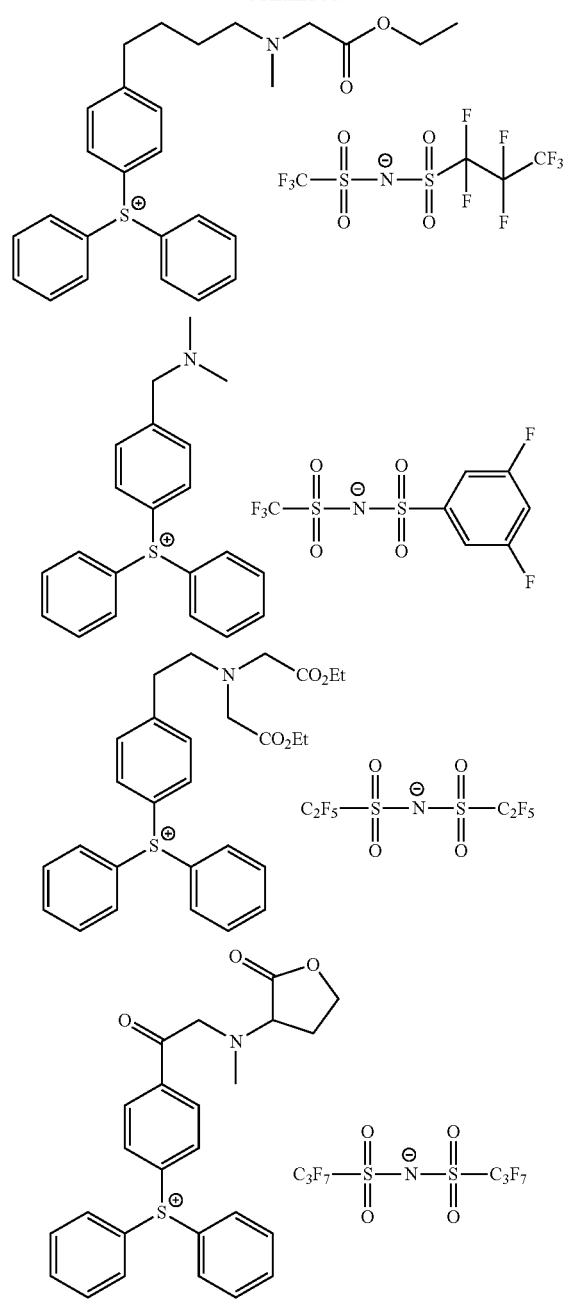
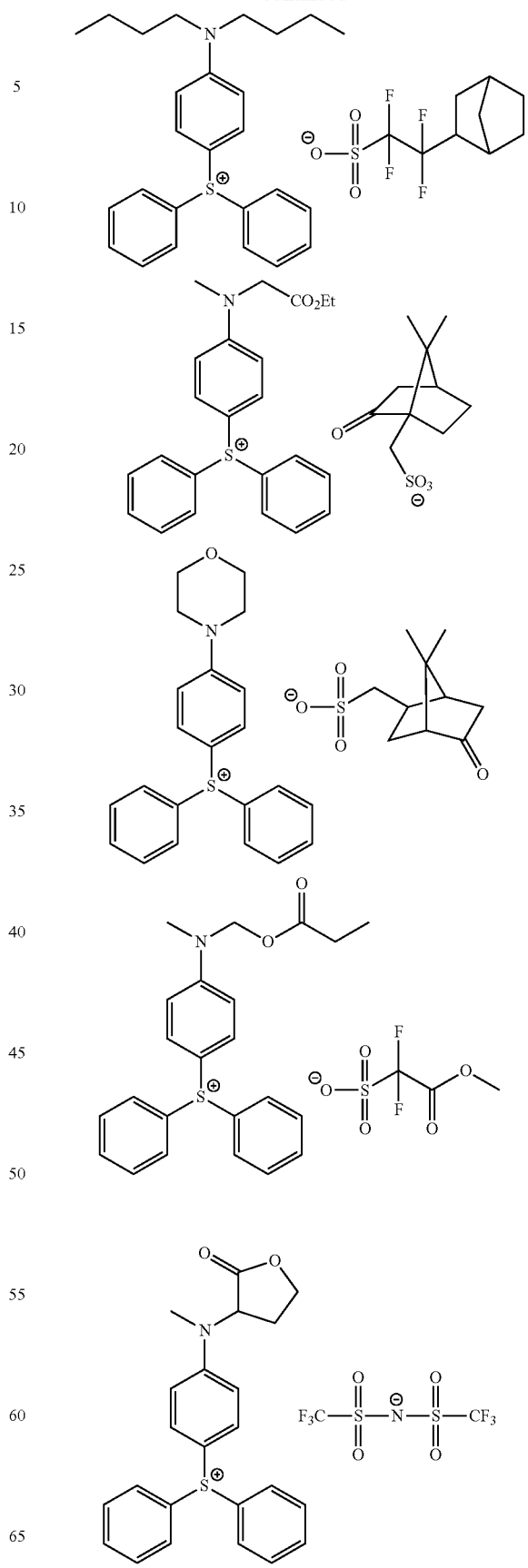

129
-continued
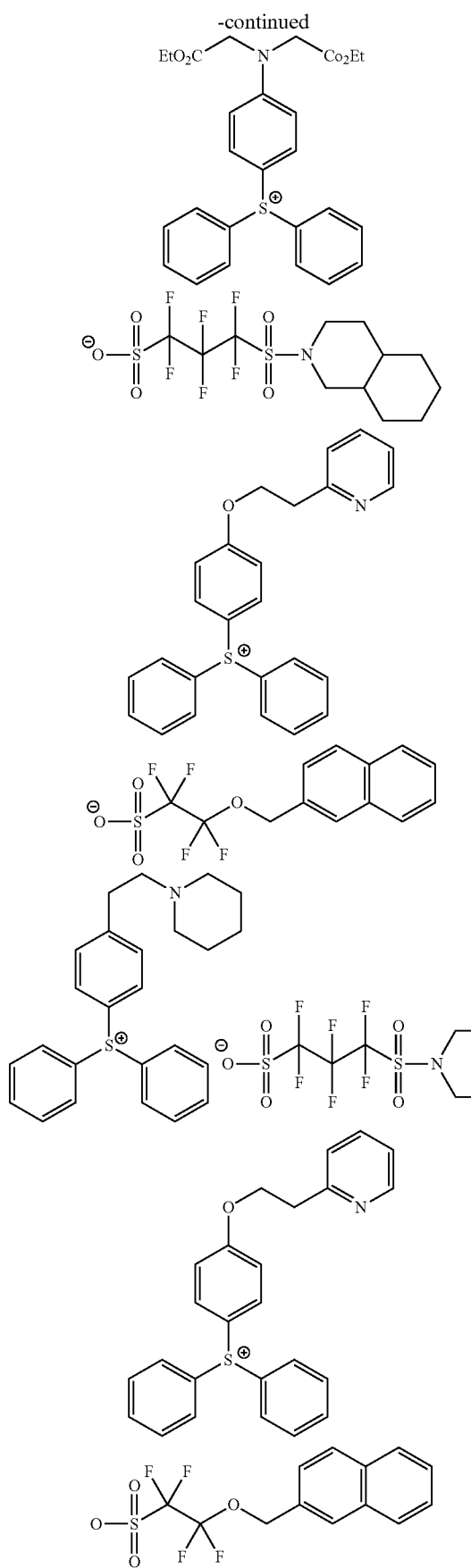
130
-continued
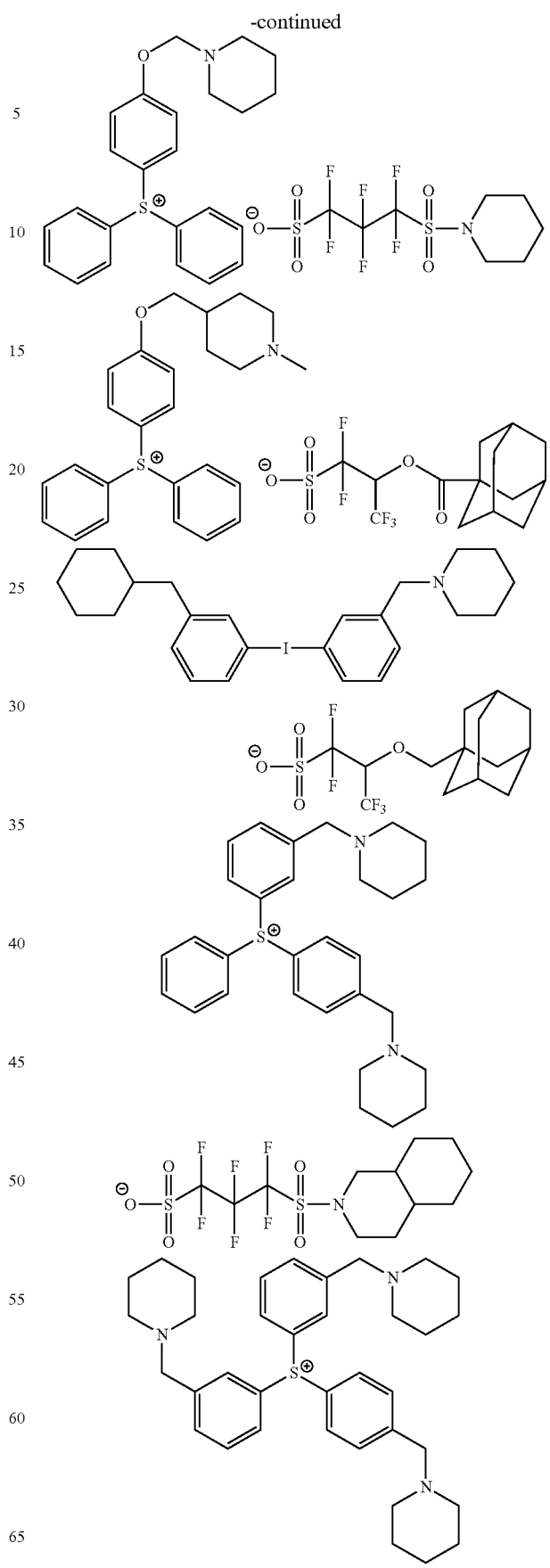

131
-continued
132
-continued
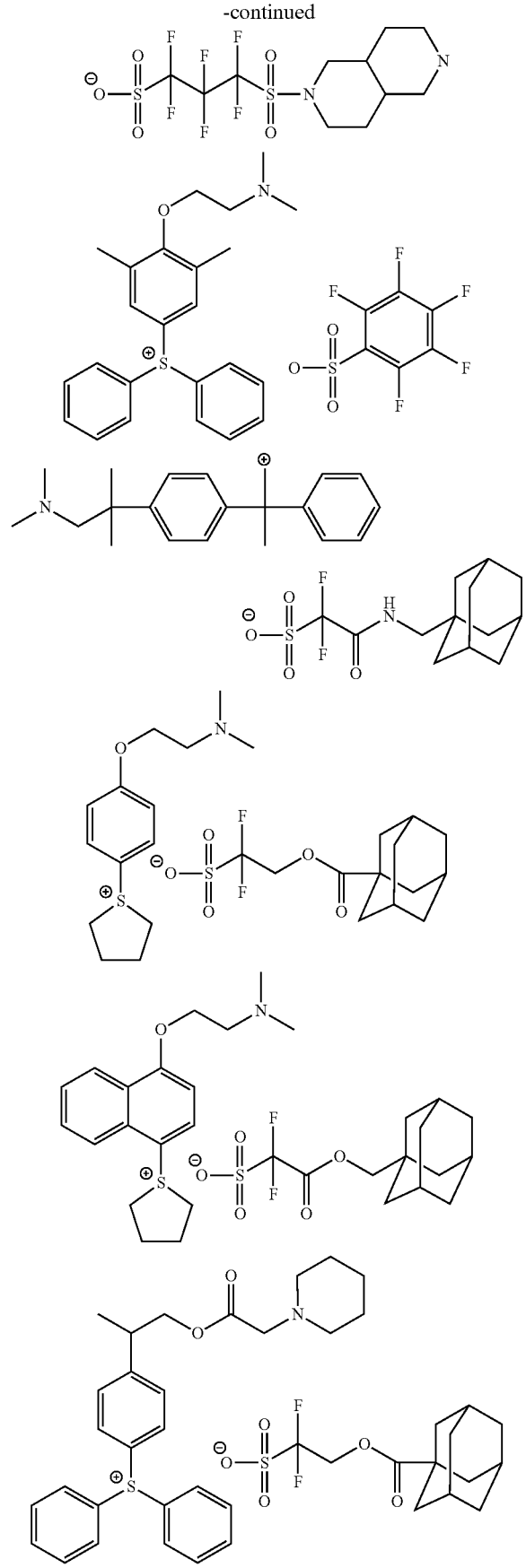
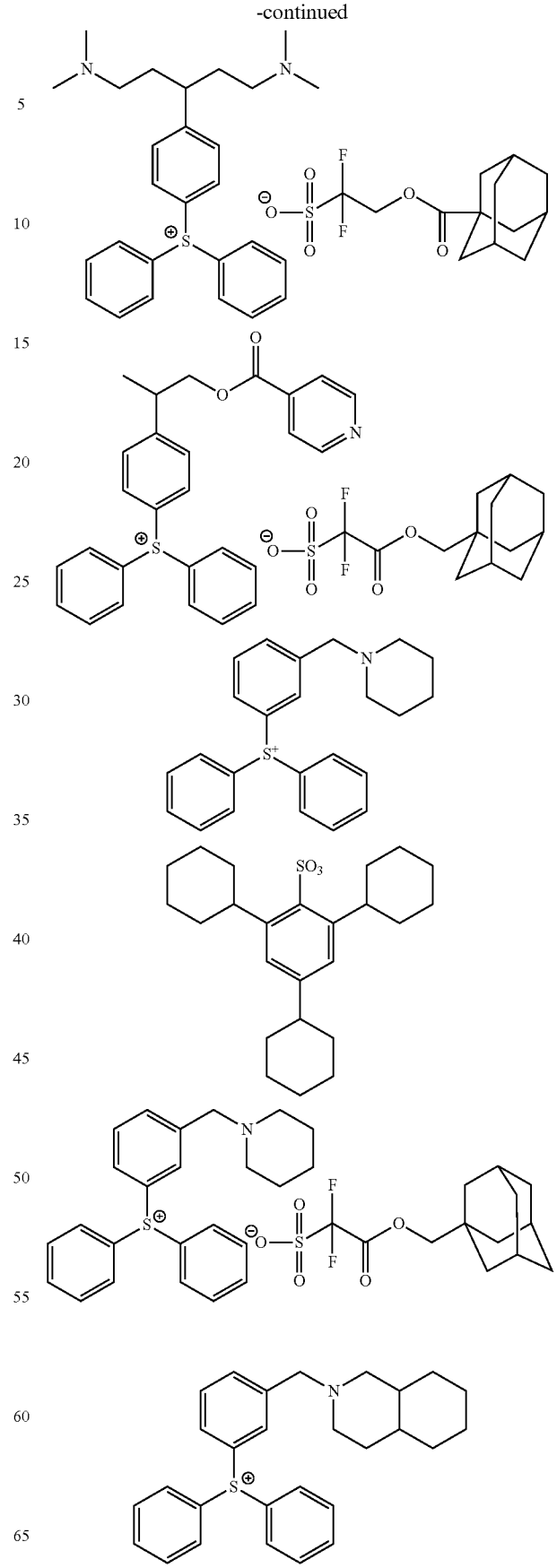

-continued

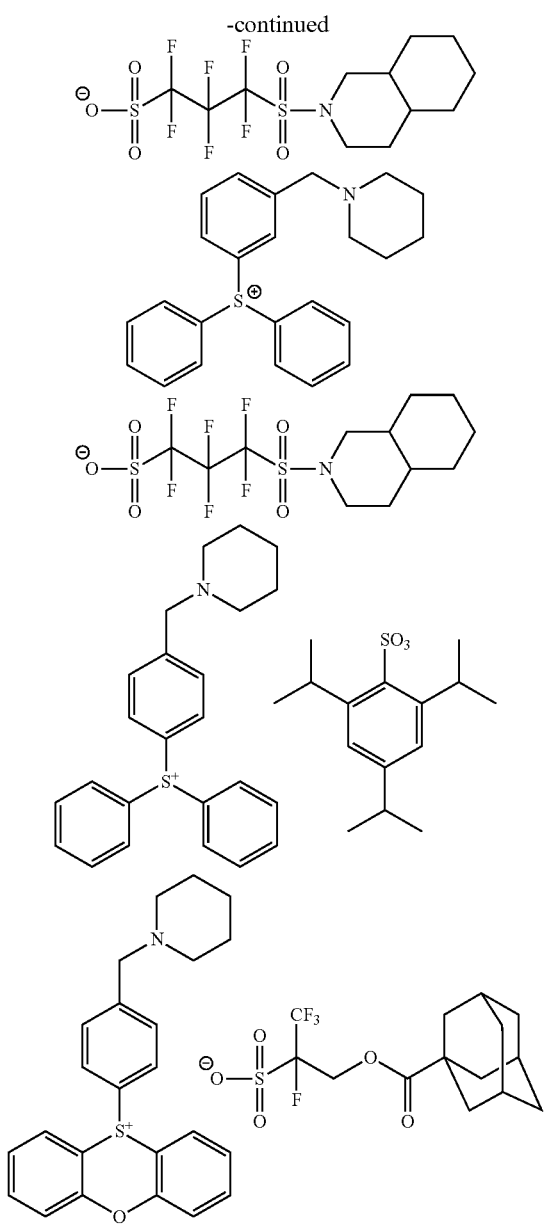

The compound (E) may be used singly or in combination of two or more kinds thereof.

The content of the compound (E) is generally in the range of 0.001% to 10% by mass, preferably 0.1% to 10% by mass, and more preferably 1% to 10% by mass, with respect to the total solid content of the composition.

Furthermore, from the viewpoint of improvement of resolution, it is preferable that the volume of an acid produced from the compound (E) is large.

<Hydrophobic Resin>

The composition of the present invention may contain a hydrophobic resin. Further, the hydrophobic resin is preferably different from the resin (A).

Although the hydrophobic resin is preferably designed to be unevenly localized on an interface as described above, it does not necessarily have to have a hydrophilic group in its molecule as different from the surfactant, and does not need to contribute to uniform mixing of polar/nonpolar materials.

Examples of the effect of addition of the hydrophobic resin include control of the static/dynamic contact angle of the resist film surface with respect to water, improvement of the immersion liquid tracking properties, and suppression of out gas.

The hydrophobic resin preferably has at least one of a "fluorine atom," a "silicon atom," or a "$CH_3$ partial structure contained in the side chain portion of a resin" from the point of view of uneven distribution on the film surface layer, and more preferably has two or more kinds.

In a case where the hydrophobic resin includes a fluorine atom and/or a silicon atom, the fluorine atom and/or the silicon atom in the hydrophobic resin may be contained in the main chain or the side chain of the resin.

In a case where the hydrophobic resin contains a fluorine atom, the resin is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom and the aryl group having a fluorine atom are a cycloalkyl group in which one hydrogen atom is substituted with a fluorine atom, and an aryl group having a fluorine atom, respectively, and may further have a substituent other than a fluorine atom.

Preferred examples of the alkyl group having a fluorine atom, the cycloalkyl group having a fluorine atom, and the aryl group having a fluorine atom include groups represented by the following General Formulae (F2) to (F4), but the present invention is not limited thereto.

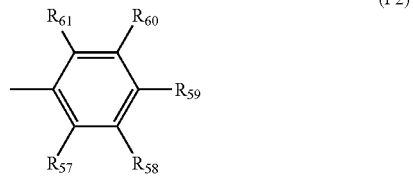

(F2)

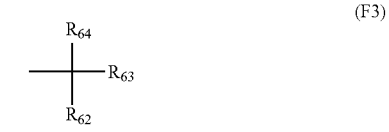

(F3)

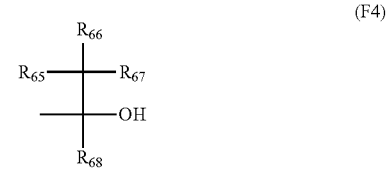

(F4)

In General Formulae (F2) to (F4), $R_{57}$ to $R_{68}$ each independently represent a hydrogen atom, a fluorine atom, or an (linear or branched) alkyl group, provided that at least one of $R_{57}$, . . . , or $R_{61}$, at least one of $R_{62}$, . . . , or $R_{64}$, and at least one of $R_{65}$, . . . , or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

The hydrophobic resin may contain a silicon atom. It is preferably a resin having an alkylsilyl structure (preferably a trialkylsilyl group) or a cyclic siloxane structure as a partial structure having a silicon atom.

Examples of the repeating unit having a fluorine atom or a silicon atom include those exemplified in [0519] of US2012/0251948A1.

Furthermore, it is also preferable that the hydrophobic resin contains a $CH_3$ partial structure in the side chain portion, as described above.

Here, the $CH_3$ partial structure (hereinafter also simply referred to as a "side chain $CH_3$ partial structure") contained in the side chain portion in the hydrophobic resin includes a $CH_3$ partial structure contained in an ethyl group, a propyl group, and the like.

On the other hand, a methyl group bonded directly to the main chain of the hydrophobic resin (for example, an α-methyl group in the repeating unit having a methacrylic acid structure) makes only a small contribution of uneven distribution to the surface of the hydrophobic resin due to the effect of the main chain, and it is therefore intended not to be included in the "$CH_3$ partial structure" in the present invention.

More specifically, in a case where the hydrophobic resin contains a repeating unit derived from a monomer having a polymerizable moiety with a carbon-carbon double bond, such as a repeating unit represented by the following General Formula (M), and in addition, $R_{11}$ to $R_{14}$ are $CH_3$ "themselves," such $CH_3$ is not included in the "$CH_3$ partial structure" contained in the side chain portion.

On the other hand, a $CH_3$ partial structure which is present via a certain atom from a C—C main chain corresponds to the "$CH_3$ partial structure". For example, in a case where $R_{11}$ is an ethyl group ($CH_2CH_3$), the hydrophobic resin has "one" $CH_3$ partial structure.

(M)

In General Formula (M), $R_{11}$ to $R_{14}$ each independently represent a side chain portion.

Examples of $R_{11}$ to $R_{14}$ in the side chain portion include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin is preferably a resin including a repeating unit having the $CH_3$ partial structure in the side chain portion thereof. Further, the hydrophobic resin more preferably has, as such a repeating unit, at least one repeating unit (x) of a repeating unit represented by the following General Formula (II') or a repeating unit represented by the following General Formula (III).

Hereinafter, the repeating unit represented by General Formula (II') will be described in detail.

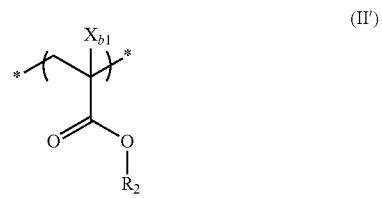

(II')

In General Formula (II'), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group which does not have a group capable of generating a polar group upon being decomposed by the action of an acid (acid-decomposable group).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. The cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, which has one or more $CH_3$ partial structures.

The number of the $CH_3$ partial structures contained in the organic group which has one or more $CH_3$ partial structures and is stable against an acid as $R_2$ is preferably 2 to 10, and more preferably 2 to 8.

Specific preferred examples of the repeating unit represented by General Formula (II') are shown below, but the present invention is not limited thereto.

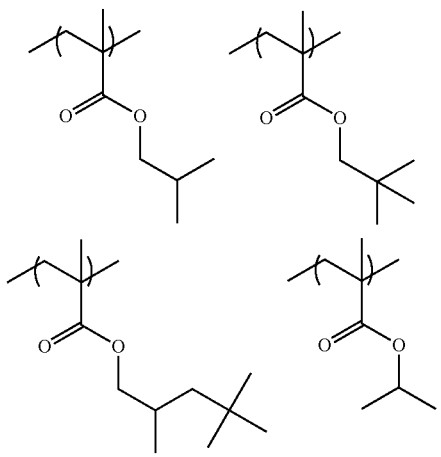

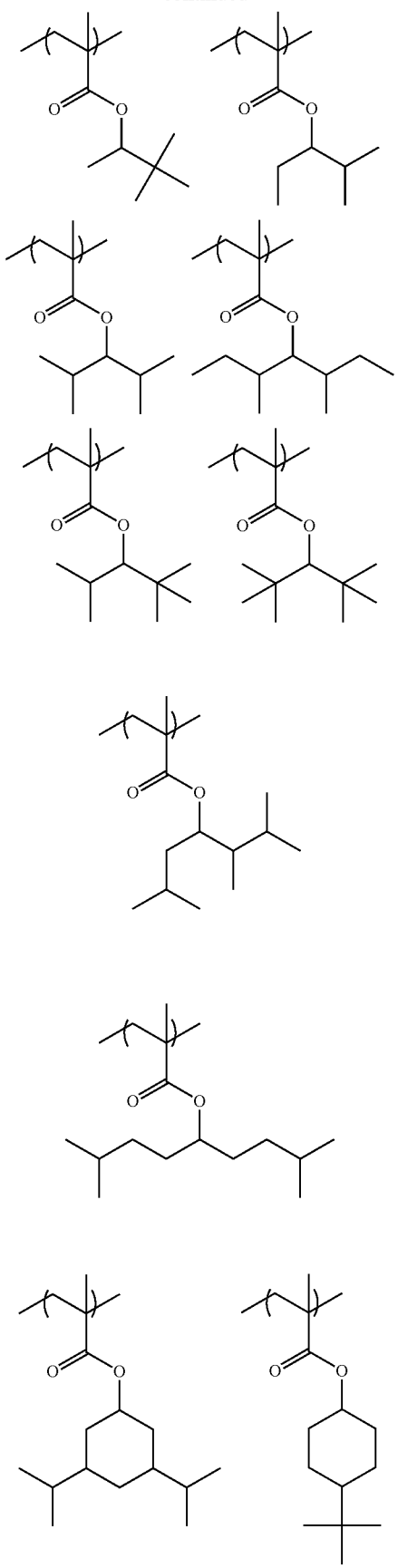
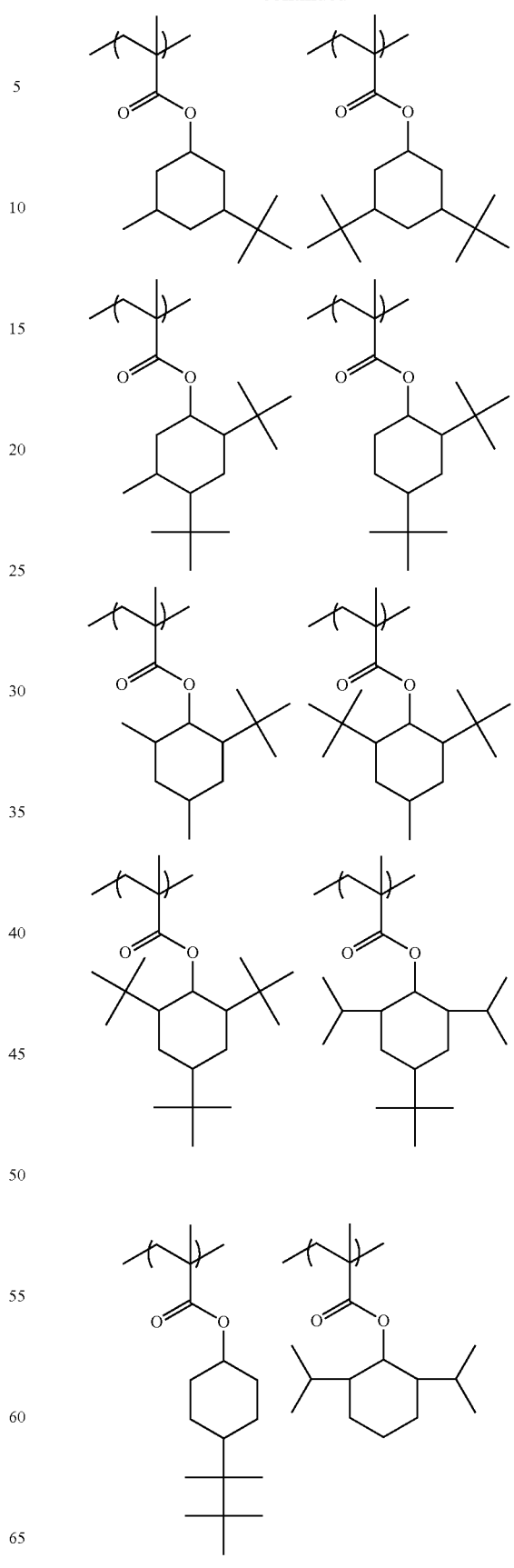

-continued

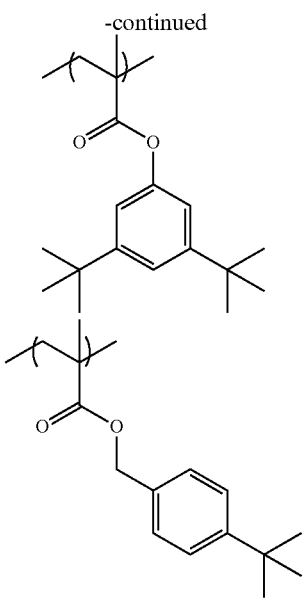

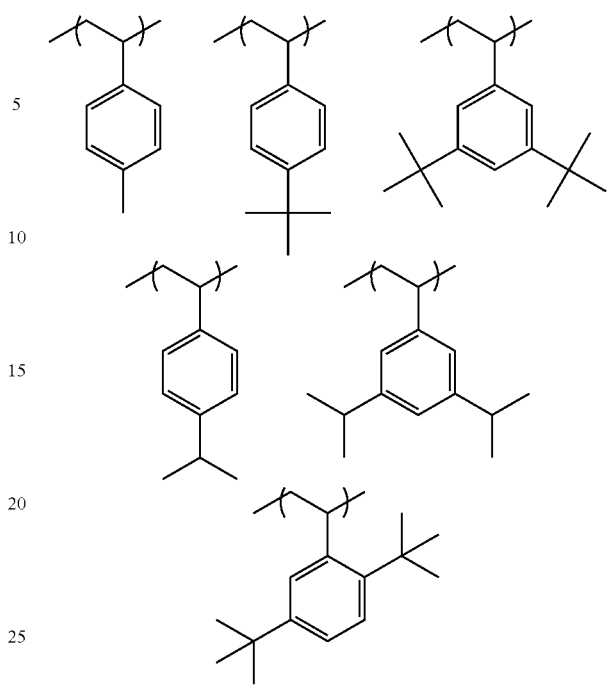

The repeating unit represented by General Formula (II') is preferably a repeating unit which is stable against an acid (non-acid-decomposable), and specifically, it is preferably a repeating unit not having a group that decomposes by the action of an acid to generate a polar group.

Hereinafter, the repeating unit represented by General Formula (III) will be described in detail.

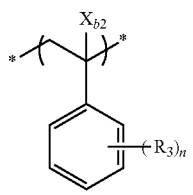

(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but $X_{b2}$ is preferably a hydrogen atom.

Since $R_3$ is an organic group which is stable against an acid, more specifically, $R_3$ is preferably an organic group which does not have the "acid-decomposable group".

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably 1 to 10, more preferably 1 to 8, and still more preferably 1 to 4.

n represents an integer of 1 to 5, preferably an integer of 1 to 3, and more preferably 1 or 2.

Specific preferred examples of the repeating unit represented by General Formula (III) are shown below, but the present invention is not limited thereto.

The repeating unit represented by General Formula (III) is preferably a repeating unit which is stable against an acid (non-acid-decomposable), and specifically, it is preferably a repeating unit which does not have a group that decomposes by the action of an acid to generate a polar group.

In a case where the hydrophobic resin contains a $CH_3$ partial structure in the side chain portion thereof, and in particular, it has neither a fluorine atom nor a silicon atom, the content of at least one repeating unit (x) of the repeating unit represented by General Formula (II') or the repeating unit represented by General Formula (III) is preferably 90% by mole or more, and more preferably 95% by mole or more, with respect to all the repeating units of the hydrophobic resin. Further, the content is usually 100% by mole or less with respect to all the repeating units of the hydrophobic resin.

By incorporating at least one repeating unit (x) of the repeating unit represented by General Formula (II') or the repeating unit represented by General Formula (III) in a proportion of 90% by mole or more with respect to all the repeating units of the hydrophobic resin, into the hydrophobic resin, the surface free energy of the hydrophobic resin is increased. As a result, it is difficult for the hydrophobic resin to be unevenly distributed on the surface of the resist film and the static/dynamic contact angle of the resist film with respect to water can be securely increased, thereby enhancing the immersion liquid tracking properties.

In addition, in a case where the hydrophobic resin contains (i) a fluorine atom and/or a silicon atom or (ii) a $CH_3$ partial structure in the side chain moiety, the hydrophobic resin may have at least one group selected from the following groups (x) to (z):

(x) an acid group, (y) a group having a lactone structure, an acid anhydride group, or an acid imido group, and (z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably a hexafluoroisopropanol group), a sulfonimido group, and a bis(alkylcarbonyl)methylene group.

Examples of the repeating unit containing an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by the use of a polymerization initiator or chain transfer agent containing an acid group during the polymerization. All of these cases are preferable. The repeating unit having an acid group (x) may have at least one of a fluorine atom or a silicon atom.

The content of the repeating units having an acid group (x) is preferably 1% to 50% by mole, more preferably 3% to 35% by mole, and still more preferably 5% to 20% by mole, with respect to all the repeating units in the hydrophobic resin.

Specific examples of the repeating unit having an acid group (x) are shown below, but the present invention is not limited thereto. In the formulae, Rx represents a hydrogen atom, $CH_3$, $CF_3$, or $CH_2OH$.

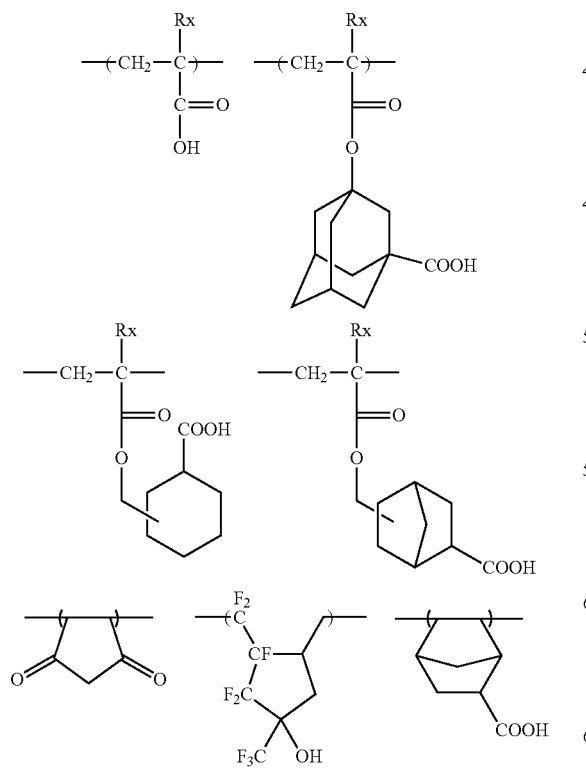
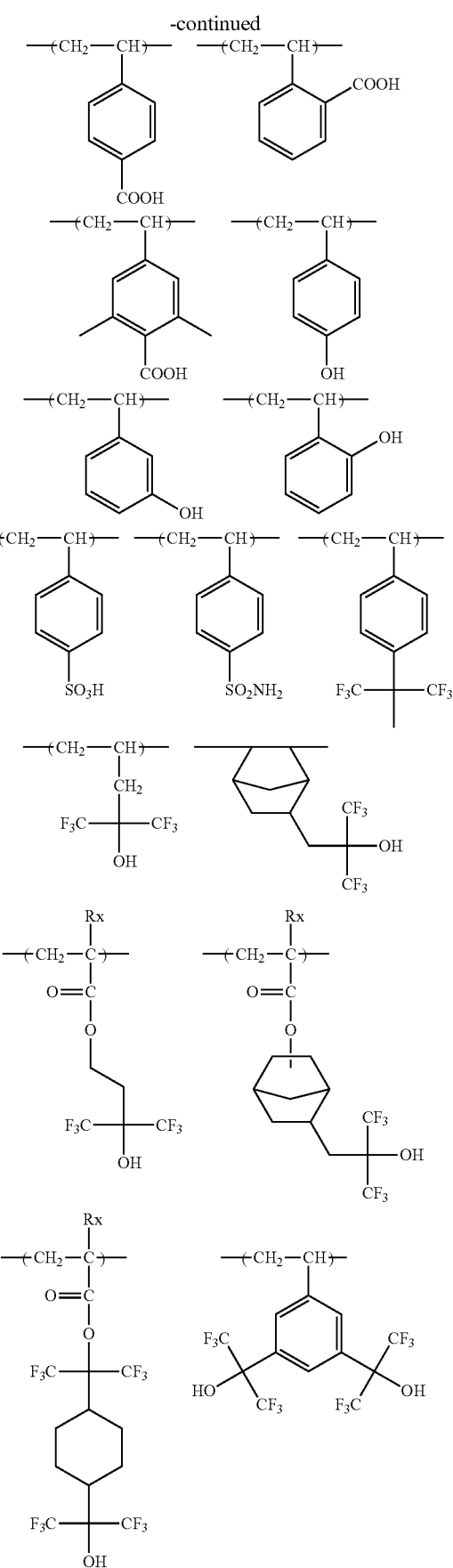

-continued

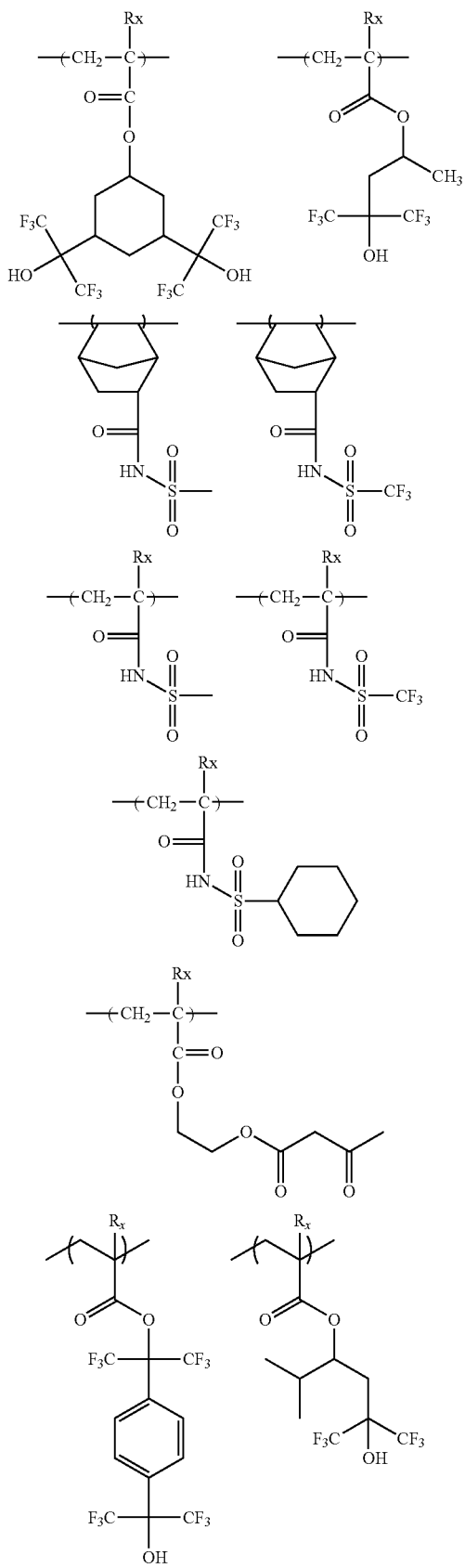

-continued

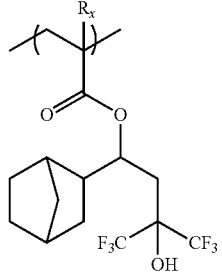

As the group (y) which is the group having a lactone structure, the acid anhydride group, or the acid imido group, the group having a lactone structure is particularly preferable.

The repeating unit containing such a group is, for example, a repeating unit in which the group is directly bonded to the main chain of the resin, such as a repeating unit by an acrylic acid ester or a methacrylic acid ester. This repeating unit may be a repeating unit in which the group is bonded to the main chain of the resin through a linking group. Alternatively this repeating unit may be introduced into the terminal of the resin by the use of a polymerization initiator or chain transfer agent containing the group during the polymerization.

Examples of the repeating unit containing a group having a lactone structure include a repeating unit having the same lactone group as the lactone group described earlier in the section of the basic compound.

The content of the repeating units containing a group having a lactone structure, an acid anhydride group, or an acid imido group (y) is preferably 1% to 100% by mole, more preferably 3% to 98% by mole, and still more preferably 5% to 95% by mole, with respect to all the repeating units in the hydrophobic resin.

With respect to the hydrophobic resin, examples of the repeating unit having a group (z) that decomposes by the action of an acid include the same ones as the repeating units having an acid-decomposable group to generate a carboxyl group, exemplified as the resin (A), but are not limited thereto. The repeating unit having a group (z) that decomposes by the action of an acid may have at least one of a fluorine atom or a silicon atom. For the hydrophobic resin, the content of the repeating units having a group (z) that decomposes by the action of an acid is preferably 1% to 80% by mole, more preferably 10% to 80% by mole, and still more preferably 20% to 60% by mole, with respect to all the repeating units in the hydrophobic resin.

The hydrophobic resin may further have repeating units that are different from the repeating units as described above.

The content of the repeating units having a fluorine atom is preferably 10% to 100% by mole, and more preferably 30% to 100% by mole, with respect to all the repeating units included in the hydrophobic resin. Further, the content of the repeating units having a silicon atom is preferably 10% to 100% by mole, and more preferably 20% to 100% by mole, with respect to all the repeating units included in the hydrophobic resin.

On the other hand, in particular, in a case where the hydrophobic resin includes a $CH_3$ partial structure in the side chain moiety thereof, it is also preferable that the hydrophobic resin has a form not having substantially a fluorine atom and a silicon atom. In addition, it is preferable that the hydrophobic resin is composed substantially of a repeating unit constituted with only an atom selected from a carbon atom, an oxygen atom, a hydrogen atom, a nitrogen atom, and a sulfur atom.

The weight-average molecular weight of the hydrophobic resin in terms of standard polystyrene is preferably 1,000 to 100,000, and more preferably 1,000 to 50,000.

Furthermore, the hydrophobic resin may be used singly or in combination of two or more kinds thereof.

The content of the hydrophobic resin in the composition is preferably 0.01% to 10% by mass, and more preferably 0.05% to 8% by mass, with respect to the total solid content of the composition.

In the hydrophobic resin, the content of residual monomers or oligomer components is also preferably 0.01% to 5% by mass, and more preferably 0.01% to 3% by mass. Further, the molecular weight distribution (Mw/Mn, also referred to as a dispersity) is preferably in the range of 1 to 5, and more preferably in the range of 1 to 3.

As the hydrophobic resin, various commercial products may be used, or the resin may be synthesized by an ordinary method (for example, radical polymerization).

<Surfactant>

The composition of the present invention may further include a surfactant in order to improve the coatability. Examples of surfactants include, but not limited to, nonionic surfactants such as a polyoxyethylene alkyl ether, a polyoxyethylene alkylallyl ether, a polyoxyethylene-polyoxypropylene block copolymer, a sorbitan fatty acid ester, and a polyoxyethylene sorbitan fatty acid ester, fluorinated surfactants such as MEGAFAC F171 and MEGAFAC F176 (manufactured by DIC Corporation), FLORAD FC430 (manufactured by Sumitomo 3M Ltd.), SURFINOL E1004 (manufactured by Asahi Glass Co., Ltd.), and PF656 and PF6320 manufactured by OMNOVA SOLUTIONS, INC., organosiloxane polymers, and polysiloxane polymers.

In a case where the composition of the present invention contains a surfactant, the content thereof is preferably 0.0001% to 2% by mass, and more preferably 0.0005% to 1% by mass, with respect to the whole amount (excluding the solvent) of the composition.

<Organic Carboxylic Acid>

It is preferable that the composition of the present invention includes an organic carboxylic acid, in addition to the components. Suitable examples of the organic carboxylic acid compound include an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, phthalic acid, terephthalic acid, isophthalic acid, 2-naphthoic acid, 1-hydroxy-2-naphthoic acid, and 2-hydroxy-3-naphthoic acid. However, when electron beam exposure is carried out in vacuum, there is a concern that vaporization thereof from the surface of the resist film occurs to stain the inside of the lithography chamber, and therefore, as preferred compounds thereof, aromatic organic carboxylic acids, among these, for example, benzoic acid, 1-hydroxy-2-naphthoic acid, and 2-hydroxy-3-naphthoic acid are suitable.

The blend ratio of the organic carboxylic acids is preferably 0.5% to 15% by mass, and more preferably 2% to 10% by mass, with respect to the total solid content of the composition.

If necessary, the composition of the present invention may further include a dye, a plasticizer, an acid amplifier (described in WO95/29968A and WO98/24000A, JP1996-305262A (JP-H08-305262A), JP1997-34106A (JP-H09-34106A), and JP1996-248561A (JP-H08-248561A), JP1996-503082A (JP-H08-503082A), U.S. Pat. No. 5,445,917A, JP1996-503081A (JP-H08-503081A), U.S. Pat. No. 5,534,393A, U.S. Pat. No. 5,395,736A, U.S. Pat. No. 5,741,630A, U.S. Pat. No. 5,334,489A, U.S. Pat. No. 5,582,956A, U.S. Pat. No. 5,578,424A, and U.S. Pat. No. 5,453,345A, E665960A, EP757628A, and EP665961A, U.S. Pat. No. 5,667,943A, and JP1998-1508A (JP-H10-1508A), JP1998-282642A (JP-H10-282642A), JP1997-512498A (JP-H09-512498A), JP2000-62337A, JP2005-1773 OA, JP2008-209889A, and the like), or the like. Examples of these compounds each include those described in JP2008-268935A.

<Onium Carboxylate Salt>

The composition of the present invention may include an onium carboxylate salt. Examples of the onium carboxylate salt include a carboxylic acid sulfonium salt, a carboxylic acid iodonium salt, and a carboxylic acid ammonium salt. In particular, as the onium carboxylate salt, a carboxylic acid sulfonium salt, or a carboxylic acid iodonium salt is preferable. Further, in the present invention, it is preferable that the carboxylate residue in the onium carboxylate salt contains neither an aromatic group nor a carbon-carbon double bond. A particularly preferred anion moiety thereof is a linear, branched, monocyclic, or polycyclic alkyl carboxylate anion having 1 to 30 carbon atoms. A more preferred anion moiety is a carboxylate anion in which the alkyl group is partially or fully fluorinated. The alkyl in its chain may contain an oxygen atom. Accordingly, the transparency to light of wavelength 220 nm or less can be ensured, the sensitivity and the resolving power can be enhanced, and iso/dense bias and exposure margin can be improved.

The blend ratio of onium carboxylate salt is preferably 1% to 15% by mass, and more preferably 2% to 10% by mass, with respect to the total solid content of the composition.

<Acid Amplifier>

The actinic ray-sensitive or radiation-sensitive composition of the present invention may further include one kind or two or more kinds of the compounds (hereinafter also referred to as acid amplifiers) that decomposes by the action of an acid to generate an acid. The acid generated by each acid amplifier is preferably a sulfonic acid, a methide acid, or an imidic acid. The content of the acid amplifier is preferably 0.1% to 50% by mass, more preferably 0.5% to 30% by mass, and still more preferably 1.0% to 20% by mass, with respect to the total solid content of the composition.

The blend ratio of acid amplifier to acid generator (the solid content of the acid amplifier with respect to the total solid content of the composition/the solid content of the acid generator with respect to the total solid content of the composition) is not particularly limited, but is preferably 0.01 to 50, more preferably 0.1 to 20, and particularly preferably 0.2 to 1.0.

Examples of the acid amplifies which can be used in the present invention are shown below, but are not limited thereto.

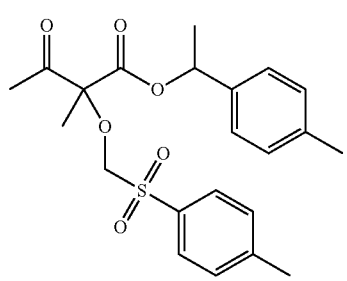

(PA-1)

-continued
(PA-2)
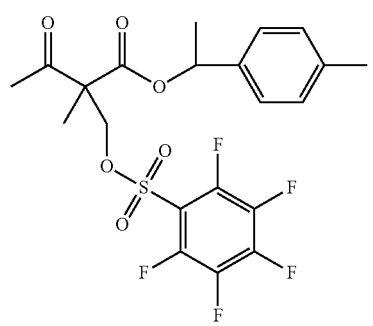
(PA-3)
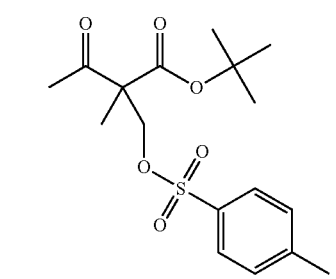
(PA-4)
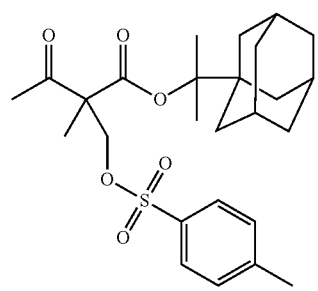
(PA-5)
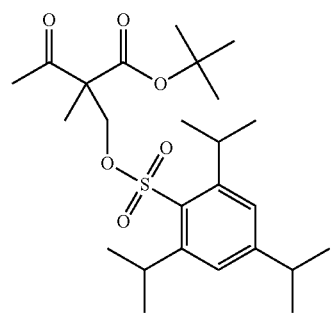
(PA-6)
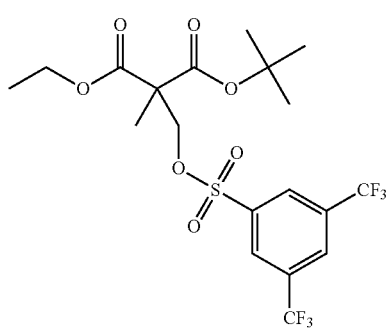
(PA-7)
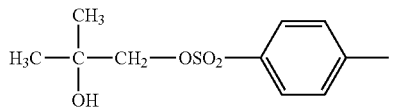
-continued
(PA-8)
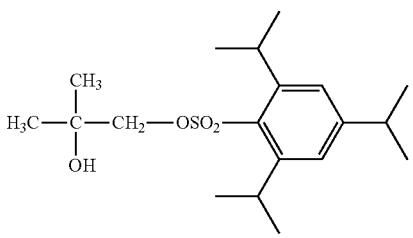
(PA-9)
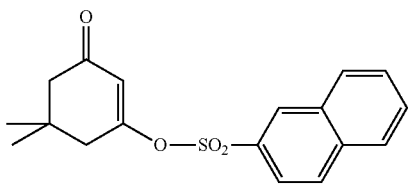
(PA-10)
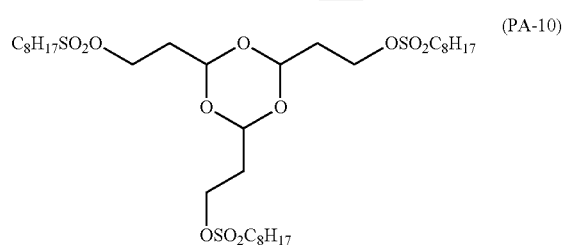
(PA-11)
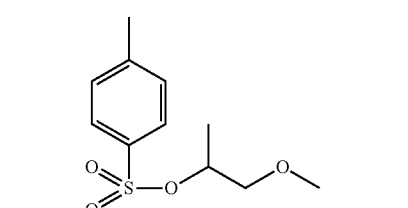
(PA-12)
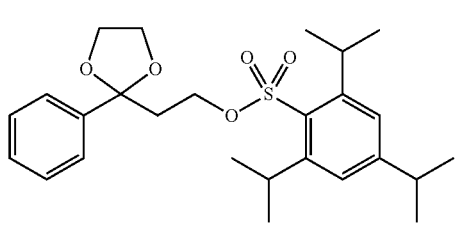
(PA-13)
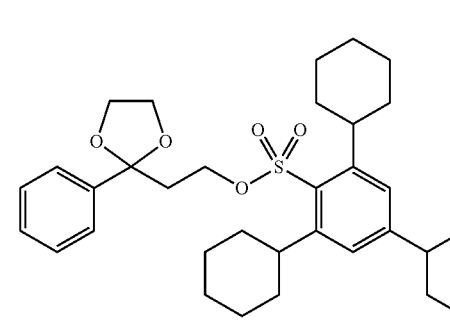
(PA-14)
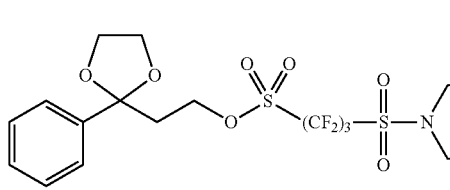

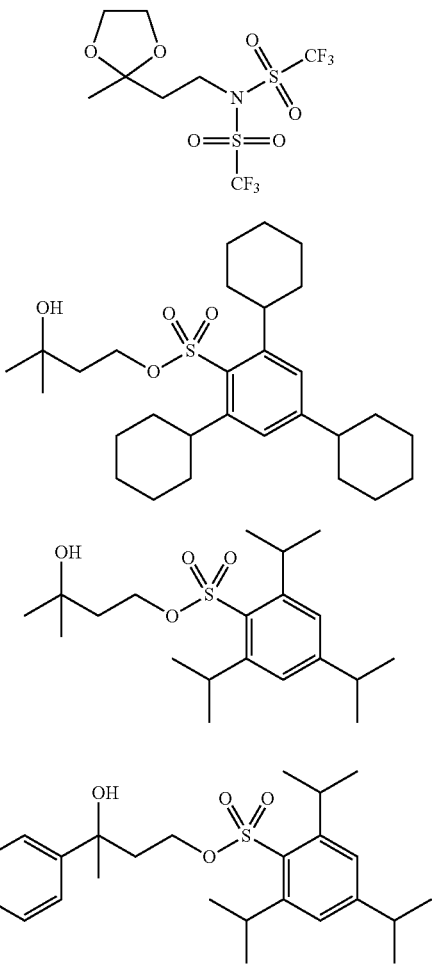

<Solvent>

The composition of the present invention may include a solvent. Preferred examples of the solvent include ethylene glycol monoethyl ether acetate, cyclohexanone, 2-heptanone, propylene glycol monomethyl ether (PGME, also known as 1-methoxy-2-propanol), propylene glycol monomethyl ether acetate (PGMEA, also known as 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, and ethylene carbonate. These solvents may be used singly or in combination.

The solid contents of the composition of the present invention are dissolved in the solvent, and the concentration of the solid content of the composition of the present invention is 1% to 40% by mass, more preferably 1% to 30% by mass, and still more preferably 3% to 20% by mass.

<Actinic Ray-Sensitive or Radiation-Sensitive Film, and Mask Blank>

The present invention also relates to an actinic ray-sensitive or radiation-sensitive film including the composition of the present invention. Such a film is formed by, for example, coating the composition of the present invention onto a support such as a substrate. The thickness of this film is preferably 0.02 to 0.1 μm. As a coating method onto a substrate, a appropriate coating method such as spin coating, roll coating, flow coating, dip coating, spray coating, and doctor coating is used for coating onto a substrate, but the spin coating is preferable. The rotation speed is preferably 1,000 to 3,000 rpm. The coated film is prebaked at 60° C. to 150° C. for 1 to 20 minutes, and preferably at 80° C. to 120° C. for 1 to 10 minutes, thereby forming a thin film.

As the material constituting a substrate to be processes or a topmost surface layer thereof, for example, in a case of a semiconductor wafer, a silicon wafer can be used, and examples of the materials constituting the topmost surface layer include Si, $SiO_2$, SiN, SiON, TiN, WSi, BPSG, SOG, and an organic antireflection film.

Moreover, the present invention relates to a mask blank including an actinic ray-sensitive or radiation-sensitive film, obtained in the above manner. In a case where a pattern is formed on a photomask blank for photomask fabrication in order to obtain the mask blank provided with such a resist film, examples of the usable transparent substrate include a transparent substrate of quartz, calcium fluoride, or the like. Generally, the substrate is laminated with necessary films selected from functional films, such as a light-shielding film, an antireflection film, and a phase shift film, and additionally, an etching stopper film and an etching mask film. As for the material of each of the functional films, a film containing silicon or a transition metal such as chromium, molybdenum, zirconium, tantalum, tungsten, titanium, and niobium is laminated. Examples of the material for use in the topmost surface layer include one whose main constituent material is silicon or a material including silicon and, contained therein, oxygen and/or nitrogen, a silicon compound material whose main constituent material is a material including the same and, contained therein, a transition metal, or a transition metal compound material whose main constituent material is a transition metal, particularly at least one selected from chromium, molybdenum, zirconium, tantalum, tungsten, titanium, niobium, or the like, or a material including the same and, contained therein, at least one element selected from oxygen, nitrogen, and carbon.

The light-shielding film may be a monolayer, but is more preferably in a multilayer structure including a plurality of materials superimposed one upon another by coating. In a case of the multilayer structure, the film thickness of each layer is not particularly limited, but is preferably 5 to 100 nm, and more preferably 10 to 80 nm. The thickness of the whole light-shielding film is not particularly limited, but is preferably 5 to 200 nm, and more preferably 10 to 150 nm.

In a case where pattern formation is performed using a composition on a photomask blank whose topmost surface layer contains a material containing chromium, and contained therein, oxygen or nitrogen among the above-mentioned materials, generally, it is likely to experience the occurrence of a constricted shape near the substrate, known as an undercut shape. This undercut problem can be alleviated by the use of the present invention, as compared with the related art.

The actinic ray-sensitive or radiation-sensitive film after irradiation with actinic ray or radiation (electron beams or the like) (hereinafter also referred to as exposure) and preferably bake (usually 80° C. to 150° C., and more preferably 90° C. to 130° C.) is developed with water. Thus, a good pattern can be obtained. Further, using this pattern as a mask, an etching treatment, ion injection, or the like is appropriately carried out, thereby manufacturing a semiconductor nanocircuit, an imprint mold structure, or the like.

In addition, a process for manufacturing a mold for imprints by the use of the composition of the present invention is described in, for example, JP4109085B, JP2008-162101A, and "Fundamentals of Nanoimprint and Its Technology Development/Application Deployment—Technology of Nanoimprint Substrate and Its Latest Technology Deployment" edited by Yoshihiko Hirai, published by Frontier Publishing.

<Pattern Forming Method>

The composition of the present invention can be appropriately used in the process for forming a negative tone pattern shown below. That is, the composition of the present invention can be appropriately used in the process including coating the composition onto a substrate to form a resist film, irradiating the resist film with actinic ray or radiation (that is, exposure), and developing the exposed film using a developer to obtain a negative tone pattern. As this process, use can be made of any of processes described in, for example, JP2008-292975A and JP2010-217884A.

The present invention further relates to a pattern forming method including exposing the resist film or a mask blank including the film, and developing the exposed resist film or the mask blank laminated with the exposed film. In the present invention, the exposure is preferably performed using electron beams or extreme ultraviolet rays.

In the exposure to light (pattern forming operation) of the resist film in, for example, the manufacturing of a precision integrated circuit element, first, it is preferable to subject the resist film of the present invention to patternwise irradiation with electron beams or extreme ultraviolet rays (EUV). The exposure is carried out in an exposure dose of, in a use of electron beams, approximately 0.1 to 20 $\mu C/cm^2$, and preferably approximately 3 to 10 $\mu C/cm^2$, and in a case of extreme ultraviolet rays, approximately 0.1 to 20 $mJ/cm^2$, and preferably approximately 3 to 15 $mJ/cm^2$. Subsequently, post-exposure heating (post-exposure bake) is carried out on a hot plate at 60° C. to 150° C. for 1 to 20 minutes, and preferably 80° C. to 120° C. for 1 to 10 minutes. Thereafter, development, rinsing, and drying are carried out to obtain a pattern. The development is carried out with a developer for 0.1 to 3 minutes, preferably 0.5 to 2 minutes by an ordinary method such as a dip method, a puddle method, and a spray method.

An alkali developer can be used as the developer.

Not only a quaternary ammonium salt whose representative is tetramethylammonium hydroxide is usually used as the alkali developer, but also an alkaline aqueous solution of, for example, an inorganic alkali, a primary amine, a secondary amine, a tertiary amine, an alcoholamine, a cycloamine, or the like can be used. Further, an appropriate amount of an alcohol and a surfactant can be added to the alkali developer before use. The alkali concentration of the alkali developer is usually 0.1% to 20% by mass. The pH of the alkali developer is usually 10.0 to 15.0.

Moreover, an appropriate amount of an alcohol and a surfactant can be added to the alkaline aqueous solution before use.

Since the composition of the present invention is a negative type resist composition for use in the formation of a negative tone pattern, a film in unexposed areas is dissolved while the film in exposed areas is less likely to be dissolved in the developer due to the crosslinking of the compounds. Utilizing this, a desired pattern can be formed on substrates.

The pattern forming method of the present invention can be used in formation of a guide pattern (see, for example, ACS Nano Vol. 4 No. 8 Pages 4815-4823) in Directed Self-Assembly (DSA).

Furthermore, the resist pattern formed by the pattern forming method of the present invention can be used as a core material (core) in the spacer process disclosed in, for example, JP1991-270227A (JP-H03-270227A) and JP2013-164509A.

Moreover, in the pattern forming method of the present invention, a top coat may be formed on the upper layer of the resist film. It is preferable that top coat is not mixed with a resist film and can be uniformly coated on the upper layer of the resist film.

The top coat is not particularly limited, and a top coat known in the related art can be formed according to a method known in the related art, and can also be formed, based on the description of paragraphs <0072> to <0082> of JP2014-059543A, for example.

Furthermore, the present invention relates to method for manufacturing an electronic device, including the pattern forming method of the present invention, and an electronic device manufactured by the manufacturing method.

The electronic device of the present invention is suitably mounted in electrical or electronic equipment (household electronic appliance, OA/media-related equipment, optical equipment, telecommunication equipment, and the like).

EXAMPLES

Hereinafter, the present invention will be described with reference to Examples, but the contents of the present invention are not limited thereto.

(Synthesis Example) Synthesis of Compound (B-1)

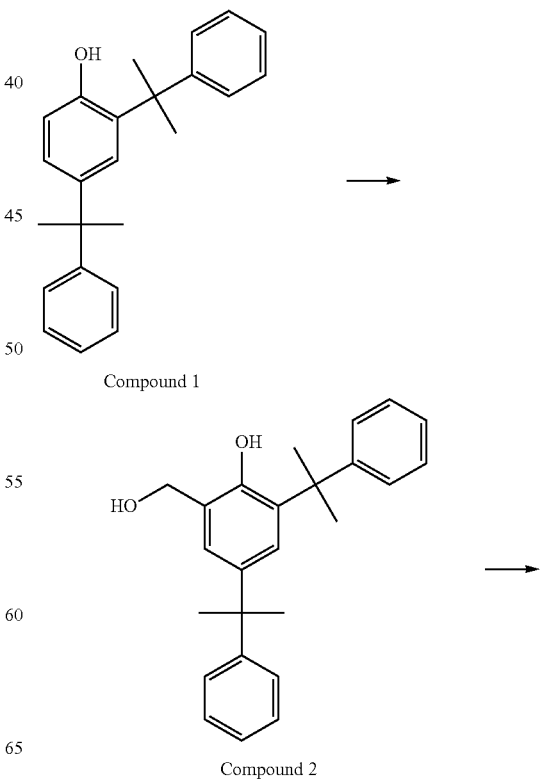

Compound 1

Compound 2

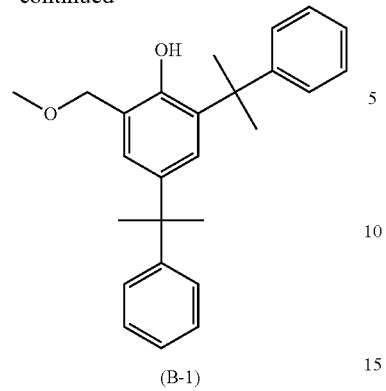

(B-1)

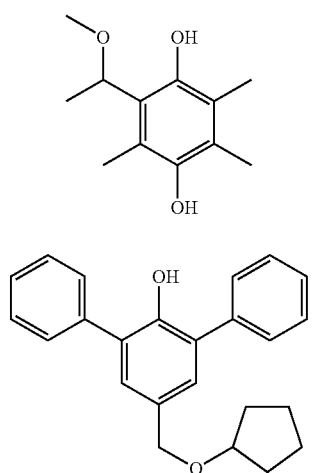

(B-3)

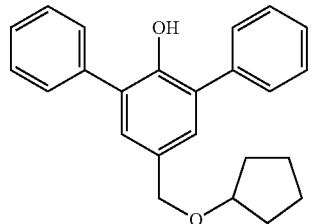

(B-4)

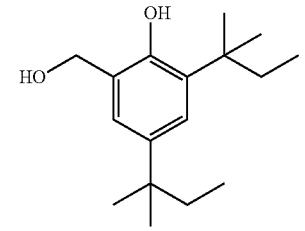

(B-5)

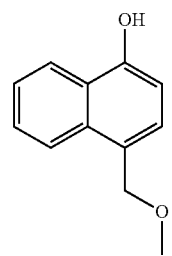

(B-6)

Synthesis of Compound 2: In a flask, potassium hydroxide (4.24 g), methanol (60 g), and water (20 g) were mixed, and a compound 1 (20 g) and para-formaldehyde (5.5 g) were added thereto. Then, this mixed liquid was stirred at 50° C. for 8 hours. To this reaction liquid were added 100 ml of 1 N hydrochloric acid and 200 ml of ethyl acetate, followed by performing liquid separation, and the obtained organic layer was rinsed with water (200 ml×3), and then concentrated to obtain a compound 2. The obtained compound 2 was used in the next step while not performing purification.

Synthesis of Compound (B-1): The entire amount of the compound 2 obtained above was dissolved in methanol (100 g), sulfuric acid (0.6 g) was then added thereto, and the solution was stirred at 50° C. for 5 hours. To this reaction liquid were added ethyl acetate (200 ml) and saturated aqueous sodium bicarbonate (100 ml), followed by performing liquid separation, and the obtained organic layer was rinsed with water (200 ml×3) to obtain a crude product of B-1. This crude product was purified by column chromatography to obtain 9.2 g of a compound (B-1).

The $^1$H-NMR chart (1H/acetone-d6) of the obtained compound (B-1) is shown in FIG. 1.

The compounds used in Examples and Comparative Examples are shown below.

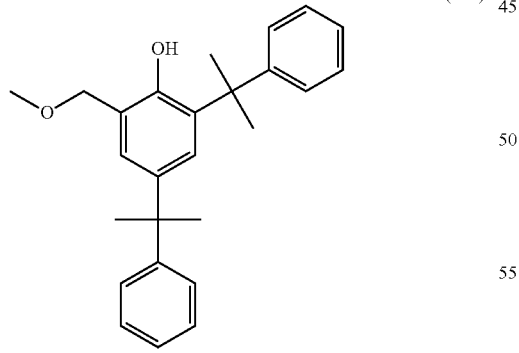

(B-1)

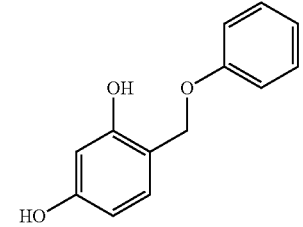

(B-7)

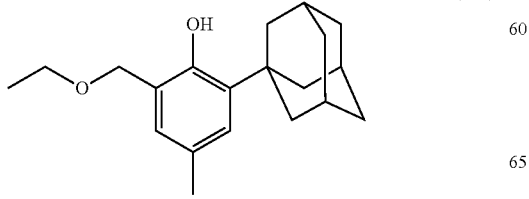

(B-2)

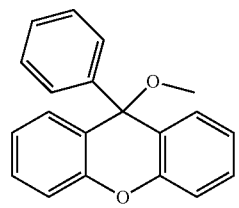

(B-8)

-continued (B-9) 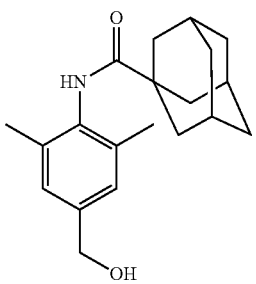

(B-10) 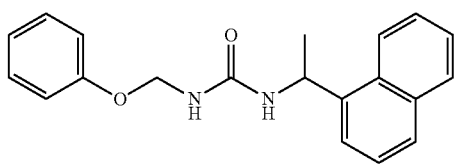

(B-11) 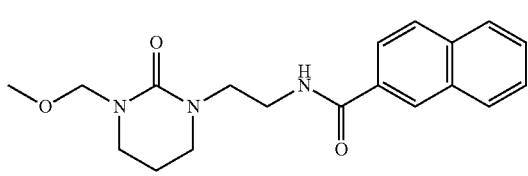

(B-12) 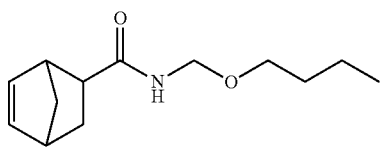

(B-13) 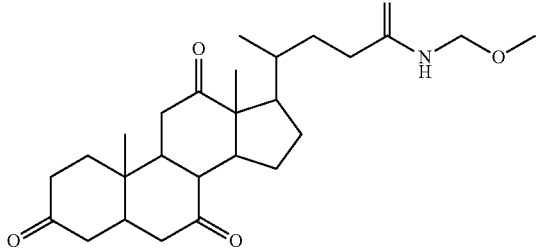

(B-14) 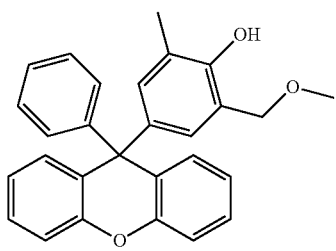

(BX-1) 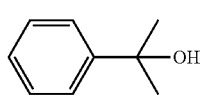

(BX-2) 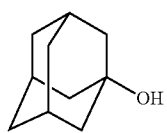

<Crosslinking Agent>

(C-1) 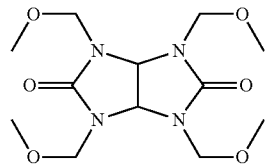

(C-2) 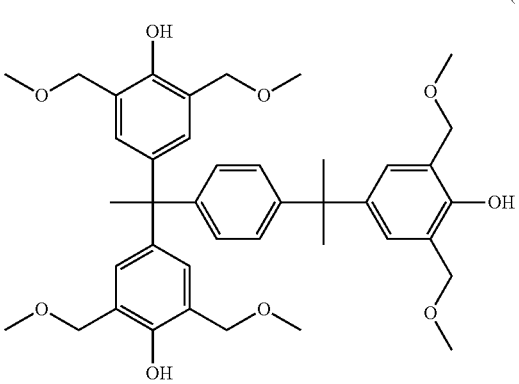

(C-3) 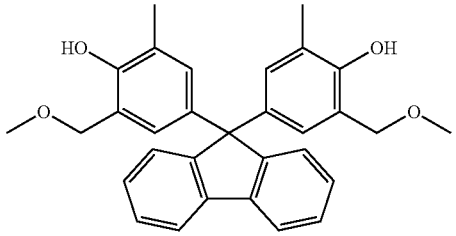

<Alkali-Soluble Resin>

As the alkali-soluble resin (A), the resins (P-1) to (P-7) shown below were used. The compositional ratio (molar ratio), the weight-average molecular weight Mw, and the dispersity Mw/Mn are shown together. Here, the weight-average molecular weight Mw (in terms of polystyrene), the number-average molecular weight Mn (in terms of polystyrene), and the dispersity Mw/Mn were calculated by GPC (solvent: THF) measurement. Further, the compositional ratio (molar ratio) was calculated by $^1$H-NMR measurement.

(P-1) 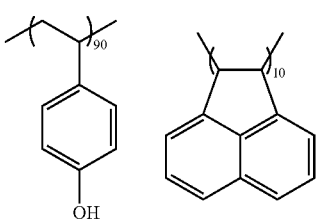

Mw = 11700
Mw/Mn = 1.2

-continued
(P-2) 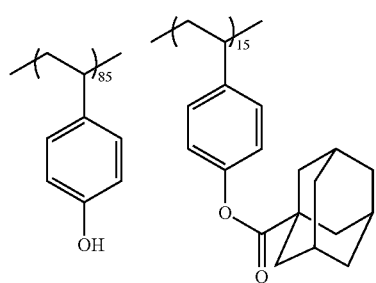
Mw = 4600
Mw/Mn = 1.3
(P-2) 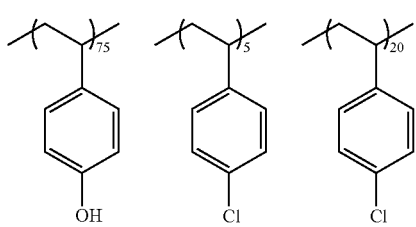
Mw = 5400
Mw/Mn = 1.6
(P-4) 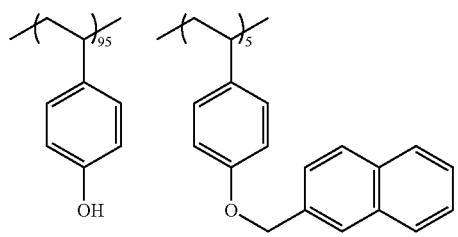
Mw = 12000
Mw/Mn = 1.2
(P-5) 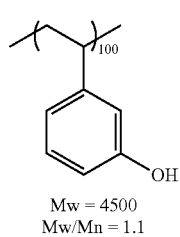
Mw = 9200
Mw/Mn = 1.1
(P-6)
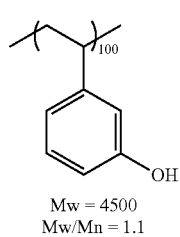
Mw = 4500
Mw/Mn = 1.1
-continued
(P-7) 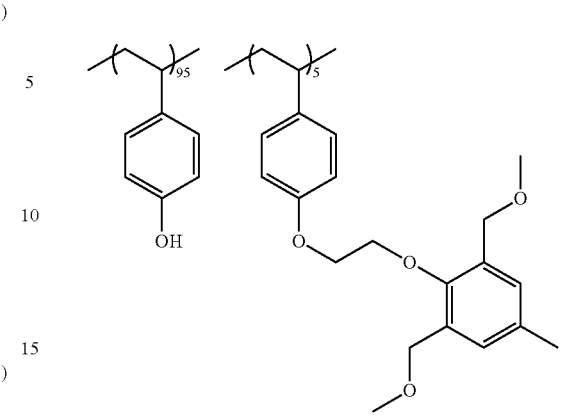
Mw = 4000
Mw/Mn = 1.1
<Acid Generator>
As the acid generator, the compounds PAG-1 to PAG-5 shown below were used.
(PAG-1)
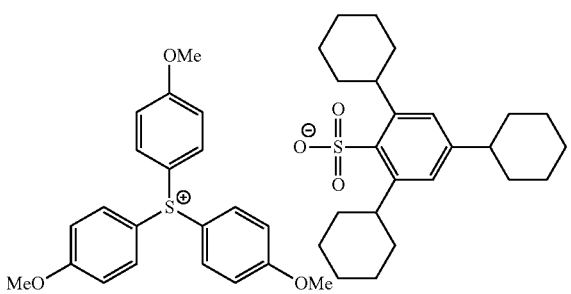
(PAG-2)
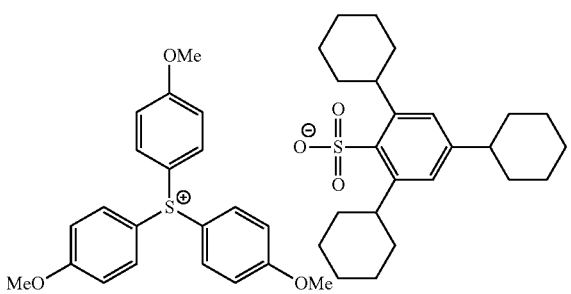
(PAG-3)
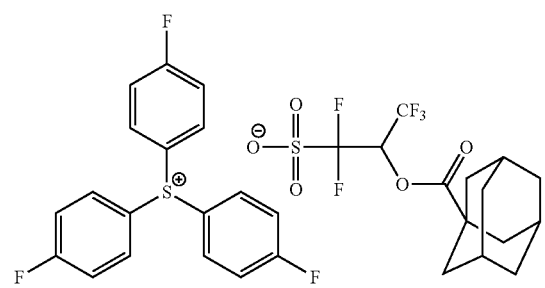

-continued

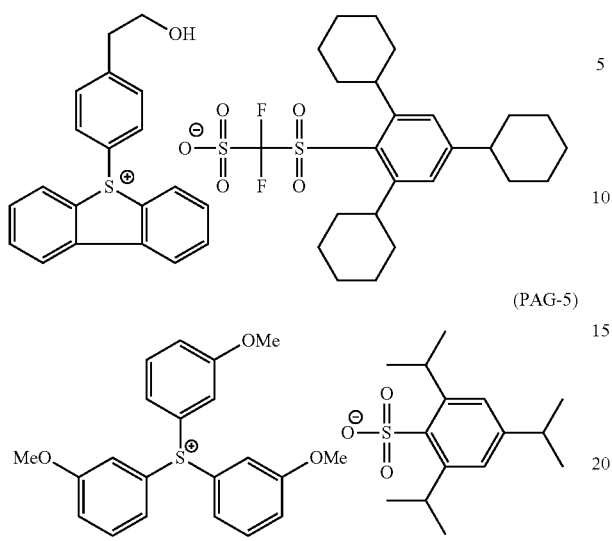

(PAG-4)

(PAG-5)

<Basic Compound>
As the basic compound, the compounds D-1 to D-5 shown below were used.

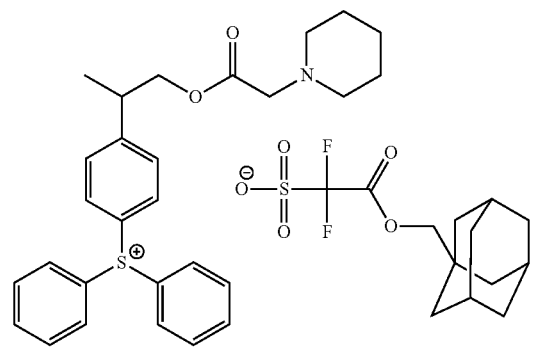

(D-1)

(D-2)

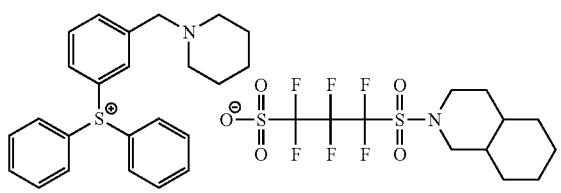

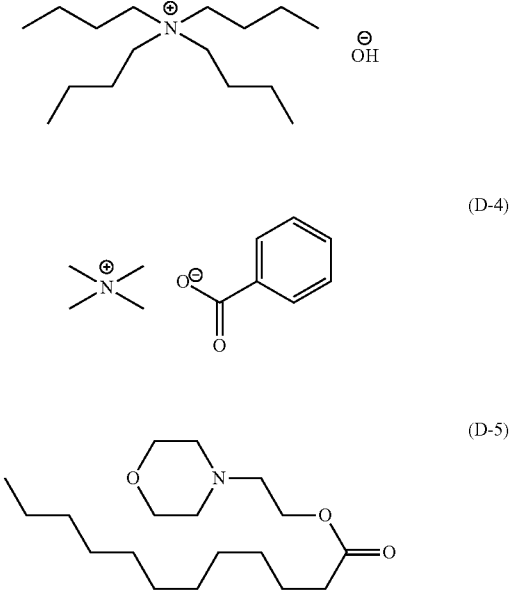

(D-3)

(D-4)

(D-5)

<Additives (Organic Carboxylic Acids)>

E1: 2-Hydroxy-3-napththoic acid

E2: 2-Napththoic acid

E3: Benzoic acid

<Surfactant>

W-1: PF6320 (manufactured by OMNOVA Solutions Inc.)

W-2: MEGAFAC F176 (manufactured by DIC, Inc.; fluorine-based)

W-3: Polysiloxane polymer KP-341 (manufactured by Kyoeisha Chemical Co., Ltd.; silicon-based)

<Solvent>

SL-1: Propylene glycol monomethyl ether (1-methoxy-2-propanol)

SL-2: Propylene glycol monomethyl ether acetate (1-methoxy-2-acetoxypropane)

SL-3: 2-Heptanone

SL-4: Ethyl lactate

SL-5: Cyclohexanone

SL-6: γ-Butyrolactone

SL-7: Propylene carbonate

TABLE 1

| Resist composition | Alkali-soluble resin | (g) | Compound B | (g) | Acid generator | Basic (g) compound | Crosslinking (g) agent |
|---|---|---|---|---|---|---|---|
| R-1 | P-1 | 10 | B-1 | 4.5 | PAG-1 | 2.9 D-2 | 0.5 |
| R-2 | P-2 | 10 | B-2 | 4.6 | PAG-2 | 3.0 D-5 | 0.4 |
| R-3 | P-3 | 10 | B-3 | 4.2 | PAG-4 | 2.3 D-3 | 0.2 |
| R-4 | P-4 | 10 | B-4 | 5.1 | PAG-5 | 1.8 D-4 | 0.4 |
| R-5 | P-5 | 10 | B-5 | 5.5 | PAG-3 | 2.5 D-5 | 0.5 |
| R-6 | P-6 | 10 | B-6 | 4.6 | PAG-3 | 2.4 D-4 | 0.5 |
| R-7 | P-3 | 10 | B-7 | 4.2 | PAG-5 | 2.8 D-5 | 0.4 |
| R-8 | P-1 | 10 | B-8 | 4.7 | PAG-5 | 2.4 D-3 | 0.5 |

TABLE 1-continued

| | | | | | | | | |
|---|---|---|---|---|---|---|---|---|
| R-9 | P-2 | 10 | B-9 | 4.5 | PAG-4 | 2.7 | D-2 | 0.2 |
| R-10 | P-3 | 10 | B-10 | 5.5 | PAG-1 | 2.3 | D-4 | 0.4 |
| R-11 | P-5/P-6 | 8/2 | B-11 | 5.6 | PAG-4 | 2.7 | D-1 | 0.5 |
| R-12 | P-4 | 10 | B-12 | 4.3 | PAG-3 | 3.1 | D-3 | 0.5 |
| R-13 | P-2/P-7 | 5/5 | B-13 | 4.2 | PAG-2 | 2.7 | D-1 | 0.3 |
| R-14 | P-1 | 10 | B-1 | 4.8 | PAG-5 | 2.6 | D-5 | 0.5 C-1 |
| R-15 | P-2 | 10 | B-8 | 4.1 | PAG-4 | 2.1 | D-3 | 0.5 C-2 |
| R-16 | P-5 | 10 | B-11 | 4.6 | PAG-3 | 1.9 | D-4 | 0.2 C-3 |
| R-17 | P-8 | 10 | B-1 | 5.6 | PAG-3 | 2.6 | D-5 | 0.4 |
| R-18 | P-9 | 10 | B-2 | 4.0 | PAG-3 | 2.3 | D-4 | 0.4 |
| R-19 | P-3 | 10 | B-1/B-10 | 2.2/2.0 | PAG-4 | 2.7 | D-5 | 0.4 |
| R-20 | P-1 | 10 | B-14 Compound | 4.8 | PAG-3 | 2.6 | D-3 | 0.5 |
| R-21 | P-1 | 10 | BX-1 | 4.3 | PAG-1 | 2.9 | D-2 | 0.5 |
| R-22 | P-5 | 10 | BX-2 | 4.4 | PAG-3 | 2.5 | D-5 | 0.5 |

| Resist composition | (g) | Additive | (g) | Surfactant | (g) | Solvent | (Mass ratio) | Concentration of solid contents (% by weight) |
|---|---|---|---|---|---|---|---|---|
| R-1 | | | | W-2 | 0.05 | SL-3/SL-6 | 70/30 | 4.0 |
| R-2 | | | | W-3 | 0.05 | SL-1/SL-5 | 60/40 | 4.0 |
| R-3 | | | | W-2 | 0.05 | SL-1/SL-5 | 80/20 | 4.0 |
| R-4 | | | | W-3 | 0.05 | SL-3/SL-4 | 80/20 | 4.0 |
| R-5 | | | | W-2 | 0.05 | SL-1/SL-5/SL-7 | 70/20/10 | 4.0 |
| R-6 | | | | W-3 | 0.05 | SL-3/SL-6 | 90/10 | 4.0 |
| R-7 | | E-1 | 0.2 | W-1 | 0.05 | SL-2/SL-7 | 90/10 | 4.0 |
| R-8 | | | | W-1 | 0.05 | SL-1/SL-6 | 80/20 | 4.0 |
| R-9 | | | | W-1 | 0.05 | SL-1/SL-5 | 60/40 | 4.0 |
| R-10 | | | | W-1 | 0.05 | SL-3/SL-6 | 90/10 | 4.0 |
| R-11 | | | | W-1 | 0.05 | SL-2/SL-7 | 90/10 | 4.0 |
| R-12 | | E-2 | 0.3 | W-3 | 0.05 | SL-1/SL-5 | 60/40 | 4.0 |
| R-13 | | | | W-3 | 0.05 | SL-1/SL-7 | 90/10 | 4.0 |
| R-14 | 2 | E-2 | 0.3 | W-1 | 0.05 | SL-3/SL-6 | 70/30 | 4.0 |
| R-15 | 1.2 | | | W-1 | 0.05 | SL-1/SL-5 | 80/20 | 4.0 |
| R-16 | 1.5 | | | W-3 | 0.05 | SL-1/SL-5 | 70/30 | 4.0 |
| R-17 | | | | W-2 | 0.05 | SL-1/SL-5 | 80/20 | 4.0 |
| R-18 | | E-3 | 0.3 | W-1 | 0.05 | SL-1/SL-5 | 70/30 | 4.0 |
| R-19 | | | | W-3 | 0.05 | SL-1/SL-5 | 60/40 | 4.0 |
| R-20 | | | | W-1 | 0.05 | SL-2/SL-7 | 90/10 | 4.0 |
| R-21 | | | | W-2 | 0.05 | SL-3/SL-6 | 70/30 | 4.0 |
| R-22 | | | | W-2 | 0.05 | SL-1/SL-5/SL-7 | 70/20/10 | 4.0 |

<EB Exposure; Negative Type; Alkali Development>
[Preparation of Support]

As a support, a 6-inch silicon wafer having Cr oxide deposited therein (one that has been subjected to a shielding film treatment used in an ordinary photomask blank) was prepared.

[Preparation of Resist Coating Liquid]

The components shown in Table 1 were dissolved in a solvent to prepare a solution having a total concentration of the solid contents of 4.0% by mass, respectively, and this solution was filtered through a polytetrafluoroethylene filter having a pore diameter of 0.04 µm to prepare a resist coating liquid.

[Manufacture of Resist Film]

The resist coating liquid was coated onto the 6-inch wafer having Cr oxide deposited thereon using a spin coater Mark 8 manufactured by Tokyo Electron Limited, and dried on a hot plate at 110° C. for 90 seconds to obtain a resist film having a film thickness of 50 nm. That is, a resist-coated mask blank was obtained.

[Manufacture of Negative Tone Resist Pattern]

This resist film was patternwise irradiated with electron beams using an electron beam lithography device (manufactured by Elionix Inc.; ELS-7500, acceleration voltage 50 KeV). After the irradiation, the wafer was heated on a hot plate at 110° C. for 90 seconds, dipped in a 2.38% by mass aqueous tetramethylammonium hydroxide (TMAH) solution for 60 seconds, rinsed with water for 30 seconds, and dried.

[Evaluation of Resist Pattern]

The obtained patterns were evaluated by the following methods with respect to the sensitivity, the resolving power (L/S resolving power, isolated space pattern resolving power), the bridge margin, the line edge roughness (LER), and the vacuum PED stability.

[Sensitivity]

The cross-sectional shape of the obtained pattern was observed using a scanning electron microscope (S-4300, manufactured by Hitachi, Ltd.). The exposure dose at which a 1:1 line-and-space resist pattern having a line width of 50 nm was resolved was defined as the sensitivity. The smaller the value thereof, the higher the sensitivity.

[L/S Resolving Power]

The critical resolving power (a minimum line width providing the separation and the resolution of a line and a space (line:space=1:1)) at an exposure dose exhibiting the sensitivity was defined as an L/S resolving power (nm).

[Bridge Margin]

When the line pattern having a line width of 50 nm is exposed, a space width at a time when a bridge between spaces is generated due to an increase in irradiation doses from the sensitivity was defined as an index of a "bridge margin." The smaller the value thereof, the better the performance.

[Isolated Space Pattern Resolving Power]

The critical resolving power (a minimum line width providing the separation and the resolution of a line and a space) of the isolated space (line:space=100:1) in the sensitivity. Further, this value was defined as an "isolated space pattern resolving power (nm)." The smaller the value thereof, the better the performance.

[Vacuum PED]

A 0.1-μm line pattern was exposed at an exposure dose of the sensitivity for resolving a 1:1 line-and-space pattern having a line width of 50 nm. Immediately thereafter, after extraction from the exposure apparatus, a PEB treatment (120° C., 90 seconds) was carried out, and the line width dimension (0 h) was measured. Further, 24 hours later, after extraction from the exposure apparatus, the line width dimension (24 h) on the wafer which had been subjected to a PEB treatment (120° C., 90 seconds) was measured. A change ratio in the line width was calculated by the following equation.

Change ratio (%) in line width=(|line width dimension (0 h)−line width dimension (24 h)|) μm/0.1 μm×100

A smaller value indicators better performance and the value was used as an index of vacuum PED stability.

[Line Edge Roughness (LER)]

A 1:1 line-and-space pattern having a line width of 50 nm was formed at an exposure dose exhibiting the sensitivity. Further, at arbitrary 30 points within 50 μm in the longitudinal direction of the pattern, the distance between an actual edge and a reference line on which edges were to be present was measured using a scanning electron microscope (S-9220, manufactured by Hitachi, Ltd.). Further, the standard deviation of measured distances was determined, and 3σ was calculated therefrom. The smaller the value thereof, the better the performance.

From the results shown in Table 2, the resist compositions of Examples 1 to 20, including the alkali-soluble resin (A) and the compound (B) in the present invention, were excellent in sensitivity, resolving power, the bridge margin, LER, and vacuum PED stability in the EB exposure, as compared with the resist compositions of Comparative Examples 1 and 2, not including the compound (B) in the present invention.

In particular, in Examples 1, 9, 11, and 13, using the basic compound whose basicity decreases upon irradiation with actinic ray or radiation, the LER was more excellent.

Furthermore, in Examples 1, 2, 4, 5, 8 to 11, and 13 to 20 using the compound (B) having a molecular weight of 250 or more, the vacuum PED stability was more excellent.

<EUV Exposure; Negative Tone; Alkali Development>

[Preparation of Resist Coating Liquid]

The same resist coating liquid as the resist coating liquid used in the above-mentioned EB exposure was prepared.

[Manufacture of Resist Film]

The resist coating liquid was coated onto the 6-inch wafer having Cr oxide deposited therein using a spin coater Mark 8 manufactured by Tokyo Electron Limited, and dried on a hot plate at 110° C. for 90 seconds to obtain a resist film having a film thickness of 50 nm. That is, a resist-coated mask blank was obtained.

[Manufacture of Negative Tone Resist Pattern]

This resist film was exposed through a reflective type mask of a 1:1 line-and-space pattern having a line width of 50 nm, using EUV light (wavelength of 13 nm), and then baked at 110° C. for 90 seconds. Thereafter, the resist film was developed using a 2.38% by mass aqueous tetramethylammonium hydroxide (TMAH) solution.

TABLE 2

| | | EB Exposure/Alkali Development/Negative Tone | | | | | |
|---|---|---|---|---|---|---|---|
| Example | Resist composition | Sensitivity (μC/cm$^2$) | L/S resolving power [nm] | Vacuum PED | Resolving power of isolated space pattern [nm] | Bridge margin [nm] | LER [nm] |
| Example 1 | R-1 | 20.3 | 20 | 0.7 | 25 | 75.0 | 4.0 |
| Example 2 | R-2 | 20.3 | 20 | 0.7 | 25 | 75.0 | 4.2 |
| Example 3 | R-3 | 21.1 | 20 | 1.3 | 25 | 75.0 | 4.9 |
| Example 4 | R-4 | 20.6 | 20 | 0.9 | 25 | 75.0 | 4.2 |
| Example 5 | R-5 | 20.1 | 20 | 0.8 | 25 | 75.0 | 4.6 |
| Example 6 | R-6 | 20.4 | 22.5 | 1.4 | 27.5 | 75.0 | 4.4 |
| Example 7 | R-7 | 20.4 | 22.5 | 1.2 | 27.5 | 75.0 | 4.3 |
| Example 8 | R-8 | 27.5 | 25 | 0.9 | 25 | 75.0 | 4.9 |
| Example 9 | R-9 | 20.4 | 20 | 0.8 | 25 | 75.0 | 4.1 |
| Example 10 | R-10 | 20.2 | 20 | 0.7 | 25 | 75.0 | 4.5 |
| Example 11 | R-11 | 20.9 | 20 | 0.9 | 25 | 75.0 | 4.1 |
| Example 12 | R-12 | 20.5 | 20 | 1.3 | 25 | 75.0 | 4.3 |
| Example 13 | R-13 | 20.7 | 22.5 | 0.9 | 27.5 | 75.0 | 4.0 |
| Example 14 | R-14 | 20.7 | 20 | 0.8 | 25 | 75.0 | 4.6 |
| Example 15 | R-15 | 24.4 | 20 | 0.9 | 25 | 75.0 | 4.4 |
| Example 16 | R-16 | 20.4 | 22.5 | 0.7 | 27.5 | 75.0 | 5.1 |
| Example 17 | R-17 | 20.5 | 20 | 0.8 | 25 | 75.0 | 4.6 |
| Example 18 | R-18 | 21.0 | 20 | 0.9 | 25 | 75.0 | 4.3 |
| Example 19 | R-19 | 20.5 | 22.5 | 0.8 | 25 | 75.0 | 4.4 |
| Example 20 | R-20 | 20.2 | 20 | 0.7 | 25 | 75.0 | 4.6 |
| Comparative Example 1 | R-21 | 38.7 | 35 | 5.1 | 35 | 112.5 | 6.5 |
| Comparative Example 2 | R-22 | Not resolved | — | — | — | — | — |

[Evaluation of Resist Pattern]

The obtained resist patterns were evaluated by the following methods with respect to the sensitivity, the resolving power, the pattern shape, and the line edge roughness (LER).

[Sensitivity]

The cross-sectional shape of the obtained pattern was observed using a scanning electron microscope (S-4300, manufactured by Hitachi, Ltd.). The exposure dose at which a 1:1 line-and-space resist pattern having a line width of 50 nm was resolved was defined as the sensitivity. The smaller the value thereof, the higher the sensitivity.

[L/S Resolving Power]

The cross-sectional shape of the obtained pattern was observed using a scanning electron microscope (S-4300, manufactured by Hitachi, Ltd.). The critical resolving power (a minimum line width providing the separation and the resolution of a line and a space (line:space=1:1)) at an exposure dose at a time of resolving the 1:1 line-and-space resist pattern having a line width of 50 nm was defined as an L/S resolving power (nm).

[Line Edge Roughness (LER)]

A 1:1 line-and-space pattern having a line width of 50 nm was formed at an exposure dose exhibiting the sensitivity. Further, at arbitrary 30 points within 50 μm in the longitudinal direction of the pattern, the distance between an actual edge and a reference line on which edges were to be present was measured using a scanning electron microscope (S-9220, manufactured by Hitachi, Ltd.). Further, the standard deviation of measured distances was determined, and $3\sigma$ was calculated therefrom. The smaller the value thereof, the better the performance.

TABLE 3

| | EUV Exposure/Alkali Development/Negative Tone | | | |
|---|---|---|---|---|
| Example | Resist composition | Sensitivity (mJ/cm$^2$) | L/S resolving power [nm] | LER [nm] |
| Example 21 | R-1 | 15.6 | 20 | 4.1 |
| Example 22 | R-2 | 15.5 | 20 | 4.2 |
| Example 23 | R-3 | 16.1 | 21 | 4.3 |
| Example 24 | R-4 | 15.5 | 21 | 4.2 |
| Example 25 | R-5 | 16.4 | 21 | 4.6 |
| Example 26 | R-6 | 15.8 | 23 | 4.3 |
| Example 27 | R-7 | 15.7 | 22 | 4.2 |
| Example 28 | R-8 | 18.1 | 20 | 4.9 |
| Example 29 | R-9 | 15.6 | 20 | 4.0 |
| Example 30 | R-10 | 15.7 | 21 | 4.4 |
| Example 31 | R-11 | 15.8 | 19 | 4.1 |
| Example 32 | R-12 | 15.9 | 21 | 4.3 |
| Example 33 | R-13 | 15.8 | 21 | 4.0 |
| Example 34 | R-14 | 15.7 | 21 | 4.3 |
| Example 35 | R-15 | 17.5 | 24 | 4.9 |
| Example 36 | R-16 | 16.1 | 21 | 4.2 |
| Example 37 | R-17 | 15.8 | 20 | 4.2 |
| Example 38 | R-18 | 15.9 | 20 | 4.3 |
| Example 39 | R-19 | 15.7 | 20 | 4.3 |
| Example 40 | R-20 | 16.1 | 20 | 4.2 |
| Comparative Example 3 | R-21 | 23.5 | 33 | 5.5 |
| Comparative Example 4 | R-22 | Not resolved | — | — |

From the results shown in Table 3, the resist compositions of Examples 21 to 40, including the alkali-soluble resin (A) and the compound (B) in the present invention, were excellent in sensitivity, resolving power, and LER in the EUV exposure, as compared with the resist compositions of Comparative Examples 3 and 4, not including the compound (B) in the present invention.

In particular, in Examples 21, 29, 31, and 33, using the basic compound whose basicity decreases upon irradiation with actinic ray or radiation, LER was more excellent.

What is claimed is:

1. An actinic ray-sensitive or radiation-sensitive resin composition, comprising an alkali-soluble resin (A) and a compound (B) represented by the following General Formula (1-1) or (2-1):

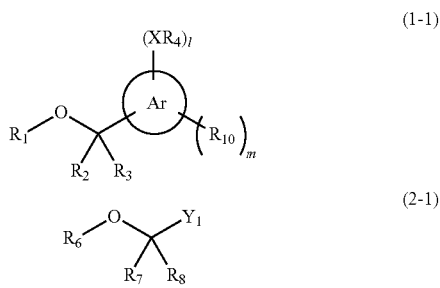

in General Formula (1-1),

Ar represents an aromatic ring group, $R_2$ and $R_3$ each independently represent a hydrogen atom, an alkyl group, a cycloalkyl group, an aryl group, or an aralkyl group, and may be bonded to each other to form a ring, and further, $R_2$ and $R_3$ may be each bonded to Ar to form a ring, in a case where $R_2$ and $R_3$ both represent a hydrogen atom, $R_1$ represents a hydrogen atom, an alkyl group, a cycloalkyl group, an aryl group, an aralkyl group, or an acyl group, in a case where at least one of $R_2$ or $R_3$ represents a group other than a hydrogen atom, $R_1$ represents an alkyl group, a cycloalkyl group, an aryl group, an aralkyl group, or an acyl group, $R_4$ represents a hydrogen atom, an alkyl group, an aryl group, an aralkyl group, or an acyl group, X represents an oxygen atom or $NR_5$, and $R_5$ represents a hydrogen atom, an alkyl group, an aryl group, an aralkyl group, or an acyl group, l represents an integer of 1 to 4, and $R_{10}$ represents an alkyl group, a cycloalkyl group, an aralkyl group, an alkoxy group, an aryl group, an aryloxy group, a carboxyl group, a cyano group, an alkoxycarbonyloxy group, an alkylthio group, a nitro group, or a halogen atom, and m represents an integer of 0 to 4; and in General Formula (2-1), $Y_1$ represents $OR_{11}$ or $N_{12}R_{13}$, and $R_{11}$, $R_{12}$, and $R_{13}$ each independently represent a hydrogen atom, an alkyl group, an aryl group, an aralkyl group, an acyl group, an acyloxy group, or an amido group, $R_6$ represents a hydrogen atom, an alkyl group, a cycloalkyl group, an aryl group, an aralkyl group, or an acyl group, and $R_7$ and $R_8$ each independently represent a hydrogen atom, an alkyl group, an aryl group, or an aralkyl group, and may be bonded to each other to form a ring, and further, $R_7$ and $R_8$ may be each bonded to $Y_1$ to form a ring.

2. The actinic ray-sensitive or radiation-sensitive resin composition according to claim 1, further comprising a compound (C) that generates an acid upon irradiation with actinic ray or radiation.

3. The actinic ray-sensitive or radiation-sensitive resin composition according to claim 2, wherein the compound (C) that generates an acid upon irradiation with actinic ray or radiation is a sulfonium salt.

4. The actinic ray-sensitive or radiation-sensitive resin composition according to claim 2, wherein the alkali-soluble resin (A) includes a repeating unit represented by the following General Formula (II):

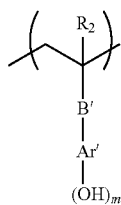
(II)

in the formula,
R$_2$ represents a hydrogen atom, a methyl group which may have a substituent, or a halogen atom,
B' represents a single bond or a divalent organic group,
Ar' represents an aromatic ring group, and
m represents an integer of 1 or more.

5. The actinic ray-sensitive or radiation-sensitive resin composition according to claim 4, further comprising a basic compound or ammonium salt compound whose basicity decreases upon irradiation with actinic ray or radiation.

6. The actinic ray-sensitive or radiation-sensitive resin composition according to claim 2, further comprising a basic compound or ammonium salt compound whose basicity decreases upon irradiation with actinic ray or radiation.

7. The actinic ray-sensitive or radiation-sensitive resin composition according to claim 1, wherein the alkali-soluble resin (A) includes a repeating unit represented by the following General Formula (II):

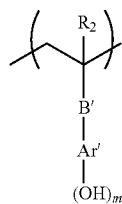
(II)

in the formula,
R$_2$ represents a hydrogen atom, a methyl group which may have a substituent, or a halogen atom,
B' represents a single bond or a divalent organic group,
Ar' represents an aromatic ring group, and
m represents an integer of 1 or more.

8. The actinic ray-sensitive or radiation-sensitive resin composition according to claim 1, wherein the molecular weight of the compound (B) is 250 or more.

9. The actinic ray-sensitive or radiation-sensitive resin composition according to claim 1, further comprising a basic compound or ammonium salt compound whose basicity decreases upon irradiation with actinic ray or radiation.

10. An actinic ray-sensitive or radiation-sensitive film formed of the actinic ray-sensitive or radiation-sensitive resin composition according to claim 1.

11. A mask blank comprising the actinic ray-sensitive or radiation-sensitive film according to claim 10.

12. A pattern forming method comprising:
coating the actinic ray-sensitive or radiation-sensitive resin composition according to claim 1 on a substrate to form a film;
exposing the film; and
developing the exposed film to form a negative tone pattern.

* * * * *